(12) United States Patent
Yamaguchi et al.

(10) Patent No.: US 7,317,309 B2
(45) Date of Patent: Jan. 8, 2008

(54) WIDEBAND SIGNAL ANALYZING APPARATUS, WIDEBAND PERIOD JITTER ANALYZING APPARATUS, AND WIDEBAND SKEW ANALYZING APPARATUS

(75) Inventors: Takahiro Yamaguchi, Tokyo (JP); Masahiro Ishida, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/862,904

(22) Filed: Jun. 7, 2004

(65) Prior Publication Data

US 2005/0273320 A1    Dec. 8, 2005

(51) Int. Cl.
*G01R 23/00* (2006.01)
*G01R 13/00* (2006.01)
*G10L 21/00* (2006.01)

(52) U.S. Cl. ................. 324/76.19; 702/70; 704/205

(58) Field of Classification Search .. 324/76.19–76.26; 702/69–74
See application file for complete search history.

(56) References Cited

U.S. PATENT DOCUMENTS

| 5,162,723 | A * | 11/1992 | Marzalek et al. | ......... 324/76.19 |
| 5,784,285 | A * | 7/1998 | Tamaki et al. | ......... 702/66 |
| 5,959,726 | A * | 9/1999 | Riley et al. | ......... 356/124.5 |
| 6,400,129 | B1 * | 6/2002 | Yamaguchi et al. | ..... 324/76.82 |
| 6,621,860 | B1 * | 9/2003 | Yamaguchi et al. | ........ 375/226 |
| 6,687,629 | B1 * | 2/2004 | Yamaguchi et al. | .......... 702/69 |
| 6,724,836 | B1 * | 4/2004 | Graf et al. | ............... 375/334 |
| 2003/0018442 | A1 * | 1/2003 | Yamaguchi et al. | .......... 702/69 |
| 2003/0080724 | A1 | 5/2003 | Mar | |

FOREIGN PATENT DOCUMENTS

| WO | WO 2004/001998 | 12/2003 |
| WO | WO 2004/013955 | 2/2004 |

OTHER PUBLICATIONS

A. Papoulis, Probability, Random Variables, and Stochastic Processes, $2^{nd}$ ed. New York: McGraw-Hill Book Company, 1984. pp. 283-284 (w/cover 4 pages).
E. O. Brigham, The Fast Fourier Transform. Englewood Cliffs, NJ: Prentice-Hall, Inc., 1974. pp. 135-137 (w/cover 5 pages).
T.J. Yamaguchi, M. Soma, M. Ishida, T. Watanabe, and T. Ohmi, "Extraction of Instantaneous and RMS Sinusoidal Jitter Using An Analytic Signal Method," IEEE Trans. Circuits Syst. II, vol. 50 pp. 288-298, Jun. 2003 (w/cover 8 page).

(Continued)

*Primary Examiner*—Anjan Deb
*Assistant Examiner*—Jeff Natalini
(74) *Attorney, Agent, or Firm*—Osha • Liang LLP

(57) ABSTRACT

A wideband signal analyzing apparatus for analyzing an input signal includes frequency-shifting means for generating a plurality of intermediate frequency signals by shifting a frequency of the input signal as much as respectively different frequency-shifting amounts, so that if a frequency band of the input signal is divided into a plurality of frequency bands, each of the frequency bands can be shifted to a predetermined intermediate band, spectrum measuring means for outputting a complex spectrum of each of the intermediate frequency signals, and spectrum reconstructing means for merging the complex spectra.

43 Claims, 47 Drawing Sheets

OTHER PUBLICATIONS

T.J. Yamaguchi, M. Soma, J. Nissen, D. Halter, R. Raina, and M. Ishida, "Testing Clock Distribution Circuits Using An Analytic Signal Method," in IEEE Int. Test Conf., Baltimore, MD, 2001, pp. 323-331 (w/cover 8 page).

T. J. Yamaguchi, M. Soma, H. Musha, L. Malarsie, and M. Ishida, "A New Method for Testing Jitter Tolerance of SerDes Devices Using Sinusoidal Jitter," in Proc. IEEE International Test Conference, Baltimore, MD, Oct. 7-10, 2002, pp. 717-725 (w/cover 8 page).

PCT International Search Report, Application No. PCT/JP2005/010752, dated Sep. 2, 2005 (4 pages).

* cited by examiner

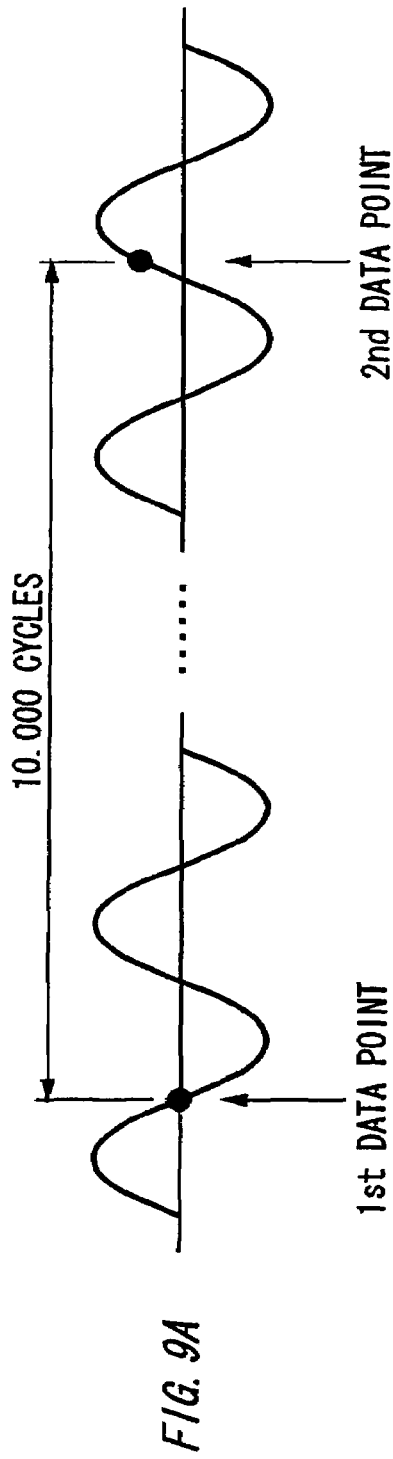
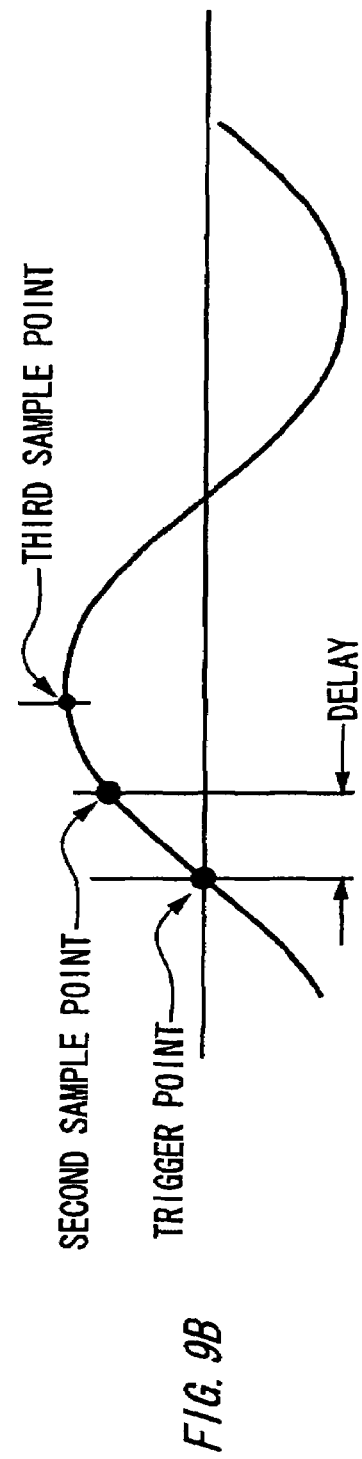
FIG. 9A
FIG. 9B

WIDEBAND SIGNAL ANALYZING APPARATUS, WIDEBAND PERIOD JITTER ANALYZING APPARATUS, AND WIDEBAND SKEW ANALYZING APPARATUS

BACKGROUND OF THE INVENTION

1. Field of the Invention

The present invention relates to a wideband signal analyzing apparatus, a wideband period jitter analyzing apparatus, and a wideband skew analyzing apparatus for analyzing an input signal. More particularly, the present invention relates to a wideband signal analyzing apparatus, etc. for analyzing a wideband input signal.

2. Description of the Related Art

The high speed serial input/output technology makes it possible to perform high speed data transmission at a data rate of 2.5 Gbps. Further, the transmission rate reaches 6.5 Gbps in the Year 2005. In the past five years, the timing jitter or the period jitter has been measured mainly using a time interval analyzer or a real time oscilloscope. Since it is necessary to estimate whether at least a pair of zero-crossings adjacent to each other are continuously sampled or not, the measurement limit of the time interval analyzer or the real time oscilloscope is about 4.5 Gbps or 2.5 to 3 Gbps respectively. In order to measure the jitter at 6.5 Gbps, it is necessary to significantly improve the performance of the hardware (particularly, an analog-to-digital converter or an extremely high speed counter). Meanwhile, an equivalent sampling oscilloscope sequentially shifts the timing of a sampling pulse at the time of a trigger, undersamples a waveform at such a low sampling frequency as about 20 kHz, and recovers a waveform to be measured. An up-to-date equivalent sampling oscilloscope can perform jitter measurement up to 40 Gbps in the time domain. Since it samples one by one in response to every trigger signal, however, the measurement time is too long and the time scale error is large. Moreover, the input channel of the equivalent sampling oscilloscope has a wideband, so it is too sensitive to the effect of noise, and therefore it cannot accurately measure small jitter.

The rapid progress in the high speed serial input/output technology requires a high speed measuring method, by which the wideband jitter of an oscillation can be measured at 5 Gbps or more without using a trigger signal and besides the measured value is hardly affected by the noise. However, such measuring method satisfying the requirement has not been invented yet. Meanwhile, even for the manufacturers of measuring devices, it is also difficult to develop high performance hardware (particularly, an analog-to-digital converter or a frequency counter) in order to realize the next generation real time oscilloscope or time interval analyzer. That is, the development of the next generation measuring devices is accompanied by considerable risk, because it requires long term development or significantly high development costs. In other words, it is obvious that the conventional measuring method has a limit. In this view, it is understandable that the invention of a frequency-scalable and simple measuring method without using a trigger signal is greatly significant.

The present invention proposes frequency domain sampling methods which can be used in the wideband jitter measurement. These sampling methods are frequency-scalable and considerably simple and can be widely applied even to a tester.

Next, the outline of the various conventional jitter measuring methods will be described. In order to distinguish them from the wideband jitter measuring method related to this invention, the conventional $\Delta\phi$ method will be referred to as a narrowband $\Delta\phi$ method. Tables 1 to 3 show the comparison of them with the proposed wideband jitter measuring method in the phase noise measurement, the dynamic jitter measurement, and the period jitter measurement respectively.

TABLE 1

Comparison of measuring methods in the phase noise measurement.

| | Oscillo. Real Time | TIA Zero Dead Time | TIA Non-Zero Dead Time | $\Delta\phi$Method Narrowband | Spectrum Analyzer | Oscillo. Equivalent Time | $\Delta\phi$Method Wideband |
|---|---|---|---|---|---|---|---|
| Measurement | Possible | Possible | Possible | Possible | Excellent | Impossible | Excellent |
| Peak | Possible | Possible | Impossible | Possible | Impossible | Impossible | Possible |
| Jitter | Low Accuracy | Low Accuracy | | Medium Accuracy | | | High Accuracy |
| fc | 1.5 GHz | 80 MHz | 2 GHz | 5 GHz | 50 GHz | — | 40 GHz |
| Tmeas | Medium | Short | Extremely Short | Short | Long | — | Short to Medium |
| Jitter Dynamic Range | 40 dB | 50 dB | 50 dB | 40 dB | 70 dB or more | — | 50 dB or more |
| Frequency Scalability | Difficult ADC | Difficult 2D Counter | Difficult NZD Counter Internal Trigger | Difficult ADC | Flexible | — | Flexible |
| | — | — | — | — | BPF | — | BPF +I, Q dem |

TABLE 2

Comparison of measuring methods in the dynamic jitter measurement.

| | Oscillo. Real Time | TIA Zero Dead Time | TIA Non-Zero Dead Time | ΔφMethod Narrowband | Spectrum Analyzer | Oscillo. Equivalent Time | ΔφMethod Wideband |
|---|---|---|---|---|---|---|---|
| Measurement | Possible | Possible | Possible | Possible | Impossible | Possible | Possible |
| fc | 1.5 GHz | 80 MHz | 2 GHz | 5 GHz | — | 40 MHz | 40 GHz |
| Tmeas | Medium | Short | Extremely Short | Short | — | Extremely Long | Short to Medium |
| Jitter Floor | Small | Small | Midium | Small | — | Large | Small Variable |
| Effect Of Trigger | None | None | Exist Internal | None | — | Exist Internal/External | None |
| Frequency Scalability | Difficult ADC | Difficult 2D Counter | Difficult NZD Counter Internal Trigger | Difficult ADC | — | Possible Trigger | Flexible — |
| | | | | | — | Low Speed ADC | BPF +I, Q dem |

TABLE 3

Comparison of measuring methods in the period jitter measurement.

| | Oscillo. Real Time | TIA Zero Dead Time | TIA Non-Zero Dead Time | ΔφMethod Narrowband | Spectrum Analyzer | Oscillo. Equivalent Time | ΔφMethod Wideband |
|---|---|---|---|---|---|---|---|
| Measurement | Possible | Possible | Possible | Possible | Impossible | Pseudo | Possible |
| fc | 1.5 GHz | 80 MHz | 2 GHz | 5 GHz | — | 40 MHz | 40 GHz |
| Tmeas | Medium | Short | Short | Short | — | Extremely Long | Short to Medium |
| Jitter Floor | Small | Small | Medium | Small | — | Large | Small Variable |
| Effect Of Trigger | None | None | Exist Internal | None | — | Exist Internal/External | None |
| Frequency Scalability | Difficult ADC | Difficult 2D Counter | Difficult NZD Counter Internal Trigger | Difficult ADC | — | Possible Trigger | Flexible — |
| | | | | | — | Low Speed ADC | BPF +I, Q dem |

Next, the measurement method using a zero-crossing detector and the spectrum analyzer or the narrowband Δφ method in the time domain will be discussed.

From the Wiener-Khintchine theorem, the relations between an autocorrelation function $R_{xx}(\tau)$ and a two-sided autospectral density function $S_{xx}(f)$ are given by $$R_{xx}(\tau) = 2\int_0^\infty S_{xx}(f)\cos 2\pi f\tau df \quad (1)$$

$$S_{xx}(\tau) = 2\int_0^\infty R_{xx}(\tau)\cos 2\pi f\tau d\tau \quad (2)$$

The relations between $R_{xx}(\tau)$ and a one-sided autospectral density function $G_{xx}(f)$ are given by $$R_{xx}(\tau) = \int_0^\infty G_{xx}(f)\cos 2\pi f\tau df \quad (3)$$

$$G_{xx}(f) = 4\int_0^\infty R_{xx}(\tau)\cos 2\pi f\tau d\tau. \quad (4)$$

An ideal oscillator outputs a repeated waveform represented by $$x_{Ideal}(t) = \cos(2\pi f_0 t + \phi_0). \quad (5.1)$$

However, an actual oscillator outputs an instantaneous value represented by $$x(t) = \cos(2\pi f_0 t + \phi_0 - \Delta\phi(t)), \quad (5.2)$$

where $\Delta\phi(t)$ is a phase change, i.e. irregular deviation from a linear phase $(2\pi f_0 t + \phi_0)$. $\Delta\phi(t)$ is called an instantaneous phase noise.

In consideration of an offset frequency $f_j(=f-f_0)$ from an oscillation frequency $f_0$, the phase noise is regarded as the two-sided autospectral density function. From the equation (1), the autocorrelation function $R_{\Delta\phi\Delta\phi}(\tau)$ of the instantaneous phase noise is given by $$R_{\Delta\phi\Delta\phi}(\tau) = 2\int_0^\infty S_{\Delta\phi\Delta\phi}(f_J)\cos 2\pi f_J\tau df_J, \quad (6)$$

where $S_{\Delta\phi\Delta\phi}(f_J)$ is the two-sided phase noise autospectral density function. Using the one-sided phase noise autospectral density function $G_{\Delta\phi\Delta\phi}(f_J)$ in equation (3), $R_{\Delta\phi\Delta\phi}(\tau)$ is given by $$R_{\Delta\phi\Delta\phi}(\tau) = \int_0^\infty G_{\Delta\phi\Delta\phi}(f_J)\cos 2\pi f_J\tau df_J. \quad (7)$$

Inversely, using the equation (2), the two-sided phase noise autospectral density function is given by $$S_{\Delta\phi\Delta\phi}(f_J) = 2\int_0^\infty R_{\Delta\phi\Delta\phi}(\tau)\cos 2\pi f_J\tau d\tau. \quad (8)$$

In the same way, using the equation (4), the one-sided phase noise autospectral density function is given by $$G_{\Delta\phi\Delta\phi}(f_J) = 4\int_0^\infty R_{\Delta\phi\Delta\phi}(\tau)\cos 2\pi f_J\tau d\tau. \quad (9)$$

If $\Delta\phi(t)$ is resampled near $x(t)=0$ or $t=nT$ using a zero-crossing resampler, the timing jitter is represented by $$\Delta\phi[n]=\Delta\phi(t)|_{t=nT}. \quad (10)$$

FIG. 1A shows the instantaneous timing jitter sequence $\Delta\phi[n]$. The instantaneous period jitter sequence $J[n]$ as shown in FIG. 1B is given by the differential of $\Delta\phi[n]$ as $$J[n]=\Delta\phi[n+1]-\Delta\phi[n]. \quad (11)$$

Using $R_{\Delta\phi\Delta\phi}(\tau)$ given by the equation (6) or (7), the jitter measurement is modeled in the time domain. The mean square value $\sigma_{\Delta\phi}^2$ of the instantaneous phase noise $\Delta\phi(t)$ is given by $$\sigma_{\Delta\phi}^2 = R_{\Delta\phi\Delta\phi}(0). \quad (12)$$

The autocorrelation coefficient $R_{\Delta\phi\Delta\phi}(0)$ is the fluctuation power of a certain edge, and it should be noted that it is not the product of fluctuations of different edges.

The mean square value $J_{RMS}^2$ of the instantaneous period jitter sequence $J[n]$ obtained by the equation (11) is given by $$J_{RMS}^2 = 2R_{\Delta\phi\Delta\phi}(0) - 2R_{\Delta\phi\Delta\phi}(T). \quad (13.1)$$

In the same way, $$\frac{J_{RMS}^2|_{m,n}}{2} = R_{\Delta\phi\Delta\phi}(m,m) - R_{\Delta\phi\Delta\phi}(m,n). \quad (13.2)$$

Further, the mean square value $J_{CC,RMS}^2$ of an instantaneous cycle-to-cycle period jitter sequence $J_{CC}[n]$ is represented by $$\frac{J_{CC,RMS}^2}{3} = 2R_{\Delta\phi\Delta\phi}(0) - \frac{8}{3}R_{\Delta\phi\Delta\phi}(T) + \frac{2}{3}R_{\Delta\phi\Delta\phi}(2T). \quad (14)$$

It should be noted that the autocorrelation coefficient $R_{\Delta\phi\Delta\phi}(T)$ or $R_{\Delta\phi\Delta\phi}(2T)$ does correspond to the product of the fluctuations of different edges. Therefore, in order to measure the period jitter or the cycle-to-cycle period jitter, it is necessary to observe the fluctuations of different edges at the same time.

From the equations (12) and (13.1), it is understood that $R_{\Delta\phi\Delta\phi}(T)$ can be obtained by $$R_{\Delta\phi\Delta\phi}(T) = \sigma_{\Delta\phi}^2 - \frac{J_{RMS}^2}{2}. \quad (15)$$

Using $G_{\Delta\phi\Delta\phi}(f_J)$ given by the equation (9), the jitter measurement is modeled in the frequency domain. For $\tau=0$ in the equation (7), $\sigma_{\Delta\phi}^2$ of the equation (12) is given by $$\sigma_{\Delta\phi}^2 = \int_0^\infty G_{\Delta\phi\Delta\phi}(f_J)df_J. \quad (16)$$

It should be noted that this is the Parseval's theorem. $J_{RMS}^2$ is obtained by $$J_{RMS}^2 = 4\int_0^\infty G_{\Delta\phi\Delta\phi}(f_J)\sin^2\left(\frac{\pi f_J}{f_0}\right)df_J. \quad (17)$$

Further, $J_{CC,RMS}^2$ is represented by $$J_{CC,RMS}^2 = 16\int_0^\infty G_{\Delta\phi\Delta\phi}(f_J)\sin^4\left(\frac{\pi f_J}{f_0}\right)df_J. \quad (18)$$

Next, the jitter measurement in the time domain will be discussed. First, the fact that the time domain measurement is based on the zero-crossing time measurement will be shown. Then, the measurement principle of two types of time interval analyzers and two types of oscilloscopes will be described.

Since $\tau=0$ in the equation (12), it is necessary to directly observe the fluctuation of a certain edge in order to measure o in the time domain. To directly observe the fluctuation of a certain edge of the oscillator under test, a perfect oscillator that provides a line shown in FIG. 2 is also required. That is, the instantaneous frequency of the output of the perfect oscillator does not depend upon time as shown by $$\frac{1}{2\pi}\frac{\partial\phi}{\partial t} = f_0,$$

where the inclination is stable as a constant line (i.e. without phase fluctuation). Practically, an oscillator of which phase noise is less than the test oscillator is used as the ideal oscillator (a reference oscillator in FIG. 3). In the conventional method as shown in FIG. 4, a time error function is measured as the time interval between the time of a rising edge of the output of the test oscillator and the time of a rising edge of the output of the ideal oscillator, and is given by $$T_e\left(\frac{n}{f_0}\right) = T\left(\frac{n}{f_0}\right) - T_{ref}\left(\frac{n}{f_0}\right), \quad (19)$$

where the second term on the right-hand side in the equation (19) is the time of the rising edge of the output of the ideal oscillator. The time error function can be approximated by the timing jitter as $$-2\pi f_0 T_e\left(\frac{n}{f_0}\right) = \Delta\phi[n]. \quad (20)$$

Since a real time oscilloscope can continuously observe the edges of an oscillation waveform from the imperfect oscillator, the edges from the ideal oscillator may not be directly observed. That is, the edge times of the ideal oscillation output can be estimated by performing a least-square fit of a straight lines to the edges of the oscillation output measured. At this time, the effect of the frequency offset can also be minimized.

In the same way, since $\tau=0$ and $\tau=T$ in the equation (13.1), it is understood in measuring $J_{RMS}^2$ that it is necessary to simultaneously observe the two edge fluctuations being apart from each other by T. In the conventional method, the period jitter is measured by directly measuring the time interval between two adjacent rising edges of a waveform to be measured and calculating its variance. Further, if the observation time interval $\tau$ is one period of the oscillation to be measured, the first increment of the time function or the time interval error is equivalent to the period jitter.

In summary, in order to measure the jitter in the time domain, it is necessary to measure the time interval between two different edges. That is, it is necessary to measure the time interval between the outputs of the oscillator under test and the ideal oscillator in case of the timing jitter measurement and the time interval between the adjacent rising edges of the outputs of the oscillator in case of the period jitter measurement. Accordingly, the zero-crossing method has been mainly used in the jitter measurement. Next, the zero-crossing detector-based measuring device in the prior art will be described.

The time interval analyzer of which dead time is zero continuously counts the sequence of zero-crossing times tk and the corresponding number of the zero-crossing k, using a zero-dead-time time-stamp counter. FIG. 5 shows the block diagram of the time interval analyzer of which dead time is zero.

For measuring the time interval, sampling rate should be only executed at the Nyquist sampling frequency. For example, the frequency range of the zero-dead-time time interval analyzer is limited to 80 MHz.

The second class of time interval analyzers count time intervals from a certain zero-crossing (referred to as a first zero-crossing) to n-th zero-crossing, using a counter of which dead time is non-zero.

Unlike the zero-dead-time time interval analyzer, the non-zero-dead-time time interval analyzer cannot directly measure the timing jitter.

Since it is necessary to sample the time interval at the Nyquist sampling frequency, the measurement limit of the time interval analyzer is about 4.5 Gbps. It takes only a short time in the period jitter measurement. For example, a probability density function of 10,000 points can be measured for about 60 msec or less. However, when the timing jitter occurring due to the periodic cause and the timing jitter occurring due to the random cause is separated or when the phase noise spectrum is measured, it is necessary to repeatedly measure the time interval and compute its autocorrelation function, and thus the measurement time becomes long. Moreover, since the measurement is basically performed one by one, the long-term timing jitter (long term jitter) or the cycle-to-cycle period jitter $J_{CC}[n]$ cannot be measured. In addition, to sample a high speed waveform, it is necessary to widen the bandwidth bw of the input cirucuit. Thus, when the wideband jitter is measured, the measurement is affected by the noise in proportion to $\sqrt{bw}$.

The real time oscilloscope digitizes uniformity a waveform to be measured at a sampling period satisfying the sampling theorem (see FIG. 6). Further, the real time oscilloscope detects the zero-crossing point by performing interpolation on the discrete waveform and obtains the period jitter as the periodic change between the zero-crossing points.

In this method, there is a problem in principle (i.e. the problem of the measuring method associated with cyclostationary process) as described below. The 0% or 100% amplitude level portion of a jitter clock waveform corresponds to the stationary process. Meanwhile, the zero-crossing level is subject to the random phase modulation, so it corresponds to the non-stationary process. That is, the interpolation method in the real time oscilloscope is to perform interpolation on a portion of the waveform corresponding to the stationary process and estimate the zero-crossing time corresponding to the non-stationary process. From the portion of the waveform with causality, the edge without causality is estimated by force. If the jitter is large and the stationary process signal (which corresponds to the 0% or 100% amplitude level) is also affected by the jitter in the same way as the edge included in the non-stationary process, the jitter can be estimated relatively accurately in the interpolation method. However, if the jitter is small and the stationary process signal is not affected by the jitter, the jitter cannot be estimated accurately by the interpolation method.

It is obvious that the conversion speed of the analog-to-digital converter determines the upper limit of the measurement bandwidth in the method. For example, the jitter measurement can be performed up to 2.5 Gbps as shown in FIG. 7, using a real time oscilloscope of which sampling rate is 20 GSps. However, since the zero-crossing is hardly sampled, the most time-consuming portion of the method for estimating period jitter is in detecting the zero-crossing point. Further, since a high speed analog-to-digital converter (ADC) is realized by interleaving a plurality of sub-ADCs, the discrete waveform has a frequency component of interleaving operation or its harmonic components. Moreover, if the interleaved component occurs in a sideband of a carrier to be measured, the value of the jitter might be overestimated. Moreover, the measurement error of the period jitter is generally given by 1/(the mean square of the period jitter) of the waveform to be measured. Therefore, if the value of the jitter to be measured is small, the measurement error in this method becomes large. Moreover, in order to sample the high-speed waveform, it is necessary to widen the bandwidth bw of the input circuit. When the wideband jitter is measured, the measurement is affected by the noise in proportion to $\sqrt{bw}$. Accordingly, the small jitter cannot be measured accurately. In addition, digitizing the waveform at accurate sampling timing requires making the sampling jitter small. Thus, the higher the data rate, the more the measurement is difficult.

An equivalent sampling oscilloscope increases its delay time, which is from a trigger point to a discrete point, and repeatedly digitizes the waveform using an ADC which is in operation at a low sampling frequency. Moreover, it reconstructs the original waveform so that it corresponds to the delay time with respect to the digitizing timing relative to the trigger timing (see FIG. 8).

If an equivalent sampling oscilloscope of which equivalent sampling rate is 40 MSps is used, the jitter measurement in the time domain can be possible up to 40 Gbps. However, the frequency domain measurement such as the phase noise spectrum measurement is impossible. Since the sampling period in the equivalent sampling method does not satisfy the sampling theorem, an aliasing error cannot be avoided at the frequency of 20 kHz or more. Moreover, 10,000 cycles of the input signal may occur between each sampled point during digitizing the input signal as shown in FIG. 9A, and plots them as if they are adjacent with each other when being plotted as shown in FIG. 9B. That is, the equivalent sampling oscilloscope cannot perform continuous measurement. Consequently, the period jitter cannot be measured in the equivalent sampling method. Inversely, since the time interval between the sampling values is not constant, the long term jitter cannot be measured neither in the equivalent sampling method. Further, since one sample is sampled in response to a trigger signal, the measurement time is too long. For example, it is reported that it takes about 15 seconds in the jitter measurement of 7600 bits. An oscilloscope has a measurement channel of 80 GHz for measuring the electric signal. Accordingly, the observation noise of the equivalent sampling oscilloscope itself is 3.5 times as large as the real time oscilloscope of 6 GHz. Therefore, it is difficult to realize the accuracy in the jitter measurement of a CMOS circuit of which noise energy is large.

A test apparatus system (an automatic test equipment system) using undersampling shown in FIG. 10 measures the timing jitter by undersampling a signal from a device under test. The signal from the device under test is probed by an HBS PROBE. The HBS PROBE supplies a START signal to a timing generator. The timing generator generates stop timing corresponding to the START signal and provides it as a trigger pulse to a comparator HBS PROBE. The HBS PROBE compares the signal level with a threshold level at the timing of the trigger pulse input as shown in FIG. 11 and outputs 0 if the signal is smaller than the threshold level or 1 if the signal is larger. As the test pattern is repeatedly applied to the device under test and the output signal is repeatedly undersampled, the edge transition of the signal can be obtained. A probability distribution function is obtained from the edge transition, and a probability density function is obtained by differentiating it.

A test apparatus using undersampling has a time scale error $\Delta\phi_{RMS}$(TimeScale) That is, it consists of the timing jitter $\Delta\phi_{RMS}$(TrigSig) of the START signal and the long term jitter $\sigma_{\Delta T}$(Delay) of the delay time which is from the time of the START signal to the stop timing. Accordingly, the frequency domain measurement such as the phase noise spectrum measurement is impossible. Further, since one sample is sampled in response to the START signal, the measurement time is too long. Therefore, it is difficult to apply this apparatus to the test of high-volume manufactured. It has been only applied to the evaluation of prototype devices. If the bandwidth bw of the signal path between the device under test and the comparator HBS PROBE is widened, the measurement is affected by the noise in proportion to $\sqrt{bw}$. That is, the higher the test rate, the more the noise of the test system affects.

In the spectrum analyzer method or the phase detector method, to measure the phase noise in the frequency domain, the phase demodulated output $\Delta\phi(t)$ from a phase detector may be observed by using a spectrum analyzer as shown in FIG. 12.

However, in the spectrum analyzer method, since frequency is swept using a filter, it takes time in measurement. Moreover, since frequency sweep has to be performed on a filter, the frequency resolution is coarse. Accordingly, it is difficult to observe the spurious spectrum which occurs in the phase noise. Moreover, the spectrum analyzer method only measures the phase noise as the power spectrum. Therefore, the jitter transfer function can be estimated only by the ratio of the power spectrum of a phase noise to the power spectrum of another phase spectrum. Accordingly, in the spectrum analyzer method, the phase difference of the jitter transfer function cannot be measured. Moreover, in the spectrum analyzer method, the peak jitter of the phase noise cannot be measured. Further, the spectrum analyzer method cannot directly measure the rms value or the peak-to-peak value of the period jitter or its probability density function.

The narrowband $\Delta\phi$ method is to consider an instantaneous phase noise $\Delta\phi(t)$ as the phase modulation of the waveform and obtain a baseband signal $\Delta\phi(t)$ by demodulating the phase modulated signal.

In the narrowband $\Delta\phi$ method, the jitter is assumed to be phase modulated components which slowly change. In order to demodulate the phase modulated components, it is necessary to perform continuous sampling. Moreover, in the narrowband $\Delta\phi$ method, it is necessary to digitize the waveform to be measured more than 3 or 4 points per a period. That is, a high-speed ADC or a real time oscilloscope is required. Accordingly, although a real time oscilloscope of which sampling rate is 20 GSps is used, there is a limit that the jitter measurement is up to 5 GHz. Moreover, in order to sample a high-speed waveform, it is necessary to widen the bandwidth bw of the input system. When the wideband jitter is measured, the measurement is affected by the noise in proportion to $\sqrt{bw}$. In addition, the faster the data-rate of the waveform-under-measurement, the more difficult it will be to digitize the waveform at accurate sampling timing without suffering from sampling jitter.

SUMMARY OF THE INVENTION

Therefore, it is an object of the present invention to provide a wideband signal analyzing apparatus, a wideband skew analyzing apparatus, and a wideband period jitter analyzing apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a wideband signal analyzing apparatus for analyzing an input signal includes frequency-shifting means for generating a plurality of intermediate frequency signals by shifting a frequency of the input signal as much as respectively different shift amounts, so that if a frequency band of the input signal is divided into a plurality of frequency bands, each of the frequency bands can be shifted to a predetermined intermediate band, spectrum measuring means for outputting a complex spectrum of each of the intermediate frequency signals, and spectrum reconstructing means for connecting each of the complex spectra.

The wideband signal analyzing apparatus may further include instantaneous phase noise estimating means for estimating an instantaneous phase noise of the input signal based on the complex spectra reconstructed by the spectrum reconstructing means.

The wideband signal analyzing apparatus may further include instantaneous phase noise estimating means for estimating an instantaneous phase noise of each of the intermediate frequency signals based on each of the complex spectra output by the spectrum measuring means and Fourier transforming means for transforming the instantaneous phase noise of each of the intermediate frequency signals into a signal in a frequency domain and inputting the signal transformed to the spectrum reconstructing means as the complex spectrum, wherein the spectrum reconstructing means may reconstruct each of the complex spectra input and generates a phase noise spectrum of the input signal.

The spectrum measuring means may output a one-sided spectrum of the intermediate frequency signal as the complex spectrum. The spectrum measuring means may include single sideband signal transforming means for transforming the intermediate frequency signal into a single sideband signal and Fourier transforming means for transforming the single sideband signal into a signal in a frequency domain.

The frequency-shifting means may include frequency generating means for generating a periodic signal of a frequency corresponding to the offset frequency of frequency-shifting and frequency mixing means for mixing the input signal and the periodic signal.

The frequency generating means may sequentially generate periodic signals of different frequencies according to the different offset frequency of frequency-shifting, and the frequency mixing means may sequentially mix each of the periodic signals and the input signal.

The spectrum reconstructing means may control the frequency of the periodic signal generated by the frequency generating means and shift and reconstruct the complex spectrum of each of the intermediate frequency signals according to the frequency of the corresponding periodic signal.

The frequency-shifting means may further include band limiting means for limiting a band of a signal output by the frequency mixing means and analog-to-digital converting means for digitizing a signal output by the band limiting means and providing the discrete signal to the spectrum measuring means.

The instantaneous phase noise estimating means may include inverse Fourier transforming means for transforming the complex spectrum reconstructed by the spectrum reconstructing means into a signal in a time domain and generating an analytic signal of the input signal and phase estimating means for calculating a phase angle of the analytic signal.

The instantaneous phase noise estimating means may further include linear phase removing means for removing a linear component from a phase angle of the analytic signal and calculating the phase noise of the input signal.

The spectrum measuring means may output a one-sided spectrum of the intermediate frequency signal as the complex spectrum, and the instantaneous phase noise estimating means may include band limiting means for limiting a band of each of the one-sided spectra output by the spectrum measuring means, inverse Fourier transforming means for transforming the one-sided spectrum, of which band has been limited by the band limiting means, into a signal in a time domain and generating an analytic signal of each of the intermediate frequency signals, and phase estimating means for calculating a phase angle of each of the analytic signals.

The instantaneous phase noise estimating means may further include linear phase removing means for removing a linear component from a phase angle of each of the analytic signals and calculating the phase noise of each of the intermediate frequency signals.

The wideband signal analyzing apparatus may further include inverse Fourier transforming means for transforming the phase noise spectrum of the input signal generated by the spectrum reconstructing means into a signal in a time domain and calculating an instantaneous phase noise of the input signal.

The input signal may have a predetermined carrier and a sideband, and the spectrum measuring means may output the complex spectrum from which a carrier component has been eliminated.

The wideband signal analyzing apparatus may further include instantaneous phase noise estimating means for estimating an instantaneous phase noise of the input signal based on a one-sided complex spectrum of the input signal reconstructed by the spectrum reconstructing means, wherein the input signal may have a predetermined carrier and a sideband, and the spectrum measuring means may output the one-sided complex spectrum based on the carrier and a sideband noise of the input signal.

The instantaneous phase noise estimating means may include inverse Fourier transforming means for transforming the one-sided complex spectrum reconstructed by the spectrum reconstructing means into a signal in a time domain and generating an analytic signal of the input signal and phase estimating means for calculating a phase angle of the analytic signal.

The instantaneous phase noise estimating means may further include linear phase removing means for removing a linear component from a phase angle of the analytic signal and calculating the phase noise of the input signal.

According to the second aspect of the present invention, a wideband signal analyzing apparatus for analyzing a phase noise spectrum of an input signal includes frequency-shifting means for generating a plurality of intermediate frequency signals by shifting a frequency of the input signal as much as respectively different shift amounts, so that if a frequency band of the input signal is divided into a plurality of frequency bands, each of the frequency bands can be shifted to a predetermined intermediate band, instantaneous phase noise estimating means for estimating an instantaneous phase noise of each of the intermediate frequency signals, spectrum measuring means for outputting a complex spectrum of the instantaneous phase noise of each of the intermediate frequency signals, and spectrum reconstructing means for connecting each of the complex spectra.

The instantaneous phase noise estimating means may include analytic signal transforming means for transforming each of the intermediate frequency signals into an analytic signal and phase estimating means for estimating a phase angle of each of the analytic signals.

The frequency-shifting means may include frequency generating means for generating a periodic signal of a frequency according to the phase amount of frequency and frequency mixing means for mixing the input signal and the periodic signal.

The frequency generating means may sequentially generate periodic signals of different frequencies according to the different shift amounts, and the frequency mixing means may sequentially mix each of the periodic signals and the input signal.

The spectrum reconstructing means may control the frequency of the periodic signal generated by the frequency generating means and shift and reconstruct the complex spectrum of each of the intermediate frequency signals according to the frequency of the corresponding periodic signal.

The frequency-shifting means may further include band limiting means for limiting a band of a signal output by the frequency mixing means and analog-to-digital converting means for digitizing a signal output by the band limiting means and providing the discrete signal to the spectrum measuring means.

The wideband signal analyzing apparatus may further include inverse Fourier transforming means for transforming the complex spectrum reconstructed by the spectrum reconstructing means into a signal in a time domain and calculating an instantaneous phase noise of the input signal.

The instantaneous phase noise estimating means may further include linear phase removing means for removing a linear component from a phase angle of each of the analytic signals.

According to the third aspect of the present invention, a wideband skew analyzing apparatus for measuring skew of a plurality of input signals includes a first wideband signal analyzing apparatus for outputting an instantaneous phase noise of a first input signal, a second wideband signal analyzing apparatus for outputting an instantaneous phase noise of a second input signal, and skew calculating means for calculating skew of the first and second input signals, based on a differential between the instantaneous phase noises output by the first and second wideband signal analyzing apparatuses.

According to the fourth aspect of the present invention, a wideband period jitter analyzing apparatus for measuring period jitter of an input signal includes delaying means for delaying the input signal based on a period of the input signal, a first wideband signal analyzing apparatus for outputting an instantaneous phase noise of the input signal, a second wideband signal analyzing apparatus for outputting an instantaneous phase noise of the input signal delayed by the delaying means, and period jitter calculating means for calculating period jitter of the input signal, based on a differential between the instantaneous phase noises output by the first and second wideband signal analyzing apparatuses.

According to the fifth aspect of the present invention, a wideband signal analyzing method for analyzing an input signal includes a frequency-shifting step of generating a plurality of intermediate frequency signals for shifting a frequency of the input signal as much as respectively different shift amounts, so that if a frequency band of the input signal is divided into a plurality of frequency bands, each of the frequency bands can be shifted to a predetermined intermediate band, a spectrum measuring step of outputting a complex spectrum of each of the intermediate frequency signals, and a spectrum reconstructing step of reconstructing each of the complex spectra. The wideband signal analyzing method may further include an instantaneous phase noise estimating step of estimating an instantaneous phase noise of the input signal, based on the complex spectra reconstructed in the spectrum reconstructing step.

According to the sixth aspect of the present invention, a wideband signal analyzing method for analyzing a phase noise spectrum of an input signal includes a frequency-shifting step of generating a plurality of intermediate frequency signals for shifting a frequency of the input signal as much as respectively different shift amounts, so that if a frequency band of the input signal is divided into a plurality of frequency bands, each of the frequency bands can be shifted to a predetermined intermediate band, an instantaneous phase noise estimating step of estimating an instantaneous phase noise of each of the intermediate frequency signals, a spectrum measuring step of outputting a complex spectrum of the instantaneous phase noise of each of the intermediate frequency signals, and a spectrum reconstructing step of reconstructing each of the complex spectra. The wideband signal analyzing method may further include an inverse Fourier transforming step of transforming the complex spectrum reconstructed in the spectrum reconstructing step into a signal in a time domain and calculating an instantaneous phase noise of the input signal.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 9A shows reconstruction of the waveform sampled by an oscilloscope of a conventional equivalent sampling type.

FIG. 9B shows sampling by an oscilloscope of a conventional equivalent sampling type.

DETAILED DESCRIPTION OF THE INVENTION

Figure 1A:
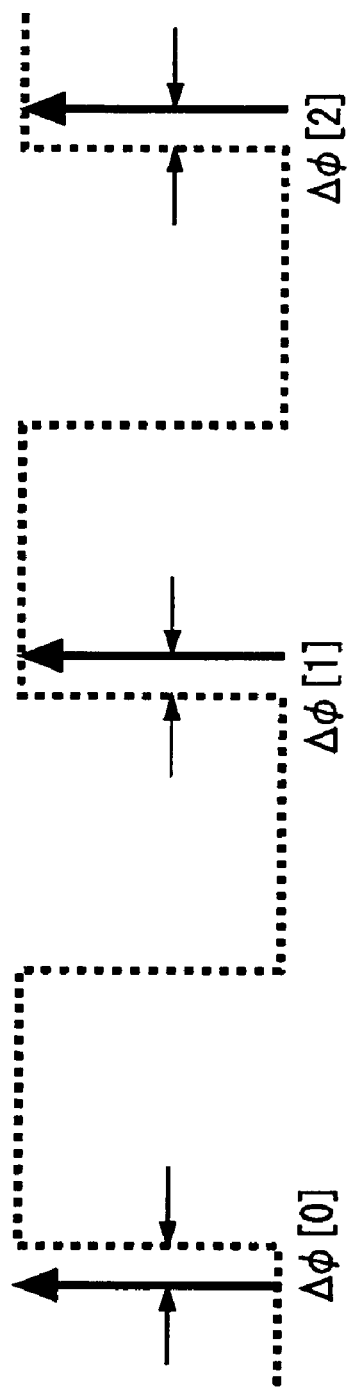
FIG. 1A shows an instantaneous timing jitter sequence $\Delta\phi[n]$.
Figure 1B:
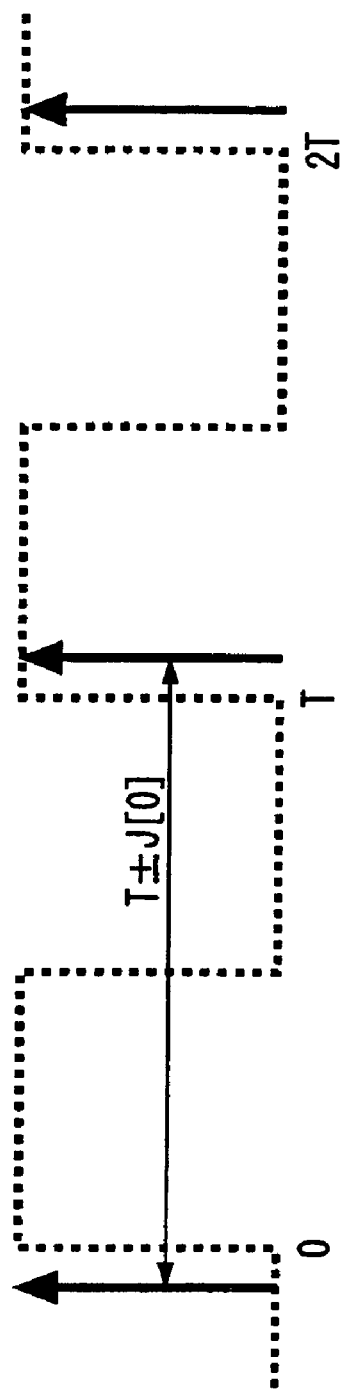
FIG. 1B shows an instantaneous period jitter sequence $J[n]$.

The invention will now be described based on the preferred embodiments, which do not intend to limit the scope of the present invention, but exemplify the invention. All of the features and the combinations thereof described in the embodiment are not necessarily essential to the invention.

First, the measurement principle of the wideband jitter measuring method related to an exemplary embodiment of the present invention will be described. The jitter will be redefined in the time and frequency domains, and the condition of the bandpass sampling for the jitter measurement, that is, the condition under which it may be unnecessary to simultaneously observe the waveform to be measured over the entire band will be logically deduced.

A phase noise or a time interval error in the time domain is defined as the irregular deviation of an instantaneous phase $\phi(t)$ from a linear phase $(2\pi f_0 t + \phi_0)$ That is, $\Delta\phi(t)$ is given by $$\Delta\phi(t) = -\{\phi(t) - (2\pi f_0 t + \phi_0)\}. \tag{21}$$

$\sigma_{\Delta\phi}^2$ can be directly obtained from $\Delta\phi(t)$ in the time domain. In the frequency domain as well, $\sigma_{\Delta\phi}^2$ can be measured by calculating the entire power of the two-sided phase noise autospectral density function as follows:

$$\sigma_{\Delta\phi}^2 = 2\int_0^\infty S_{\Delta\phi\Delta\phi}(f_J) df_J.$$

Further, as shown in the equation (13.1), the rms value of the period jitter is given by the difference of the autocorrelation coefficients of edges as follows:

$$J_{RMS}^2 = 2R_{\Delta\phi\Delta\phi}(0) - 2R_{\Delta\phi\Delta\phi}(T). \tag{13.1}$$

$J_{RMS}^2$ can be measured in the frequency domain by passing the two-sided phase noise autospectral density function through a bandpass filter.

If $J_{RMS}^2$ is rewritten by $$J_{RMS}^2 = 4\int_0^\infty G_{\Delta\phi\Delta\phi}(f_J)\sin^2\left(\frac{\pi f_J}{f_0}\right) df_J, \tag{17}$$

the phase noise or jitter in the time domain given by the equation (21) or (13.1) is redefined as the measure in the frequency domain using the equation (17). That is because the autocorrelation function $R_{\Delta\phi\Delta\phi}(nT)$ of edges is related to the two-sided phase noise autospectral density function $S_{\Delta\phi\Delta\phi}(f_J)$ by the Wiener-Khintchine theorem. From this point of view, the phase noise of an ideal oscillator is considered. By the definition in the time and frequency domains, the noise power in the two-sided sideband of the ideal carrier is zero. And the time domain instantaneous phase of the carrier is straight line (see FIG. 2), and the timing fluctuation is not present. In contrast, the actual oscillator has the noise power in the two-sided sideband of the carrier. The instantaneous phase of the carrier changes around the straight line (see FIG. 2), and the timing fluctuation is present.

We obtain the condition which must satisfy the wideband jitter measuring method. First, we consider the condition under which the linear phase can be measured. Then, the measurement condition under which the correlation coefficient between the edges can be preserved will be described. Lastly, we will show the condition under which it is unnecessary to observe the waveform to be measured over the entire band at the same time.

The condition for measuring the linear phase correctly will be discussed. If $\Delta\phi(t)$ is unchange after performing any conversions on the instantaneous phase, the equation (21) is considered to show that the phase noise can be estimated. The frequency-shift operation (i.e. the operation of shifting a signal as much as $f_{LO}$ along the frequency axis) has the following characteristic:

$$h(t)e^{j2\pi tf_{LO}} =_F [H(f-f_{LO})], \quad (22)$$

where h(t) and H(f) are a Fourier transform pair. For example, if the frequency of the waveform to be measured is shifted using a single frequency mixer, only the linear phase $2\pi tf_{LO}$ is added to $\phi(t)$.

$$\Delta\phi(t) = -\{\phi(t) - (2\pi[f_0 - f_{LO}]t + [\phi_0 - \phi_{0,LO}])\}, \quad (23.1)$$

Figure 2:
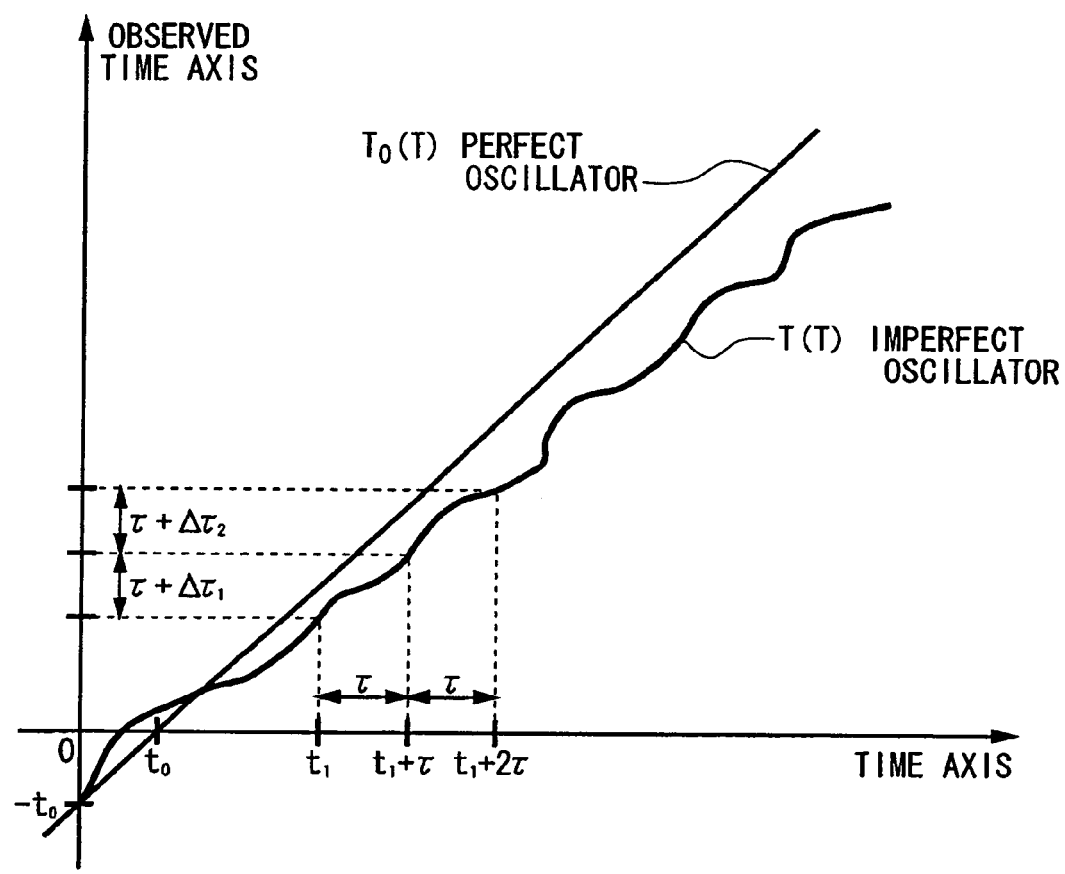
FIG. 2 illustrates the time interval of oscillators.

That is, $\Delta\phi(t)$ is preserved. Therefore, although frequency-shift operation is performed on the waveform to be measured, it is obvious that the estimation of the peak-to-peak value or the rms value of the phase noise is not affected. However, it is assumed that the output of an oscillator used in the frequency-shift operation is a perfect oscillator and its linear instantaneous frequency is provided as shown in FIG. 2.

If the instantaneous phase is directly measured, the following condition is satisfied. Although the measurement band is divided into a plurality of sub-bands and the measurement is performed at the frequency shifted by $f_{LO,m}$, the principle of superposition can be applied to the time domain in measuring the instantaneous phase directly, so the terms of the sum of the different linear phases are given by $$\Delta\phi(t) = -\left\{\phi(t) - \left(2\pi\left[f_0 - \sum_m f_{LO,m}\right]t + \left[\phi_0 - \sum_m \phi_{0,LO,m}\right]\right)\right\}. \quad (23.2)$$

Thus, similarly, $\Delta\phi(t)$ is preserved. Here, it should be noted that a plurality of frequency-shift operations are not necessarily performed at the same time.

Those equations (23.1) and (23.2) are the conditions which are the keys in putting the wideband jitter measurement into practical use.

Next, we will find the measurement condition under which the correlation coefficients between edges given by the equation (13.1) can be preserved. Meanwhile, as shown in the equation (1), from the Wiener-Khintchine theorem, the two-sided phase noise autospectral density function and the autocorrelation function are a Fourier transform pair. Accordingly, if the two-sided phase noise autospectral density functions show the same distribution, $$\hat{S}_{\Delta\phi\Delta\phi}(f_J) = S_{\Delta\phi\Delta\phi}(f_J). \quad (24)$$

It can be seen that the autocorrelation function of the instantaneous phase noise is also preserved as follows:

$$\hat{R}_{\Delta\phi\Delta\phi}(T) = R_{\Delta\phi\Delta\phi}(T), \hat{R}_{\Delta\phi\Delta\phi}(2T) = R_{\Delta\phi\Delta\phi}(2T).$$

Therefore, if the distribution of the two-sided phase noise autospectral density function is preserved, it can be seen that there is a possibility that the period jitter or the cycle-to-cycle period jitter can be measured.

Next, we will find the condition under which the waveform to be measured may not be measured at the same time over the entire observation band. The orthogonality of Fourier transform has the following characteristic:

$$\int_0^T e^{-j2\pi tf_n} e^{-j2\pi tf_m} dt = \delta(n-m). \quad (25)$$

That is, if one complex sine wave of a certain complex sine wave is taken and its product with the other complex sine wave is integrated over one period, the integrated values where their frequencies are different become zero. Only the integrated value where their frequencies are the same is non-zero. Using this orthogonality, the right-hand side of the equation (6) is given by $$R_{\Delta\phi\Delta\phi}(\tau) = \quad (26)$$
$$2\left(\int_0^{f_1} S_{\Delta\phi\Delta\phi}(f_J)\cos 2\pi f_J\tau df_J + \int_{f_1}^{f_2} S_{\Delta\phi\Delta\phi}(f_J)\cos 2\pi f_J\tau df_J + \ldots\right).$$

That is, although the measurement band is divided into sub-bands and time-division measurement is performed on $S_{\Delta\phi\Delta\phi}(f_J)$, the equation (6) is satisfied. According to the equation (13.1), the autocorrelation coefficient of edges, whice corresponds to the period jitter is given by $$J_{RMS}^2 = 2R_{\Delta\phi\Delta\phi}(0) - 2R_{\Delta\phi\Delta\phi}(T).$$

Here, letting $\tau=0,T$ in the equation (26), $R_{\Delta\phi\Delta\phi}(0)$ or $R_{\Delta\phi\Delta\phi}(T)$ is obtained. Therefore, even though the time-division measurement is performed on $S_{\Delta\phi\Delta\phi}(f_J)$ where the measurement band has been divided into sub-bands, it is proved that the period jitter can be measured.

The phase noise spectrum $\Delta\Phi(f_J)$, which is a complex number, and the instantaneous phase noise $\Delta\phi(t)$ are a Fourier transform pair. Therefore, $\Delta\phi(t)$ can be measured by performing inverse Fourier transform on $\Delta\phi(f_J)$ of a wideband.

In summary, if the phase noise of a local oscillator used in the frequency-shift operation can be ignored, the deviation from the linear phase of $\phi(t)$ does not change even though a waveform to be measured is shifted to a low frequency using a frequency mixer. Therefore, it is obvious that the peak-to-peak value or the rms value of the phase noise can be estimated regardless of the frequency shift. Further, although the waveform to be measured is not measured at the same time over the entire measurement band, if the distribution of the two-sided phase noise autospectral density function is preserved, there is a possibility that the period jitter or the cycle-to-cycle period jitter can be measured. In addition, even when the period jitter in a random process is measured in the time domain, it is not necessary to perform measurement over the entire band at the same time in contrast to the conventional real time oscilloscope, and it has been theoretically obtained using the orthogonality of Fourier transform that the time-division measurement can be performed on $S_{\Delta\phi\Delta\phi}(f_J)$ even though a wideband is divided into sub-bands. Those are called the bandpass sampling theorem for the jitter measurement.

Further, if the narrowband $\Delta\phi$ method, which is present in "T. J. Yamaguchi, M. Soma, M. Ishida, T. Watanabe, and T. Ohmi, "Extraction of instantaneous and rms sinusoidal jitter using an analytic signal method," IEEE Trans. Circuits Syst. II, vol. 50, pp. 288-298, June 2003.", "T. J. Yamaguchi, M. Soma, J. Nissen, D. Halter, R. Raina, and M. Ishida, "Testing clock distribution circuits using an analytic signal method," in IEEE Int. Test Conf., Baltimore, Md., 2001, pp. 323-331.", "T. J. Yamaguchi, M. Soma, H. Musha, L. Malarsie, and M. Ishida, "A new method for testing jitter tolerance of SerDes devices using sinusoidal jitter," in Proc. IEEE International Test Conference, Baltimore, Md., Oct. 7-10, 2002, pp. 717-725.", etc., are combined with the bandpass sampling theorem described above, it is possible to measure the phase noise, the timing jitter, the period jitter, the clock skew, the phase noise spectrum, the timing jitter spectrum and the period jitter spectrum of a wideband signal, the autocorrection function of the phase noise, the timing jitter or the period jitter, the jitter transfer function, the alignment jitter, and the bit error. Particularly, the measuring method of the period jitter, the clock skew, and the alignment jitter will be described below.

In addition, since the two-sided phase noise autospectral density function cannot be preserved in an oscilloscope of the conventional equivalent sampling method, the genuine period jitter cannot be measured.

Next, a wideband jitter measuring system based on the above-mentioned bandpass sampling theorem will be described. A method for realizing the wideband jitter measuring system will be first described using a frequency-division demultiplexing sampler and spectrum reconstructing means (a spectrum reconstructor), then the wideband jitter measuring system will be described using a frequency-division demultiplexing phase noise sampler and spectrum reconstructing means (a phase noise spectrum reconstructor), and lastly another method for realizing the wideband jitter measuring system will be described using a frequency-division demultiplexing sampler and spectrum reconstructing means (a spectrum reconstructor). Although the wideband jitter measuring system to be lastly described uses a frequency-division demultiplexing sampler and spectrum reconstructing means, it can be applied to a real time oscilloscope. In this embodiment, for the sake of simplicity, the amplitude of a signal is assumed to be 1. The complex spectrum $S_{\Delta\phi\Delta\phi}(f_J)$ is used in the same meaning as $\Delta\Phi(f_J)$.

First, the wideband jitter measuring system using a frequency-division demultiplexing sampler will be described.

Figure 13A:
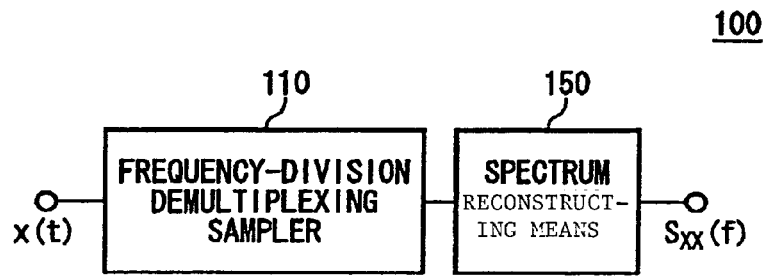
FIG. 13A shows an example of the configuration of a wideband signal analyzing apparatus 100 according to an exemplary embodiment of this invention.
Figure 13B:
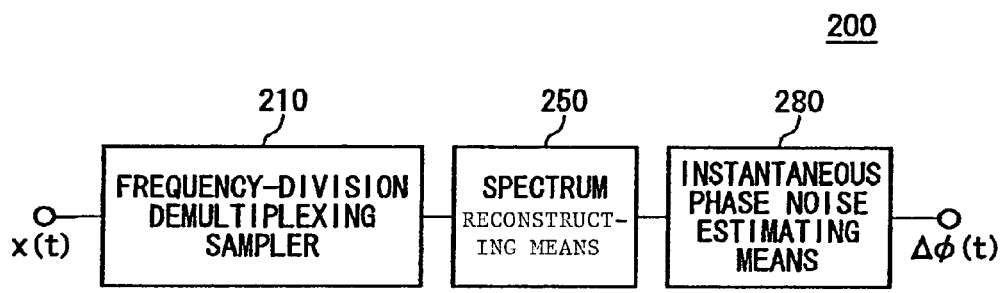
FIG. 13B shows an example of the configuration of a wideband signal analyzing apparatus 200 according to an exemplary embodiment of this invention.
Figure 13C:
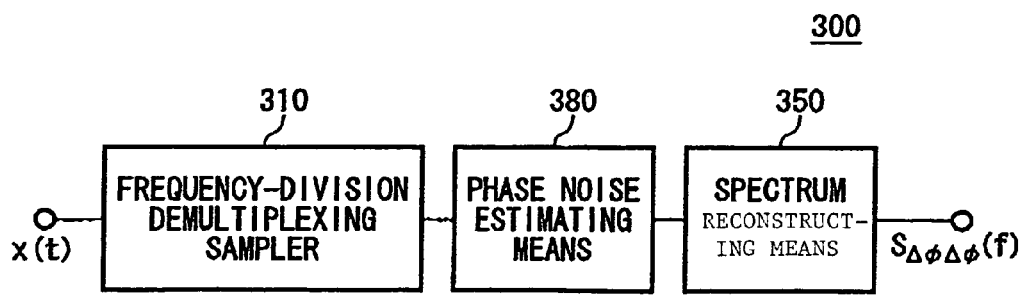
FIG. 13C shows an example of the configuration of a wideband signal analyzing apparatus 300 according to an exemplary embodiment of this invention.

FIGS. 13A, 13B and 13C show an example of the configurations of a wideband signal analyzing apparatus 100, a wideband signal analyzing apparatus 200, and a wideband signal analyzing apparatus 300, respectively, according to an exemplary embodiment of the present invention.

The wideband signal analyzing apparatus 100 which analyzes the spectrum of an input signal x(t) includes a frequency-division demultiplexing sampler 110 and spectrum reconstructing means 150. The frequency-division demultiplexing sampler 110 measures the complex spectrum of each of the bands, into which the band of the input signal x(t) has been divided, and the spectrum reconstructing means 150 calculates the complex spectrum of the input signal x(t) by merging the complex spectra of each of the bands.

As implementing the methods for measuring the complex spectrum of each of the bands of the input signal x(t), there are two ways: a serial measurement system which sequentially measures each of the bands and a parallel measurement of measuring a plurality of bands in parallel. First, the serial measurement will be described.

Figure 14:
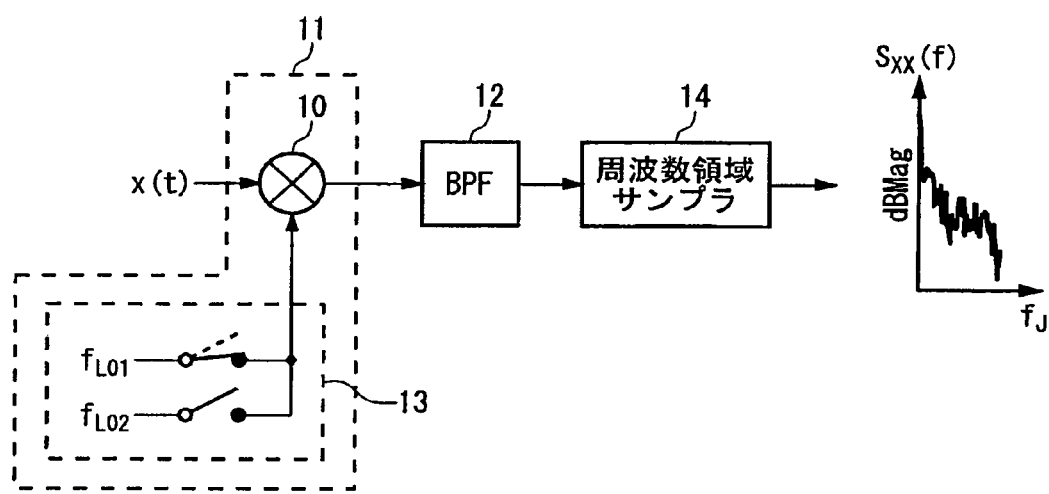
FIG. 14 shows an example of the configuration of a frequency-division demultiplexing sampler 110.

FIG. 14 shows an example of the configuration of the frequency-division demultiplexing sampler 110. The frequency-division demultiplexing sampler 110 includes frequency-shifting means 11, bandpass filtering means 12 as an example of band limiting means, and frequency domain sampler 14 as an example of spectrum measuring means. If the frequency band of the input signal x(t) is divided into a plurality of bands, the frequency-shifting means 11 shifts the frequency band of the input signal x(t) by respectively different frequency-shifting amounts, so that each of the frequency bands is shifted to a predetermined intermediate band, and generates a plurality of intermediate frequency signals.

The intermediate band may be determined on the basis of the frequency characteristics of the frequency domain sampler. For example, the intermediate band suitable for the measurement of the frequency domain sampler can be set.

Moreover, if the band of the input signal x(t) is divided into bands whose spacing equals to the intermediate bandwidth, the frequency-shifting means 11 respectively shifts the frequency of the input signal x(t) by the frequency-shifting amount which increases by the bandwidth of the intermediate band. By this operation, the measurement can be performed, shifting the entire band of the input signal x(t) to the intermediate band.

The frequency-shifting means 11 in this embodiment includes frequency generating means 13 for sequentially generating a periodic signal, of which frequencies are different, according to the different frequency-shifting amounts, and frequency mixing means 10 for sequentially mixing each of the periodic signals and the input signal.

Moreover, the frequency domain sampler 14 outputs the complex spectrum of each of the intermediate frequency signals.

Figure 15:
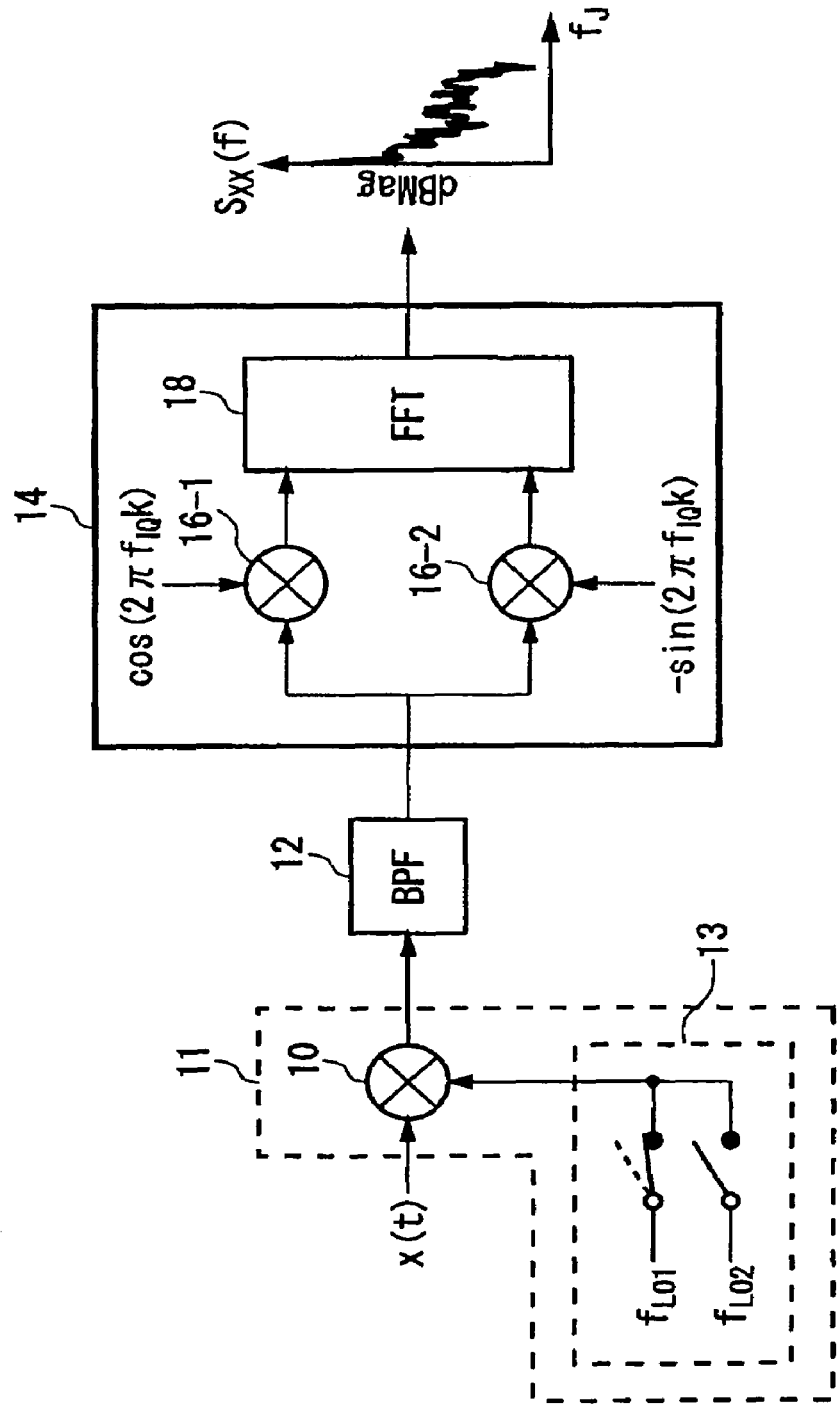
FIG. 15 shows an example of the configuration of a frequency domain sampler 14.

FIG. 15 shows an example of the configuration of the frequency domain sampler 14. The frequency domain sampler 14 outputs the one-sided spectrum of each of the intermediate frequency signals as the complex spectrum described above. The frequency domain sampler 14 of this embodiment includes mixers (16-1 and 16-2. They are hereafter generally referred to as 16) for functioning as the single sideband signal transforming means and Fourier transforming means 18.

Each of the mixers 16 transforms each of the intermediate frequency signals into a single sideband signal. Moreover, the Fourier transforming means 18 transforms the single sideband signal into a signal in the frequency domain and outputs it as the complex spectrum $S_{XX}(f)$ described above.

Moreover, although the Fourier transforming means 18 performs Fourier transform on the signal to get the signal in the frequency domain using the fast Fourier transform (FFT) in the below embodiment, it is obvious that it may perform the transformation using the discrete Fourier transform (DFT) or others.

Figure 16:
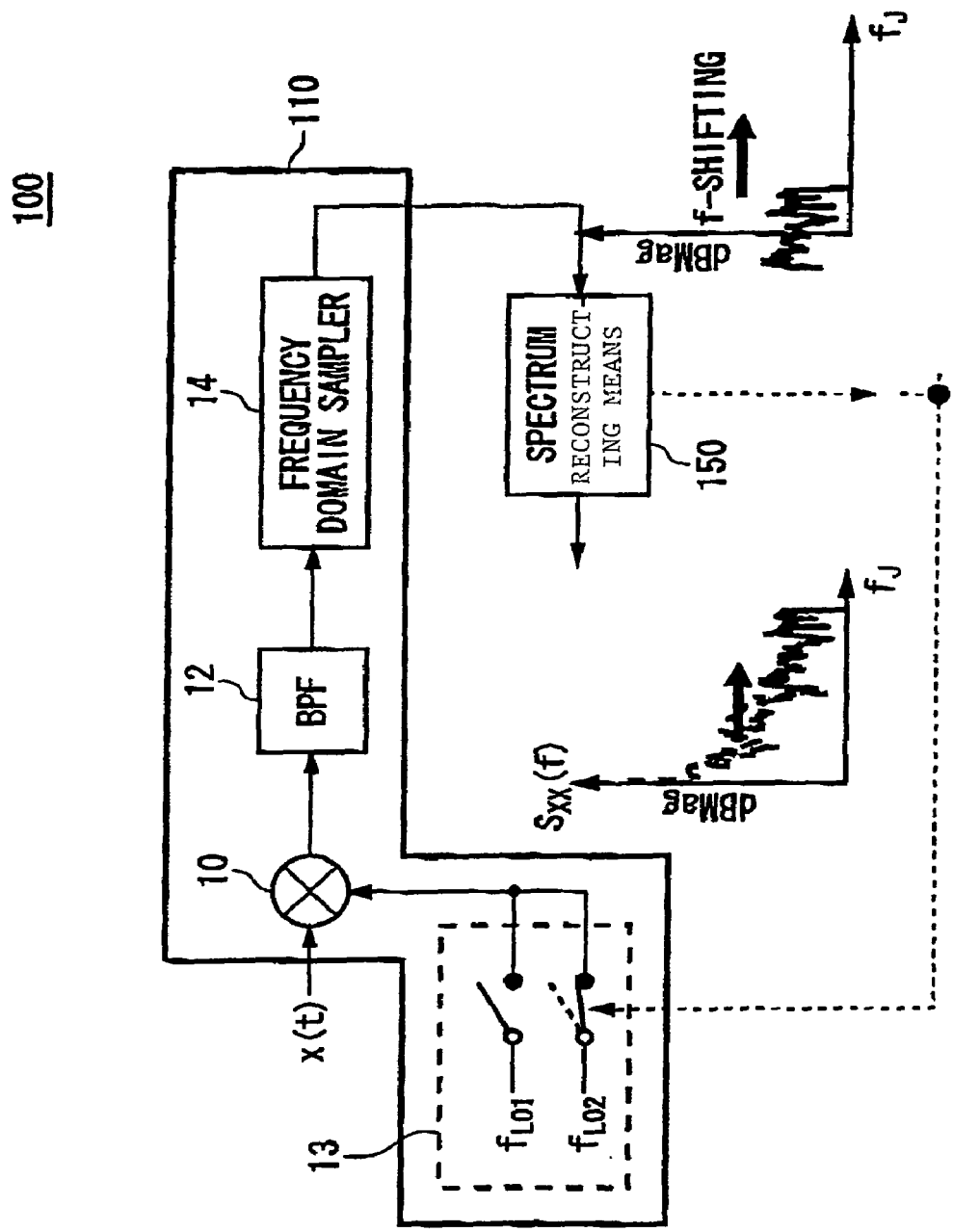
FIG. 16 shows an example of the configuration of a wideband signal analyzing apparatus 100.

FIG. 16 shows an example of the configuration of the wideband signal analyzing apparatus 100. As described above, the frequency-division demultiplexing sampler 110 outputs the complex spectrum of each of the intermediate frequency signals. Moreover, the spectrum reconstructing means 150 controls the frequency of the periodic signal generated by the frequency generating means 13 and shifts and merges the complex spectra of the each of the intermediate frequency signals according to the frequencies of the corresponding periodic signal. That is, the spectrum reconstructing means 150 returns the frequencies of the intermediate frequency signals to the original frequencies in the reconstruction process. By this operation, the spectrum of the wideband input signal can be measured over a desired band.

Next, the operation of the wideband signal analyzing apparatus 100 will be described in detail using equations. If the center frequency of the bandpass filtering means 12 is $f_{IF}$, the wideband jitter measurement of the wideband signal analyzing apparatus 100 is realized by dividing the measurement band into sub-bands and performing the time-division measurement on the sideband noise spectrum $S_{xx}(f_J)$.

The frequency mixing means 10 performs a frequency shifting operation on $x(t_1)$ by analog multiplying the input signal by a sine wave $\cos(2\pi f_{LO1}t_1+\phi_{0,LO1})$ from the frequency generating means 13 as follows:

$$x(t_1)=\cos(2\pi[f_0+\Delta f]t_1+\phi_0-\Delta\phi(t_1)).$$

Here, the carrier of frequency $f_0$ is shifted to the frequency $f_0-f_{LO1}$ as follows:

$$\cos(2\pi[[f_0-f_{LO1}]+\Delta f]t_1+[\phi_0-\phi_{0,LO1}]-\Delta\phi(t_1)). \quad (27)$$

Further, after frequency-shifting, the input signal is band-limited by the bandpass filtering means 12 (where the bandwidth is BW), and its difference frequency component is taken out. If $f_{LO1}=f_0-f_{IF}$, the ideal carrier (of which frequency $f_0$, $\Delta f=0$) is shifted to the center frequency ($f_{IF}$) of the bandpass filter. If the frequency-mixed signal is observed in the band corresponding to a range from the frequency $f_0+\epsilon$ to the frequency $f_0+BW/2$, the following term is obtained:

$$\cos\left([\phi_0-\phi_{0,LO1}]-\Delta\phi\left(t_1,\varepsilon\to\frac{BW}{2}\right)\right).$$

Generally, since an offset frequency $\Delta f$ from the nominal frequency is not zero for $\Delta f>\epsilon$, the above term is rewritten by $$\cos\left(2\pi\Delta ft_1+[\phi_0-\phi_{0,LO1}]-\Delta\phi\left(t_1,\varepsilon\to\frac{BW}{2}\right)\right),$$

so the linear phase $(2\pi\Delta ft_1+[\phi_0-\phi_{0,LO1}])$ and the random phase process $$-\Delta\phi\left(t_1,\varepsilon\to\frac{BW}{2}\right)$$

can be observed.

If the frequency-mixed signal is converted into the discrete signal by an ADC and further converted into an analytic signal by digital I-/Q-demodulating means as shown in FIG. 15, the following equation is obtained:

$$z\left(t_1,\varepsilon\to\frac{BW}{2}\right)=\cos\left(2\pi\Delta ft_1+[\phi_0-\phi_{0,LO1}]-\Delta\phi\left(t_1,\varepsilon\to\frac{BW}{2}\right)\right)+ \quad (28)$$
$$j\sin\left(2\pi\Delta ft_1+[\phi_0-\phi_{0,LO1}]-\Delta\phi\left(t_1,\varepsilon\to\frac{BW}{2}\right)\right).$$

In the same way, if the input signal is multiplied by the sine wave $\cos(2\pi f_{LO2}t_2+\phi_{0,LO2})$ from the frequency generating means 13 by the frequency mixing means 10, converted into the discrete signal by the ADC, and then transformed into the analytic signal by the digital I-/Q-demodulating means in the band corresponding to a range from the frequency $f_0+BW/2$ to the frequency $f_0+BW$, the following equation is obtained:

$$z\left(t_2,\frac{BW}{2}\to BW\right)=\cos\left([\phi_0-\phi_{0,LO2}]-\Delta\phi\left(t_2,\frac{BW}{2}\to BW\right)\right)+ \quad (29)$$
$$j\sin\left([\phi_0-\phi_{0,LO2}]-\Delta\phi\left(t_2,\frac{BW}{2}\to BW\right)\right),$$

where $f_{LO2}=f_0+BW/2-f_{IF}$. Further, assuming $\Delta f\ll BW$, the offset frequency is ignored. At this time, it should be noted that the observation is related only to the random phase process.

As obvious in FIG. 15, the frequency-division demultiplexing sampler 110 outputs the noise spectrum $S_{xx}(f_J)$. As shown in FIG. 16, the spectrum reconstructing means 150 obtains the sum of the analytic signals $z(t_1)$ and $z(t_2)$ in the frequency domain. Here, it should be noted that the spectrum $Z(f_J)$ is equal to $2S_{xx}(f_J)$. If the coefficient 2 is ignored, $Z(f_J)$ is considered to be $S_{xx}(f_J)$. Therefore, it is proved that the spectrum reconstructing means provides the sum of $S_{xx}(f_J)$.

Next, the output of the spectrum reconstructing means 150 is practically obtained. Taking into account the equations (28) & (29), the output of the spectrum reconstructing means 150 is represented by a phasor as $$z\left(t,\varepsilon\to\frac{BW}{2}\right)+e^{j2\pi\Delta ft}z\left(t,\frac{BW}{2}\to BW\right)=$$
$$e^{j[2\pi\Delta ft+[\phi_0-\phi_{0,LO1}]-\Delta\phi(t,\varepsilon\to\frac{BW}{2})]}+e^{j[2\pi\Delta ft+[\phi_0-\phi_{0,LO2}]-\Delta\phi(t,\frac{BW}{2}\to BW)]},$$

where, for the purpose of phasor analysis, the common carrier term is explicitly described at the second term of the left-hand side. Meanwhile, since $\Delta\phi(t)$ is the random phase process, the initial phase differences $(\phi_0-\phi_{0,LO1})$ and $(\phi_0-\phi_{0,LO2})$ at the sampling times $t_1$ and $t_2$ do not have any physical meaning. That is, the following equation is obtained:

$$z\left(t, \varepsilon \to \frac{BW}{2}\right) + e^{j2\pi\Delta ft} z\left(t, \frac{BW}{2} \to BW\right) \approx \quad (30)$$

$$e^{j[2\pi\Delta ft - \Delta\phi(t,\varepsilon \to \frac{BW}{2})]} + e^{j[2\pi\Delta ft - \Delta\phi(t, \frac{BW}{2} \to BW)]} =$$

$$e^{j2\pi\Delta ft}\left(e^{-j\Delta\phi(t,\varepsilon \to \frac{BW}{2})} + e^{-j\Delta\phi(t, \frac{BW}{2} \to BW)}\right).$$

Further, using the orthogonality in the frequency domain, the following equations are obtained:

$$\Delta\phi\left(t, \varepsilon \to \frac{BW}{2}\right) + \Delta\phi\left(t, \frac{BW}{2} \to BW\right) \equiv \Delta\phi(t, \varepsilon \to BW) \quad (31.1)$$

$$\Delta\phi^2\left(t, \varepsilon \to \frac{BW}{2}\right) + \Delta\phi^2\left(t, \frac{BW}{2} \to BW\right) \equiv \Delta\phi^2(t, \varepsilon \to BW). \quad (31.2)$$

Lastly, the spectrum reconstructing means 150 obtains $S_{xx}(f_J)$ corresponding to the following equation:

$$z\left(t, \frac{BW}{2}\right) + e^{j2\pi\Delta ft} z(t, BW) \equiv z(t) = e^{j2\pi\Delta ft} e^{-j\Delta\phi(t,\varepsilon \to BW)}. \quad (32)$$

Practically, as shown in FIG. 16, the spectrum reconstructing means 150 performs frequency-shift operation on the observed complex spectrum $S_{xx}(f_J, L_{O1})$ or $S_{xx}(f_J, L_{O2})$ and recovers the complex spectrum $S_{xx}(f_J)$.

Next, the wideband signal analyzing apparatus 200 shown in FIG. 13B will be described. The wideband signal analyzing apparatus 200 further includes phase noise estimating means 280 in addition to the wideband signal analyzing apparatus 100 as shown in FIG. 13B.

Figure 17:
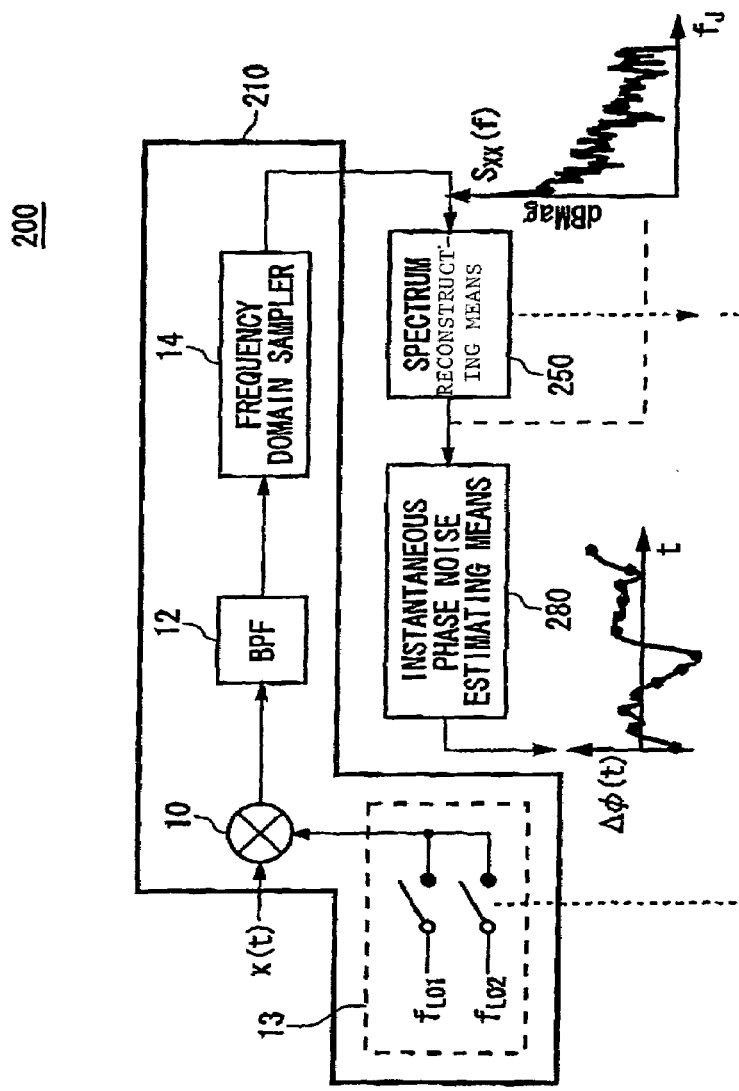
FIG. 17 shows an example of the configuration of a wideband signal analyzing apparatus 200.

FIG. 17 shows an example of the configuration of the wideband signal analyzing apparatus 200. In FIG. 17, the frequency-division demultiplexing sampler 210 and the spectrum reconstructing means 250 have the same functions and configurations as the frequency-division demultiplexing sampler 110 and the spectrum reconstructing means 150 described in connection with FIGS. 14 to 16.

The phase noise estimating means 280 estimates the instantaneous phase noise $\Delta\phi(t)$ of the input signal based on the complex spectrum reconstructed by the spectrum reconstructing means 250.

Figure 18:
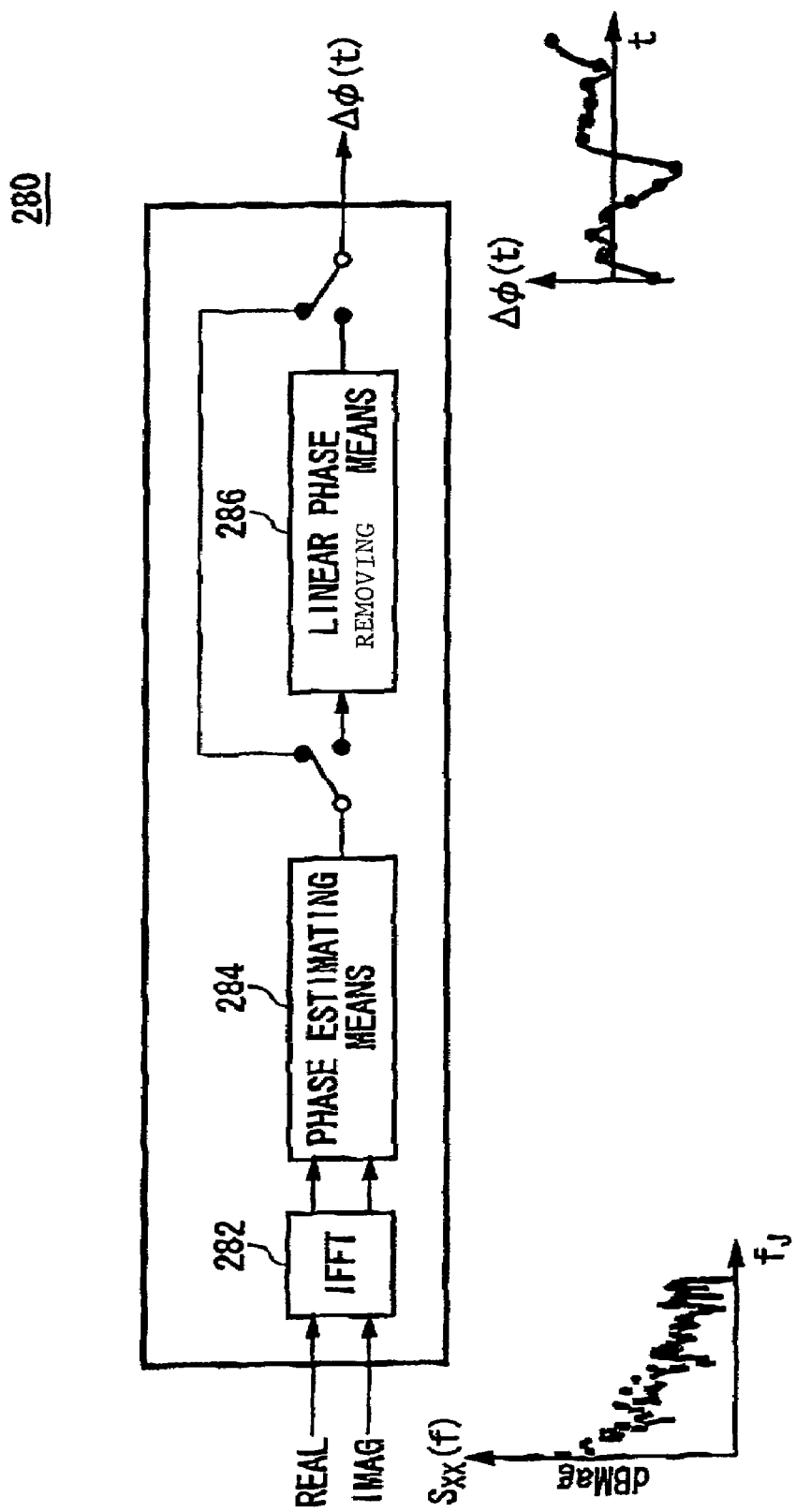
FIG. 18 shows an example of the configuration of a phase noise estimating means 280.

FIG. 18 shows an example of the configuration of the phase noise estimating means 280. The phase noise estimating means 280 includes inverse Fourier transforming means 282, phase estimating means 284, and linear phase removing means 286.

The inverse Fourier transforming means 282 transforms the complex spectrum reconstructed by the spectrum reconstructing means 250 into a signal in the time domain and generates the analytic signal of the input signal. The phase estimating means 284 calculates the phase angle of the analytic signal generated by the inverse Fourier transforming means 282. If the linear component from the phase angle estimated by the phase estimating means 284 is small enough, the phase angle equals to the instantaneous phase noise, so the phase estimating means 284 outputs the phase angle as the instantaneous phase noise. Moreover, if it is necessary to remove the linear component from the phase angle of the analytic signal, the linear phase removing means 286 eliminates the linear component and outputs the instantaneous phase noise of the input signal.

According to the wideband signal analyzing apparatus 200 of this embodiment, it is possible to easily calculate the complex spectrum of the wideband input signal and easily generate the analytic signal of the wideband input signal based on the complex spectrum. Accordingly, the phase jitter of the wideband input signal can be easily analyzed.

Next, the operation of the wideband signal analyzing apparatus 200 will be described in detail using equations.

As shown in FIGS. 17 and 18, the phase noise estimating means 280 performs inverse Fourier transform on the complex spectrum $S_{xx}(f_J)$ reconstructed and obtains the analytic signal of a bandwidth BW represented by $$z(t) = \cos(2\pi\Delta ft - \Delta\phi(t, \varepsilon \to BW)) + j\sin(2\pi\Delta ft - \Delta\phi(t, \varepsilon \to BW)). \quad (33)$$

The instantaneous phase of z(t) is obtained, if necessary, its linear phase $2\pi\Delta ft$ as shown in FIG. 18 is removed from it, and then the instantaneous phase noise is output as follows:

$$\Delta\phi(t, \varepsilon \to BW) \quad (34)$$

Although it is the serial measurement that the wideband signal analyzing apparatus (100, 200) performs, the parallel measurement will also be described below.

The parallel measuring system includes a plurality of frequency-shifting means 11 and a plurality of ADCs. Therefore, the wideband jitter measurement is realized by dividing the measurement band into sub-bands and measuring the sideband noise spectra at the same time.

If the plurality of ADCs digitize the frequency-mixed signals at the same time, the equations (28) and (29) are respectively rewritten by $$z\left(t, \varepsilon \to \frac{BW}{2}\right) = \cos\left(2\pi\Delta ft + [\phi_0 - \phi_{0,LO1}] - \Delta\phi\left(t, \varepsilon \to \frac{BW}{2}\right)\right) + \quad (35)$$
$$j\sin\left(2\pi\Delta ft + [\phi_0 - \phi_{0,LO1}] - \Delta\phi\left(t, \varepsilon \to \frac{BW}{2}\right)\right)$$

$$z\left(t, \frac{BW}{2} \to BW\right) = \cos\left([\phi_0 - \phi_{0,LO2}] - \Delta\phi\left(t, \frac{BW}{2} \to BW\right)\right) + \quad (36)$$
$$j\sin\left([\phi_0 - \phi_{0,LO2}] - \Delta\phi\left(t, \frac{BW}{2} \to BW\right)\right).$$

The spectrum reconstructing means (150, 250) calculates the sum of the analytic signals $$z\left(t, \varepsilon \to \frac{BW}{2}\right)$$

and $$z\left(t, \frac{BW}{2} \to BW\right)$$

in the frequency domain. Taking into account the equations (35) & (36), the output of the spectrum reconstructing means (150, 250) is represented by a phasor as $$z\left(t, \varepsilon \to \frac{BW}{2}\right) + e^{j2\pi\Delta ft} z\left(t, \frac{BW}{2} \to BW\right) =$$
$$e^{j[2\pi\Delta ft + [\phi_0 - \phi_{0,LO1}] - \Delta\phi(t,\varepsilon \to \frac{BW}{2})]} + e^{j[2\pi\Delta ft + [\phi_0 - \phi_{0,LO2}] - \Delta\phi(t, \frac{BW}{2} \to BW)]}.$$

Meanwhile, since $\Delta\phi(t)$ is the random phase process, two initial phase differences $(\phi_0 - \phi_{0,LO1})$ and $(\phi_0 - \phi_{0,LO2})$ at the sampling time t do not have any physical meaning. That is, the following equation is obtained:

$$z\left(t, \varepsilon \to \frac{BW}{2}\right) + e^{j2\pi\Delta ft} z\left(t, \frac{BW}{2} \to BW\right) \approx$$
$$e^{j[2\pi\Delta ft - \Delta\phi(t,\varepsilon \to \frac{BW}{2})]} + e^{j[2\pi\Delta ft - \Delta\phi(t, \frac{BW}{2} \to BW)]}.$$

and the same intermediate result as the equations (30) to (34) is obtained.

Next, the wideband signal analyzing apparatus 300 shown in FIG. 13C will be described. The wideband signal analyzing apparatus 300 further includes instantaneous phase noise estimating means 380 in addition to the configuration of the wideband signal analyzing apparatus 100 as shown in FIG. 13C and estimates the wideband phase noise, combining the frequency-division demultiplexing sampler 310, the phase noise estimating means 380 and the spectrum reconstructing means 350.

Figure 19:
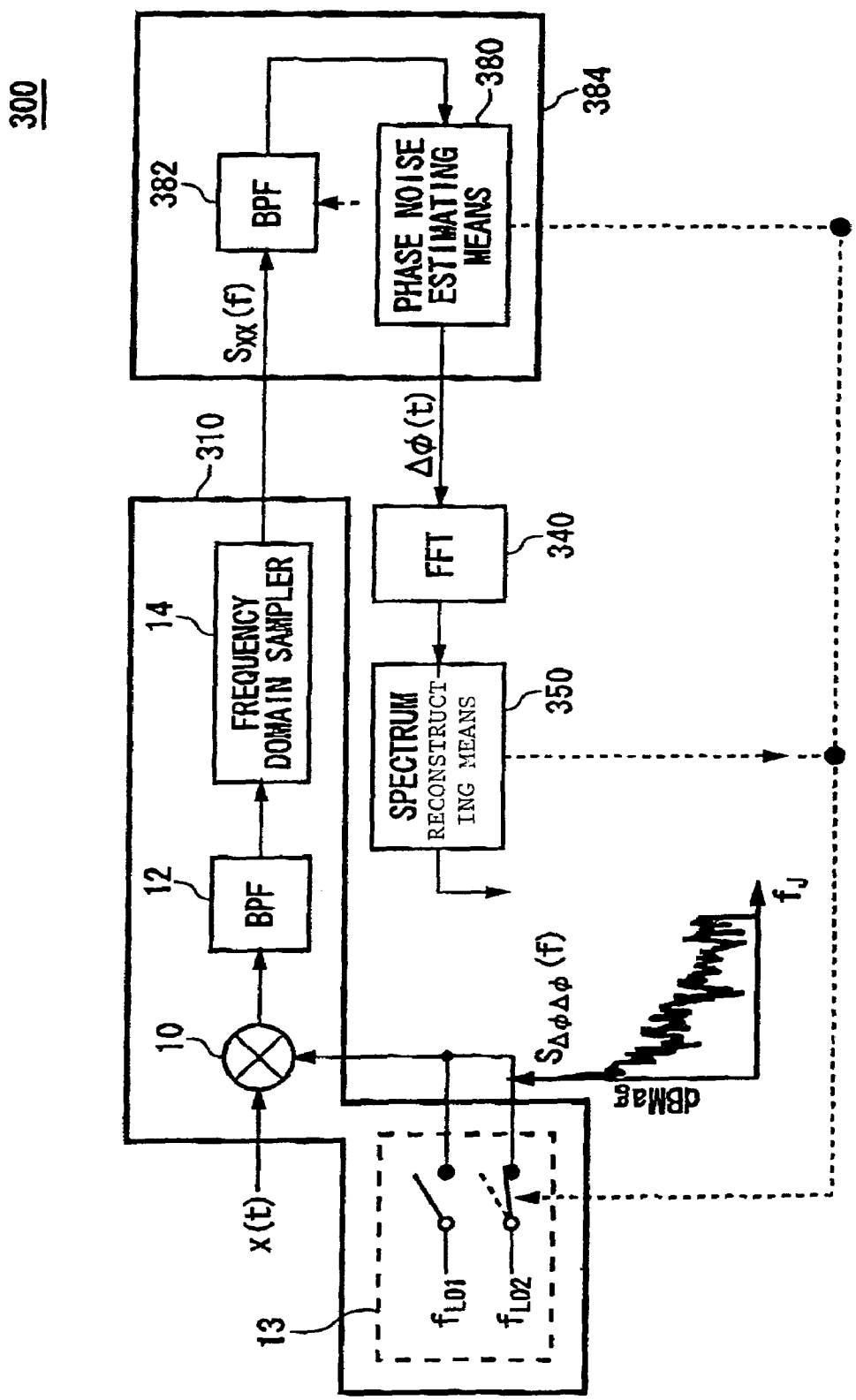
FIG. 19 shows an example of the configuration of a wideband signal analyzing apparatus 300.

FIG. 19 shows an example of the configuration of the wideband signal analyzing apparatus 300. The wideband signal analyzing apparatus 300 includes a frequency-division demultiplexing sampler 310, instantaneous phase noise estimating means 384, Fourier transforming means 340, and spectrum reconstructing means 350.

The frequency-division demultiplexing sampler 310 has the same function and configuration as the frequency-division demultiplexing sampler 110. The instantaneous phase noise estimating means 384 includes bandpass filtering means 382 and phase noise estimating means 380, estimating the instantaneous phase noise of each of the intermediate frequency signals based on each complex spectrum output by the frequency-division demultiplexing sampler 310. The bandpass filtering means 382 limits the band of each of the intermediate frequency signals output by the frequency-division demultiplexing sampler 310 and supplies it to the phase noise estimating means 380.

The phase noise estimating means 380 has the same configuration as the instantaneous phase noise estimating means 280 described in connection with FIG. 18, estimating the instantaneous phase noise of each of the intermediate frequency signals based on the complex spectrum of each of the intermediate frequency signals output by the frequency-division demultiplexing sampler 310.

The Fourier transforming means 340 transforms the instantaneous phase noise of each of the intermediate frequency signals into a signal in the frequency domain and inputs it to the spectrum reconstructing means 350 as the complex spectrum. Moreover, the spectrum reconstructing means 350 reconstructs each complex spectrum input and generates the phase noise spectrum of the input signal.

Moreover, the wideband signal analyzing apparatus 300 may further include inverse Fourier transforming means for transforming the phase noise spectrum of the input signal generated by the spectrum reconstructing means 350 into a signal in the time domain and calculating the instantaneous phase noise of the input signal.

As obvious from FIG. 19, the frequency-division demultiplexing sampler 310 outputs the noise spectrum $S_{xx}(f_j)$. A proper bandpass filtering process is performed on the noise spectrum $S_{xx}(f_j)$, and the spectrum is input to the phase noise estimating means 380. The phase noise estimating means 380 performs inverse Fourier transform on the input complex spectrum $S_{xx}(f_j)$, of which band is limited, and obtains the instantaneous phase noise given by the equation (34). Further, the phase noise estimating means 380 performs Fourier transform on the instantaneous phase noise and outputs the phase noise spectrum $S_{\Delta\phi\Delta\phi}(f_j)$. Then the spectrum reconstructing means 350 obtains the sum of $\Delta\phi(t_1)$ and $\Delta\phi(t_2)$ in the frequency domain. That is, the spectrum reconstructing means 350 outputs the complex spectrum $S_{\Delta\phi\Delta\phi}(f_j)$ corresponding to the equation (52.1).

According to the wideband signal analyzing apparatus 300 of this embodiment, it is possible to easily analyze the phase jitter of the wideband input signal by reconstructing the phase noise spectrum of each of the intermediate frequency signals.

Although the wideband signal analyzing apparatus (100, 200, 300) described in connection with FIGS. 13 to 19 measures the one-sided complex spectrum of the intermediate frequency signal and calculate the instantaneous phase noise and the phase noise spectrum of the input signal based on the complex spectrum, an analyzing apparatus for calculating the instantaneous phase noise and the phase noise spectrum of the input signal based on the phase noise of each of the intermediate frequency signals without measuring the one-sided complex spectrum of the intermediate frequency signal will be described below.

Figure 20A:
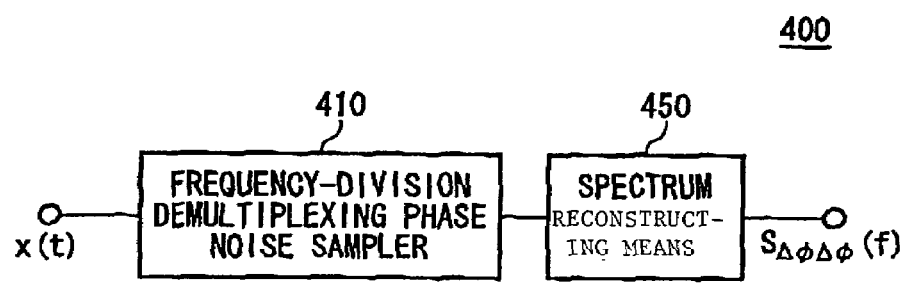
FIG. 20A shows an example of the configuration of a wideband signal analyzing apparatus 400.
Figure 23:
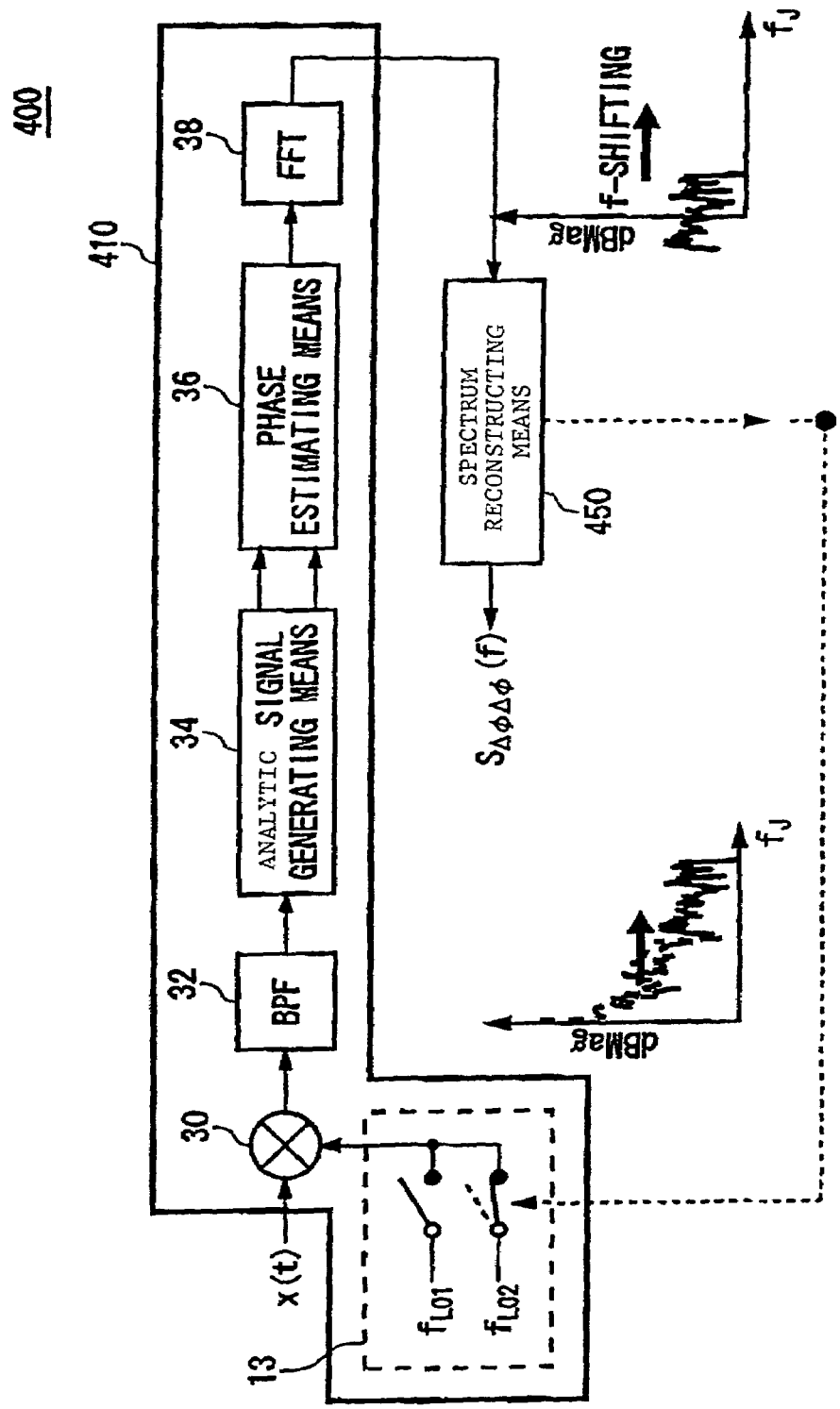
FIG. 23 shows an example of the configuration of a wideband signal analyzing apparatus 400.

FIGS. 20A and 23 show an example of the configuration of a wideband signal analyzing apparatus 400. The wideband signal analyzing apparatus 400 includes a frequency-division demultiplexing phase noise sampler 410 and spectrum reconstructing means 450.

Figure 20B:
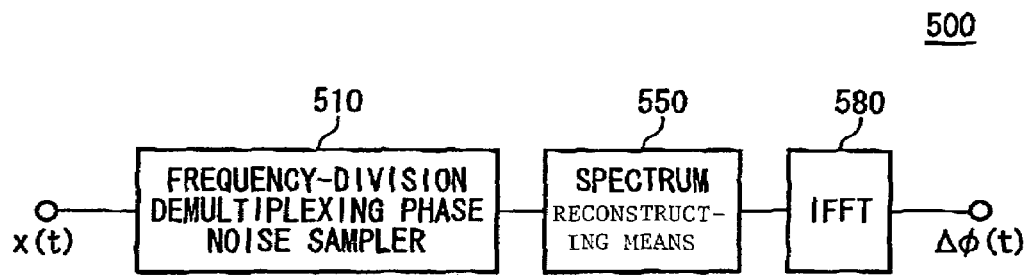
FIG. 20B shows an example of the configuration of a wideband signal analyzing apparatus 500.
Figure 24:
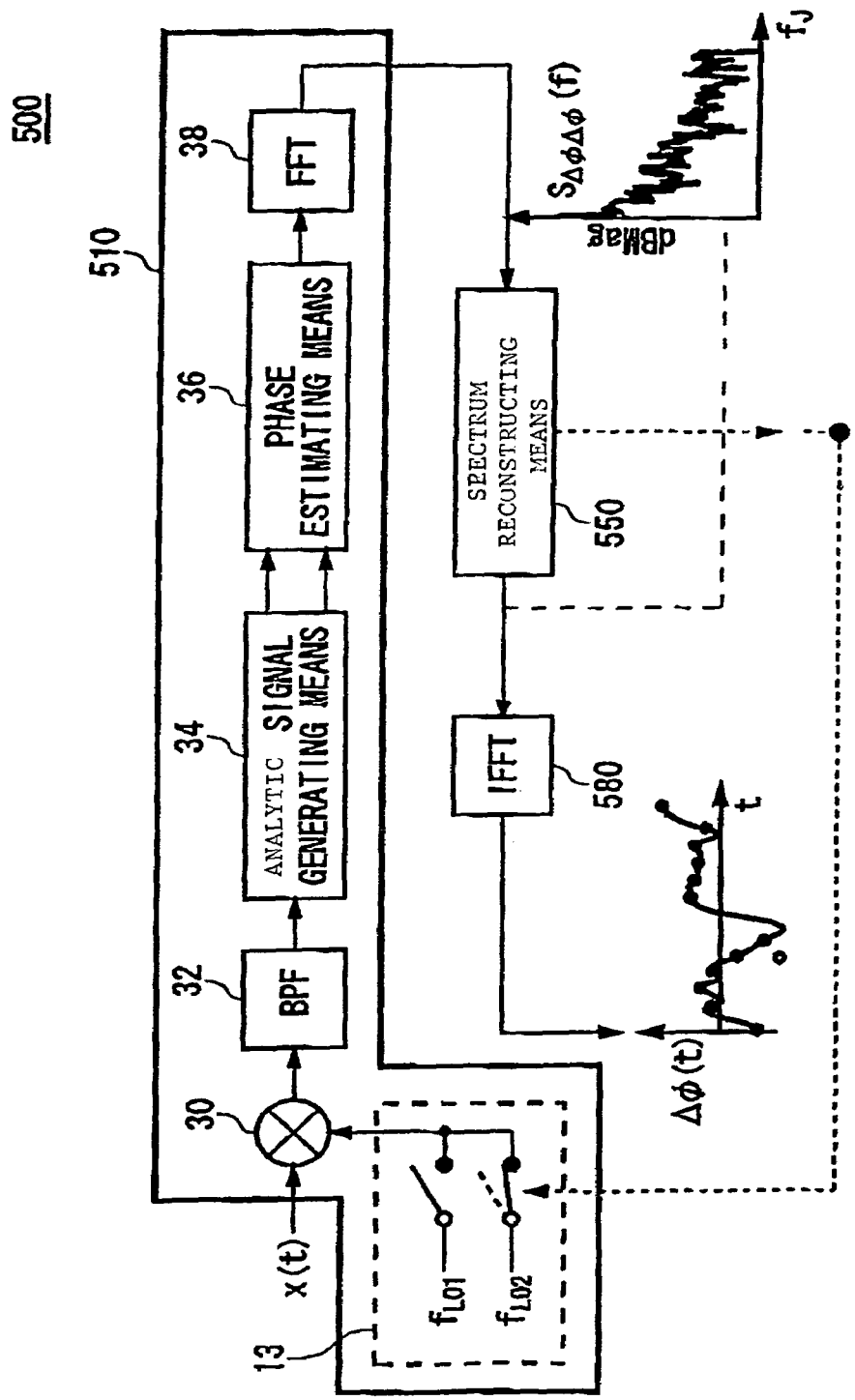
FIG. 24 shows an example of the configuration of a wideband signal analyzing apparatus 500.

FIGS. 20B and 24 show an example of the configuration of a wideband signal analyzing apparatus 500. The wideband signal analyzing apparatus 500 includes a frequency-division demultiplexing phase noise sampler 510, spectrum reconstructing means 550, and inverse Fourier transforming means 580. That is, the wideband signal analyzing apparatus 500 further includes the inverse Fourier transforming means 580 in addition to the configuration of the wideband signal analyzing apparatus 400.

Figure 21:
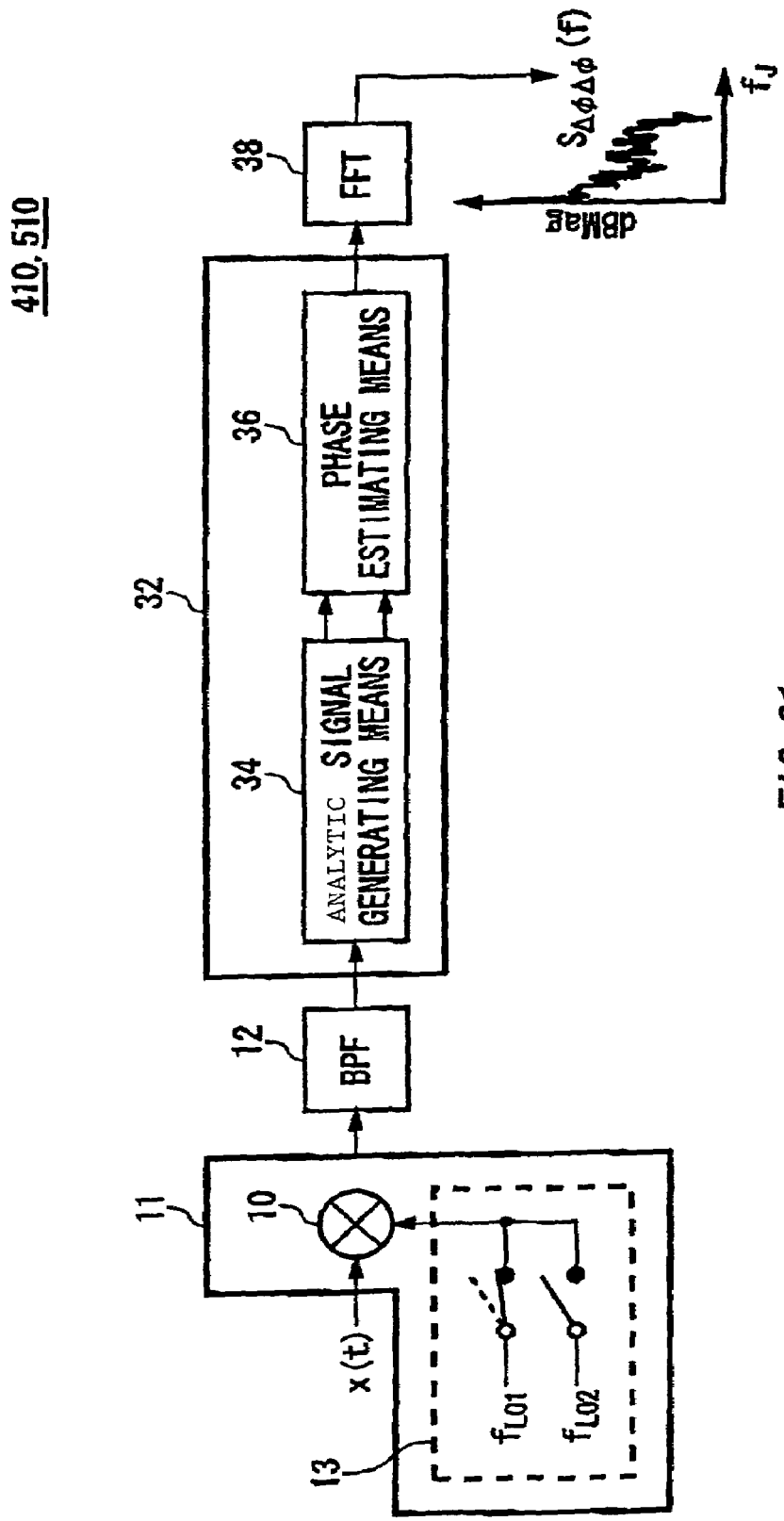
FIG. 21 shows an example of the configuration of a frequency-division demultiplexing phase noise sampler (410, 510).

FIG. 21 shows an example of the configuration of the frequency-division demultiplexing phase noise sampler (410, 510). The frequency-division demultiplexing phase noise sampler (410, 510) includes frequency-shifting means 11, bandpass filtering means 12, instantaneous phase noise estimating means 32, and Fourier transforming means 38.

The frequency-shifting means 11 and the bandpass filtering means 12 have the same functions and configurations as the frequency-shifting means 11 and the bandpass filtering means 12 described in connection with FIG. 14.

The instantaneous phase noise estimating means 32 estimates the instantaneous phase noise of each of the intermediate frequency signals band-limited by the bandpass filtering means 12. The instantaneous phase noise estimating means 32 of this embodiment includes analytic signal transforming means 34 and phase estimating means 36.

The analytic signal transforming means 34 transforms each of the intermediate frequency signals into the analytic signal, and the phase estimating means 36 estimates the phase angle of each of the analytic signals. Moreover, the instantaneous phase noise estimating means 32 may include linear component removing means for removing the linear component from the phase angle of each of the analytic signals. By this configuration, the instantaneous phase noise $\Delta\phi(t)$ of each of the intermediate frequency signals can be calculated.

The Fourier transforming means 38 outputs the complex spectrum of the instantaneous phase noise of each of the intermediate frequency signals. Moreover, the spectrum reconstructing means (450, 550) controls the frequency of the periodic signal generated by the frequency generating means 13 and shifts and reconstructs the complex spectrum of each of the intermediate frequency signals output by the Fourier transforming means 38 according to the frequency of the corresponding periodic signal.

Figure 22:
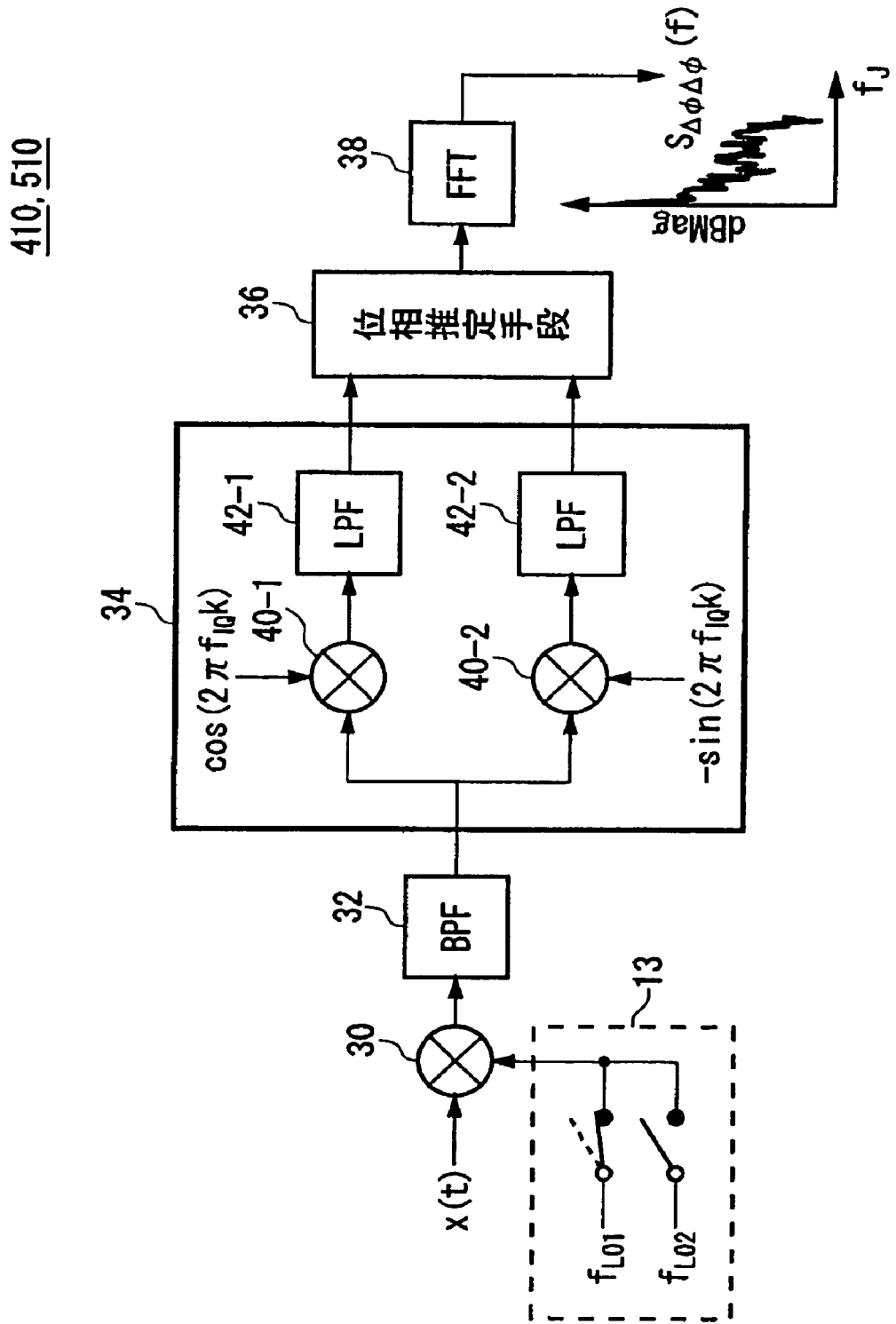
FIG. 22 shows an example of the configuration of an analytic signal transforming means 34.

FIG. 22 shows an example of the configuration of the analytic signal transforming means 34. The analytic signal transforming means 34 includes two mixers (40-1, 40-2, which are hereafter generally referred to as 40) for transforming each of the intermediate frequency signals into the analytic signal and two low pass filters (42-1, 42-2, which are hereafter generally referred to as 42) provided corresponding to the mixers.

The mixers 40 perform IQ demodulation on each of the intermediate frequency signals and generate the analytic signal. Moreover, the low pass filter 42 limits the band of each of the analytic signals. For example, the low pass filter 42 limits the band of the analytic signal according to the band used when the spectrum reconstructing means (450, 550) connects the phase noise spectrum of each of the intermediate frequency signals.

According to the wideband signal analyzing apparatus 400 shown in FIG. 23, since the phase noise spectrum of each of the intermediate frequency signals is calculated and merged, the phase noise spectrum of the wideband signal can be easily calculated. Moreover, according to the wideband signal analyzing apparatus 500 shown in FIG. 24, by performing inverse Fourier transform on the phase noise spectrum calculated by the wideband signal analyzing apparatus 400, the instantaneous phase noise of the wideband signal can be easily calculated.

Next, the operation of the wideband signal analyzing apparatus 500 will be described in detail using equations. The wideband signal analyzing apparatus 500 of this embodiment includes the frequency-division demultiplexing phase noise sampler 510, the spectrum reconstructing means 550 (a phase noise spectrum reconstructor), and the inverse Fourier transforming means 580 as shown in FIG. 20B. Further, as shown in FIG. 21, the frequency-division demultiplexing phase noise sampler includes the frequency-shifting means 11 and the analytic signal transforming means 34 (e.g. digital I-/Q-demodulating means). Hereafter, it will be shown that the wideband signal analyzing apparatus 500 can measure the same instantaneous phase noise regardless of the serial or parallel measurement described above.

The serial measurement system will be first discussed. As shown in FIG. 22, only one frequency-shifting means 11 is provided in the serial measurement. Further, it is assumed that the center frequency of the bandpass filtering means 12 is fixed as $f_{IF}$. Therefore, the wideband jitter measurement is realized by dividing the measurement band into sub-bands and performing time-division measurement on the sideband of the phase noise spectrum $S_{\Delta\phi\Delta\phi}(f_J)$.

If the frequency-mixed input signal is converted into the discrete signal by the ADC, and then transformed into the analytic signal in the band corresponding to a range from the frequency $f_0+\epsilon$ to the frequency $f_0+BW/2$ by the digital I-/Q-demodulating means shown in FIG. 22, similarly, the equation is obtained as $$z\left(t_1, \varepsilon \to \frac{BW}{2}\right) = \cos\left(2\pi\Delta f t_1 + [\phi_0 - \phi_{0,LO1}] - \Delta\phi\left(t_1, \varepsilon \to \frac{BW}{2}\right)\right) + \quad (28)$$
$$j\sin\left(2\pi\Delta f t_1 + [\phi_0 - \phi_{0,LO1}] - \Delta\phi\left(t_1, \varepsilon \to \frac{BW}{2}\right)\right).$$

Then, if the input signal is multiplied by a sine wave $\cos(2\pi f_{LO2}t_2+\phi_{0,LO2})$ from the frequency generating means 13 using the frequency mixing means 30, converted into the discrete signal by the ADC, and then transformed into the analytic signal in the band corresponding to a range from the frequency $f_0+BW/2$ to the frequency $f_0+BW$ by the digital I-/Q-demodulating means, similarly the equation is obtained as $$z\left(t_2, \frac{BW}{2} \to BW\right) = \cos\left([\phi_0 - \phi_{0,LO2}] - \Delta\phi\left(t_2, \frac{BW}{2} \to BW\right)\right) + \quad (29)$$
$$j\sin\left([\phi_0 - \phi_{0,LO2}] - \Delta\phi\left(t_2, \frac{BW}{2} \to BW\right)\right),$$

where $f_{LO2}=f_0+BW/2-f_{IF}$. Further, assuming $\Delta f<<BW$, the offset frequency was ignored. At this time, it should be noted that only the random phase process is observed.

The frequency-division demultiplexing phase noise sampler 510 shown in FIG. 22 transforms the frequency-mixed noise waveform into the analytic signal $z(t_1)$ and obtains the instantaneous phase noise $\Delta\phi(t_1)$ Lastly, the frequency-division demultiplexing phase noise sampler 510 performs Fourier transform on $\Delta\phi(t_1)$ and outputs the phase noise spectrum $S_{\Delta\phi\Delta\phi}(f_J)$. Then the spectrum reconstructing means 550 obtains the sum of $\Delta\phi(t_1)$ of $z(t_1)$ and $\Delta\phi(t_2)$ of $z(t_2)$ in the frequency domain as shown in FIG. 23. Here, it should be noted that the sum of $\Delta\phi(t)$ is preserved even though a plurality of frequency-shift operations are performed on the waveforms from the equation (23.2). Further, using the orthogonality in the frequency domain, the equation is obtained as $$\Delta\phi\left(t, \varepsilon \to \frac{BW}{2}\right) + \Delta\phi\left(t, \frac{BW}{2} \to BW\right) \equiv \Delta\phi(t, \varepsilon \to BW). \quad (31.1)$$

That is, the spectrum reconstructing means 550 outputs the complex spectrum $S_{\Delta\phi\Delta\phi}(f_J)$ corresponding to the equation (31.1). Practically, as shown in FIG. 23, the spectrum reconstructing means 550 performs frequency-shift operation on the complex spectrum $S_{\Delta\phi\Delta\phi}(f_J,\ _{LO1})$ or $S_{\Delta\phi\Delta\phi}(f_J,\ _{LO2})$ and recovers the complex spectrum $S_{\Delta\phi\Delta\phi}(f_J)$.

Lastly, as shown in FIG. 24, if inverse Fourier transform is performed on the complex spectrum $S_{\Delta\phi\Delta\phi}(f_J)$ reconstructed, the instantaneous phase noise of the bandwidth BW is obtained as $$\Delta\phi(t,\epsilon \to BW). \quad (34)$$

Next, the parallel measurement will be described. In case of the parallel measurement, the wideband signal analyzing apparatus (400, 500) has a plurality of frequency-shifting means 11 and a plurality of ADCs. Therefore, the wideband jitter measurement is realized by dividing the measurement band into sub-bands and measuring the sideband phase noise spectrum at the same time.

If the plurality of ADCs digitize the frequency-mixed signals at the same time, the equations (28) and (29) become $$z\left(t, \varepsilon \to \frac{BW}{2}\right) = \cos\left(2\pi\Delta ft + [\phi_0 - \phi_{0,LO1}] - \Delta\phi\left(t, \varepsilon \to \frac{BW}{2}\right)\right) + \quad (35)$$
$$j\sin\left(2\pi\Delta ft + [\phi_0 - \phi_{0,LO1}] - \Delta\phi\left(t, \varepsilon \to \frac{BW}{2}\right)\right)$$

$$z\left(t, \frac{BW}{2} \to BW\right) = \cos\left([\phi_0 - \phi_{0,LO2}] - \Delta\phi\left(t, \frac{BW}{2} \to BW\right)\right) + \quad (36)$$
$$j\sin\left([\phi_0 - \phi_{0,LO2}] - \Delta\phi\left(t, \frac{BW}{2} \to BW\right)\right),$$

respectively. The spectrum reconstructing means (450, 550) calculates the sum of the instantaneous phase noise $\Delta\phi(t)$ of the analytic signal $$z\left(t, \varepsilon \to \frac{BW}{2}\right)$$

and $\Delta\phi(t)$ of $$z\left(t, \frac{BW}{2} \to BW\right)$$

in the frequency domain. Finally, the instantaneous phase noise which is the same as the equation (34) is obtained.

Next, the wideband jitter measurement based on the estimation of the carrier and the sideband noise spectrum will be described. Moreover, the wideband signal analyzing apparatuses described in connection with FIGS. 13 to 24 require the I-/Q-demodulating means, and it is difficult to apply them to the real time oscilloscope. In the below embodiment, a wideband signal analyzing apparatus which can be easily realized even in the real time oscilloscope will be described.

Figure 25:
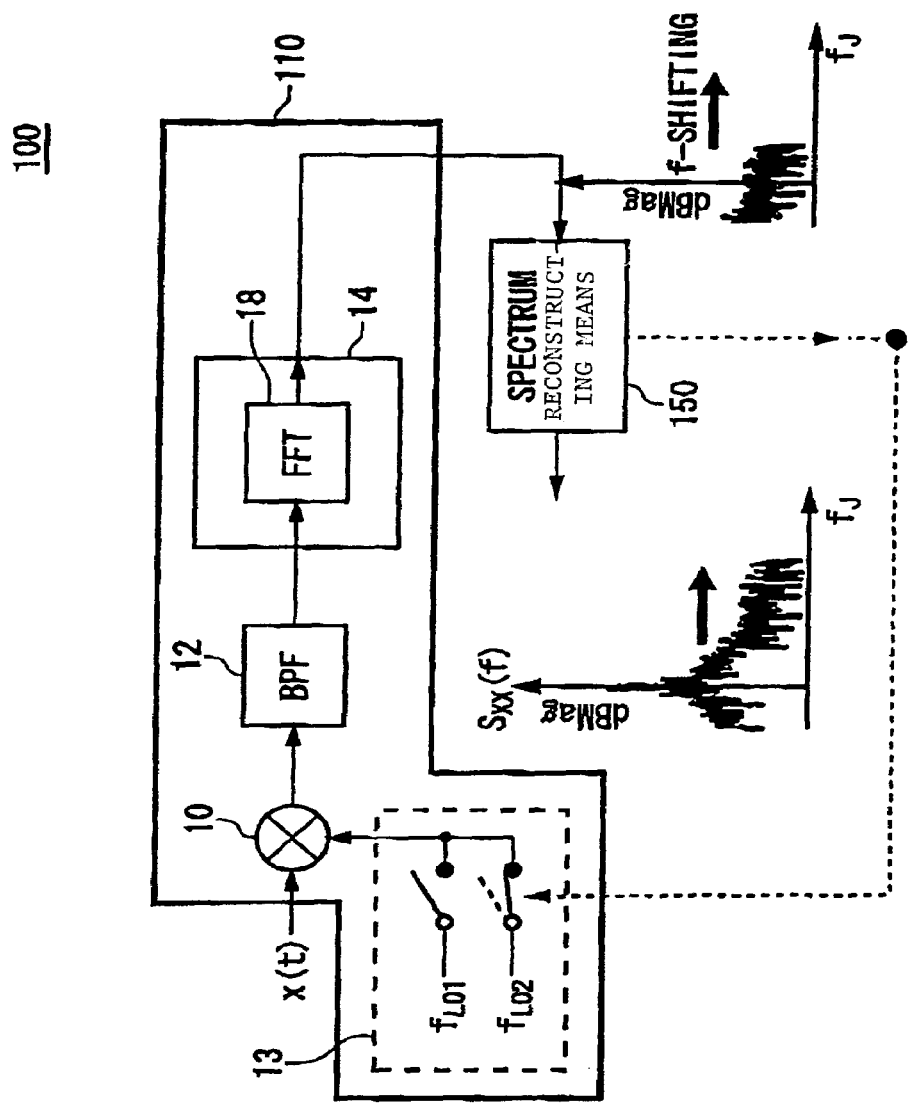
FIG. 25 shows another example of the configuration of the wideband signal analyzing apparatus 100.

FIG. 25 shows another example of the configuration of the wideband signal analyzing apparatus 100. As described in connection with FIG. 13A, the wideband signal analyzing apparatus 100 includes the frequency-division demultiplexing sampler 110 and the spectrum reconstructing means 150. Moreover, the input signal of this embodiment is to be assumed to have a predetermined carrier and sidebands.

The configuration of the wideband signal analyzing apparatus 100 of this embodiment differs from the wideband signal analyzing apparatus 100 described in connection with FIG. 15 in that the frequency domain sampler 14 functions as the spectrum measuring means. Since other configurations are the same as the wideband signal analyzing apparatus 100, they will not be described. The frequency domain sampler 14 of this embodiment includes Fourier transforming means 18.

The Fourier transforming means 18 receives each of the intermediate frequency signals band-limited by the bandpass filtering means 12 and outputs the one-sided complex spectrum of each of the intermediate frequency signals of the input signal to the spectrum reconstructing means, based on the carrier and the sideband noise of the input signal. That is, it outputs the one-sided complex spectrum including the carrier spectrum and the sideband noise spectrum.

By this operation, the complex spectrum of the input signal can be calculated. Moreover, when the instantaneous phase noise of the input signal is calculated, the wideband signal analyzing apparatus 100 may further include the instantaneous phase noise estimating means 280 described in connection with FIG. 13B in addition to the configuration described in connection with FIG. 25. In this case, the instantaneous phase noise estimating means 280 includes inverse Fourier transforming means for transforming the one-sided complex spectrum reconstructed by the spectrum reconstructing means 150 into a signal in the time domain and generating the analytic signal of the input signal, phase estimating means for calculating the phase angle of the analytic signal of the input signal, and linear phase removing means for removing the linear component of the phase angle from the analytic signal and calculating the phase noise of the input signal.

Next, the operation of the wideband signal analyzing apparatus 100 of this embodiment will be described in detail using equations.

First, the wideband signal analyzing apparatus 100 functioning as the serial measuring system will be described. As shown in FIG. 25, in case of the serial measurement, the wideband signal analyzing apparatus 100 includes only a single frequency-shifting means 10. Further, it is assumed that the center frequency of the bandpass filtering means 12 is fixed as $f_{IF}$. Therefore, the wideband jitter measurement is realized by dividing the measurement band into sub-bands and performing time-division measurement on the sum spectrum $S_{xx}(f_J)$ of the carrier spectrum and the sideband noise spectrum.

If $f_{LO1}=f_0-f_{IF}$ in the equation (27), the carrier is frequency-shifted to the center frequency ($f_{IF}$) of the bandpass filtering means 12. If the frequency-mixed signal is observed in the band corresponding to a range from the frequency $f_0-BW/2$ to the frequency $f_0+BW/2$, the following equation is obtained:

$$x\left(t_1, -\frac{BW}{2} \to \frac{BW}{2}\right) = \quad (37)$$
$$\cos\left(2\pi[[f_0 - f_{LO1}] + \Delta f]t_1 + [\phi_0 + \phi_{0,LO1}] - \Delta\phi\left(t_1, -\frac{BW}{2} \to \frac{BW}{2}\right)\right).$$

In the time domain, the sum of the linear phase $2\pi[[f_0-f_{LO1}]+\Delta f]t_1+[\phi_0-\phi_{0,LO1}]$ of the carrier and the random phase process $$-\Delta\phi\left(t_1, -\frac{BW}{2} \to \frac{BW}{2}\right)$$

is observed. At this time, in the frequency domain, the carrier spectrum and the two-sided noise spectrum are observed.

In the same way, If $f_{LO2}=f_0+BW-f_{IF}$, the carrier is frequency-shifted out of the corner frequency ($f_{IF}-BW$) of the bandpass filter. If the frequency-mixed signal is observed in the band corresponding to a range from the frequency $f_0+BW/2$ to the frequency $f_0+3BW/2$, the following equation is obtained:

$$x\left(t_2, -\frac{BW}{2} \to \frac{3BW}{2}\right) = \cos\left([\phi_0 - \phi_{0,LO2}] - \Delta\phi\left(t_2, \frac{BW}{2} \to \frac{3BW}{2}\right)\right). \quad (38)$$

That is, the one-sided noise spectrum is observed. If the amplitude modulated component is eliminated, only the random phase process is observed.

The spectrum reconstructing means 150 as shown in FIG. 25 obtains the sum of $x(t_1)$ and $x(t_2)$ of a signal in the frequency domain. The output of the spectrum reconstructing means 150 present in the time domain in consideration of the equations (37) and (38) is $$x\left(t_1, -\frac{BW}{2} \to \frac{BW}{2}\right) + x\left(t_2, \frac{BW}{2} \to \frac{3BW}{2}\right) =$$

$$\cos\left(2\pi[[f_0 - f_{LO1}] + \Delta f]t_1 + [\phi_0 - \phi_{0,LO1}] - \Delta\phi\left(t_1, -\frac{BW}{2} \to \frac{BW}{2}\right)\right) +$$

$$\cos\left([\phi_0 - \phi_{0,LO2}] - \Delta\phi\left(t_2, \frac{BW}{2} \to \frac{3BW}{2}\right)\right).$$

This is equivalent to the following phasor expression:

$$z\left(t, -\frac{BW}{2} \to \frac{BW}{2}\right) + e^{j2\pi([f_0 - f_{LO1}] + \Delta f)t} z\left(t, \frac{BW}{2} \to \frac{3BW}{2}\right) =$$

$$e^{j[2\pi([f_0 - f_{LO1}] + \Delta f)t + [\phi_0 - \phi_{0,LO1}] - \Delta\phi(t, -\frac{BW}{2} \to \frac{BW}{2})]} +$$

$$e^{j[2\pi([f_0 - f_{LO1}] + \Delta f)t + [\phi_0 - \phi_{0,LO2}] - \Delta\phi(t, \frac{BW}{2} \to \frac{3BW}{2})]}.$$

Meanwhile, since $\Delta\phi(t)$ is the random phase process, the initial phase differences $(\phi_0-\phi_{0,LO1})$ and $(\phi_0-\phi_{0,LO2})$ at the sampling times $t_1$ and $t_2$ do not have any physical meaning. That is, the following equation is obtained:

$$z\left(t, -\frac{BW}{2} \to \frac{BW}{2}\right) + e^{j2\pi([f_0 - f_{LO1}] + \Delta f)t} z\left(t, \frac{BW}{2} \to \frac{3BW}{2}\right) = \quad (39)$$

$$e^{j[2\pi([f_0 - f_{LO1}] + \Delta f)t - \Delta\phi(t, -\frac{BW}{2} \to \frac{BW}{2})]} +$$

$$e^{j[2\pi([f_0 - f_{LO1}] + \Delta f)t - \Delta\phi(t, \frac{BW}{2} \to \frac{3BW}{2})]} =$$

$$e^{j2\pi([f_0 - f_{LO1}] + \Delta f)t}\left(e^{-j\Delta\phi(t, -\frac{BW}{2} \to \frac{BW}{2})} + e^{-j\Delta\phi(t, \frac{BW}{2} \to \frac{3BW}{2})}\right).$$

Further, using the orthogonality in the frequency domain, the following equation is obtained:

$$\Delta\phi\left(t, -\frac{BW}{2} \to \frac{BW}{2}\right) + \Delta\phi\left(t, \frac{BW}{2} \to \frac{3BW}{2}\right) \equiv \quad (40)$$

$$\Delta\phi\left(t, -\frac{BW}{2} \to \frac{3BW}{2}\right).$$

Therefore, the spectrum reconstructing means 150 obtains the sum of phasors represented by $$z\left(t, -\frac{BW}{2} \to \frac{BW}{2}\right) + e^{j2\pi([f_0 - f_{LO1}] + \Delta f)t} z\left(t, \frac{BW}{2} \to \frac{3BW}{2}\right) =$$

$$e^{j2\pi([f_0 - f_{LO1}] + \Delta f)t} e^{-j\Delta\phi(t, -\frac{BW}{2} \to \frac{3BW}{2})}.$$

That is, the spectrum satisfying the following equation is calculated:

$$x\left(t, -\frac{BW}{2} \to \frac{BW}{2}\right) + x\left(t, \frac{BW}{2} \to \frac{3BW}{2}\right) = \quad (41)$$

$$\cos\left(2\pi[[f_0 - f_{LO1}] + \Delta f]t - \Delta\phi\left(t, -\frac{BW}{2} \to \frac{3BW}{2}\right)\right).$$

Practically, as shown in FIG. 25, the spectrum reconstructing means 150 performs frequency-shift operation on the observed complex spectrum $S_{xx}(f_j, _{LO1})$ or $S_{xx}(f_j, _{LO2})$ and recovers the complex spectrum $S_{xx}(f_j)$.

The equation (41) is the wideband complex spectrum and corresponds to the sum spectrum $S_{xx}(f_j)$ of the carrier spectrum and the sideband noise spectrum. It corresponds to so-called the RF spectrum. If inverse Fourier transform is performed on the complex RF spectrum, the random-phase-modulated waveform is obtained.

Next, the process of obtaining a real waveform from the complex spectrum will be described. The sequence of obtaining a real waveform from the complex spectrum is present in "E. O. Brigham, The Fast Fourier Transform. Englewood Gliffs, N.J.: Prentice-Hall, Inc., 1974 pp. 135-137".

Figure 26A:
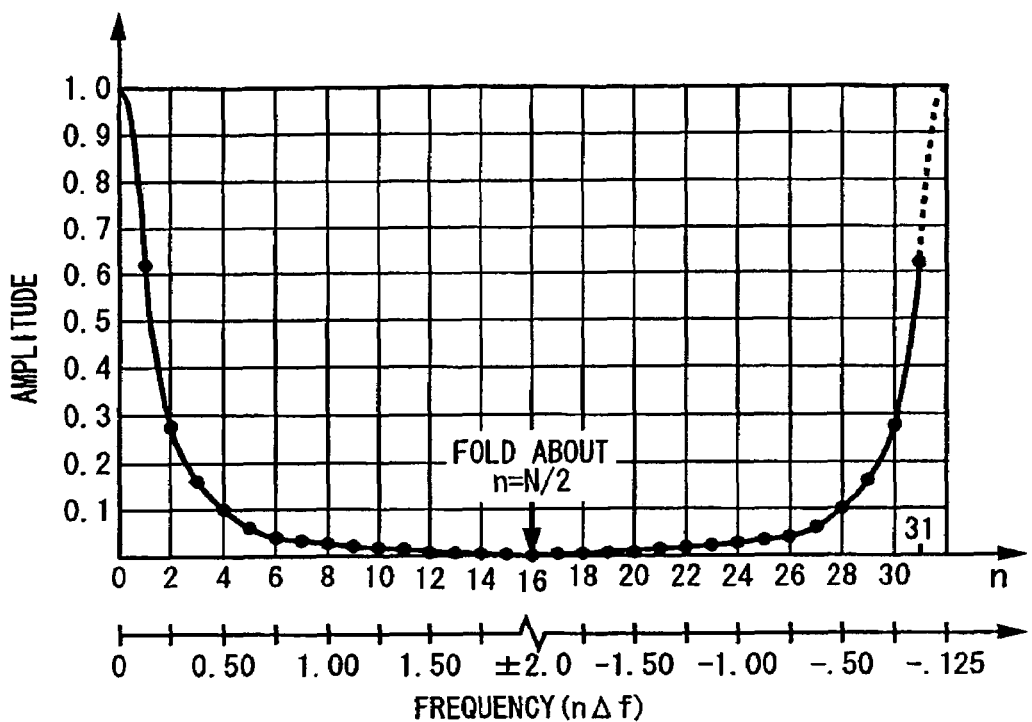
FIGS. 26A and 26B show conversion of a complex spectrum into a one-sided spectrum.
Figure 26B:
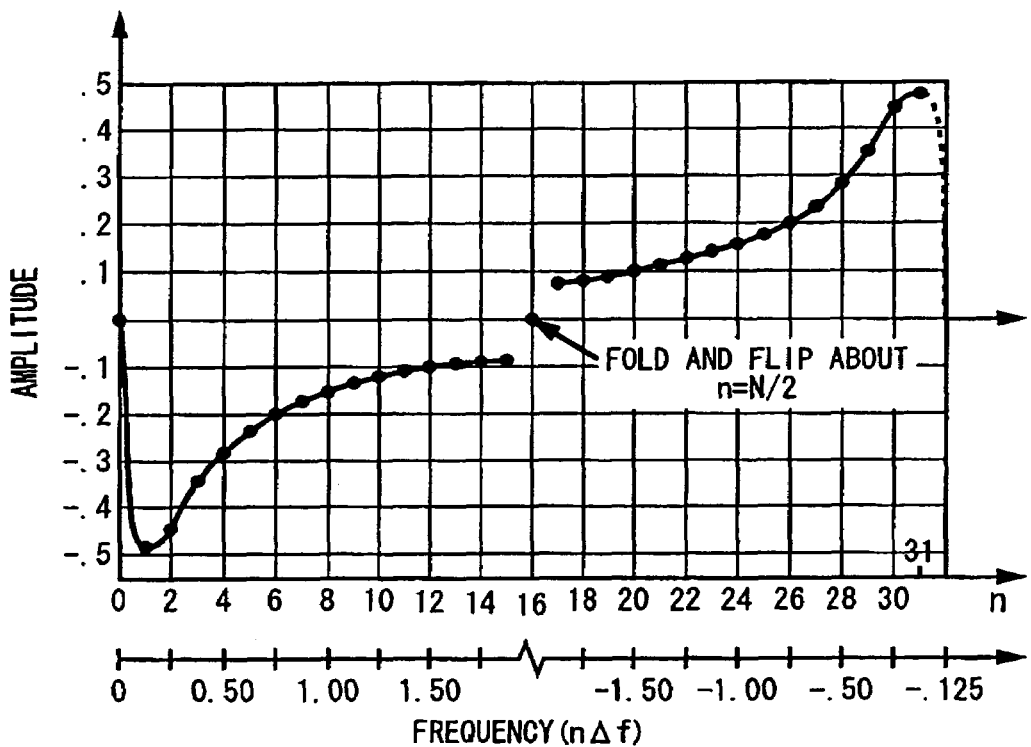

Let the complex spectrum over the frequency range $$\left[f_0, f_0 + \frac{3BW}{2}\right]$$

be $S_{xx}(f_j)$ corresponding to the positive frequency $f_j$. The complex spectrum $S_{xx}(-f_j)$ over the negative frequency $-f_j$ is given by complex sine wave $S'_{xx}(f_j)$ (see FIGS. 26A and 26B). The real waveform $x(t)$ is obtained by performing inverse Fourier transform on $S_{xx}(f_j)$.

The period jitter or the timing jitter can be measured by detecting the level crossing points of $x(t)$ using zero-crossing detecting means (e.g. the algorithm in the real time oscilloscope). It should be noted that the zero-crossing point is defined as the time at which the signal crosses the 50% amplitude level.

Next, the process of obtaining a complex waveform from the complex spectrum will be described. The sequence of obtaining a complex waveform from the complex spectrum is present in "A. Papoulis, Probability, Random Variables, and Stochastic Processes, 2nd ed. New York: McGraw-Hill Book Company, 1984 pp. 284".

Figure 27:
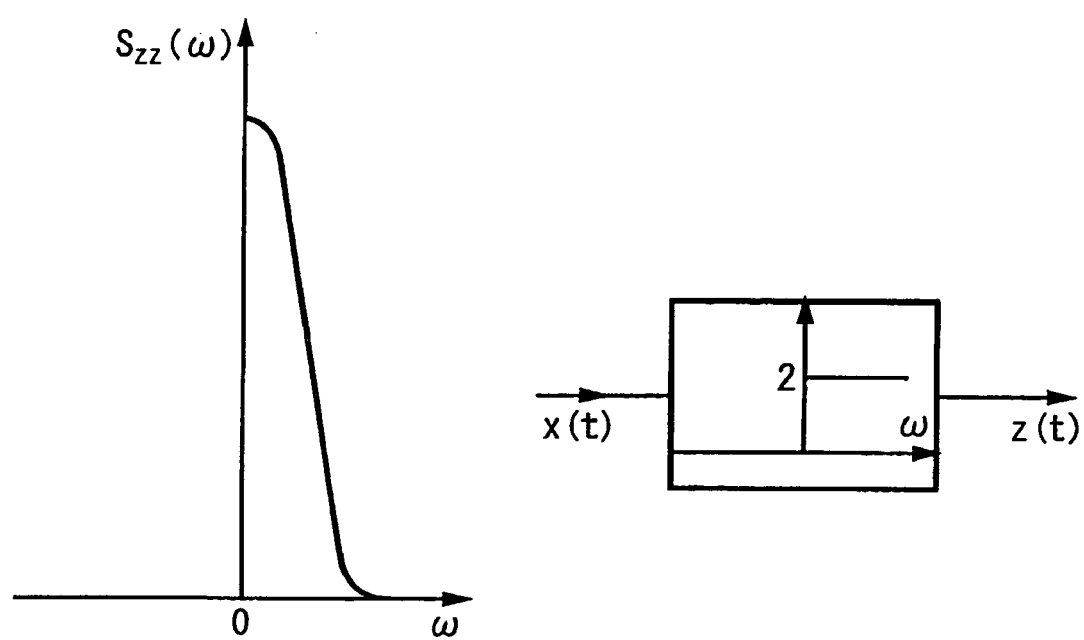
FIG. 27 shows conversion of a complex spectrum into a one-sided spectrum.

Let the complex spectrum of a frequency range $$\left[f_0, f_0 + \frac{3BW}{2}\right]$$

be $Z(f_j)=S_{xx}(f_j)$ corresponding to the positive frequency $f_j$ (see FIG. 27). The complex spectrum $Z(-f_j)$ over the negative frequency $-f_j$ is let to be $Z(-f_j)=0$ (see FIG. 27). The complex waveform z(t) is obtained by performing inverse Fourier transform on $Z(f_j)$.

Except the bandwidth, z(t) is equal to the analytic signal. Accordingly, the phase noise $\Delta\phi(t)$ is measured by estimating the instantaneous phase, performing phase unwrapping, and removing the instantaneous linear phase from it. Lastly, the zero-crossing resampler performs its operation on $\Delta\phi(t)$, and then the timing jitter $\Delta\phi[n]$ is obtained.

Next, the wideband signal analyzing apparatus 100 functioning as the parallel measuring system will be described. The wideband signal analyzing apparatus 100 has a plurality of frequency-shifting means 11 and a plurality of ADCs. Therefore, the wideband jitter measurement is realized by dividing the measurement band into sub-bands and performing time-division measurement on the sum spectrum $S_{xx}(f_j)$ of the carrier spectrum and the sideband noise spectrum.

If the plurality of ADCs convert the frequency-mixed signals into the discrete signals at the same time, the equations (37) and (38) are respectively $$x\left(t, -\frac{BW}{2} \to \frac{BW}{2}\right) = \tag{42}$$
$$\cos\left(2\pi[[f_0 - f_{LO1}] + \Delta f]t + [\phi_0 - \phi_{0,LO1}] - \Delta\phi\left(t, -\frac{BW}{2} \to \frac{BW}{2}\right)\right)$$

$$x\left(t, \frac{BW}{2} \to \frac{3BW}{2}\right) = \cos\left([\phi_0 - \phi_{0,LO2}] - \Delta\phi\left(t, \frac{BW}{2} \to \frac{3BW}{2}\right)\right). \tag{43}$$

The spectrum reconstructing means 150 calculates the sum of the signal $$x\left(t, -\frac{BW}{2} \to \frac{BW}{2}\right)$$

and the noise $$x\left(t, \frac{BW}{2} \to \frac{3BW}{2}\right)$$

in the frequency domain. The output of the spectrum reconstructing means 150 is represented by phasors as $$z\left(t, -\frac{BW}{2} \to \frac{BW}{2}\right) + e^{j2\pi([f_0-f_{LO1}]+\Delta f)t} z\left(t, \frac{BW}{2} \to \frac{3BW}{2}\right) = \tag{44}$$
$$e^{j2\pi([f_0-f_{LO1}]+\Delta f)t} e^{-j\Delta\phi(t, -\frac{BW}{2} \to \frac{3BW}{2})}.$$

This is the same wideband complex spectrum as the equation (41).

Next, the measurement of the period jitter and the skew using the wideband signal analyzing apparatuses described in connection with FIGS. 13 to 27 will be described.

Figure 28:
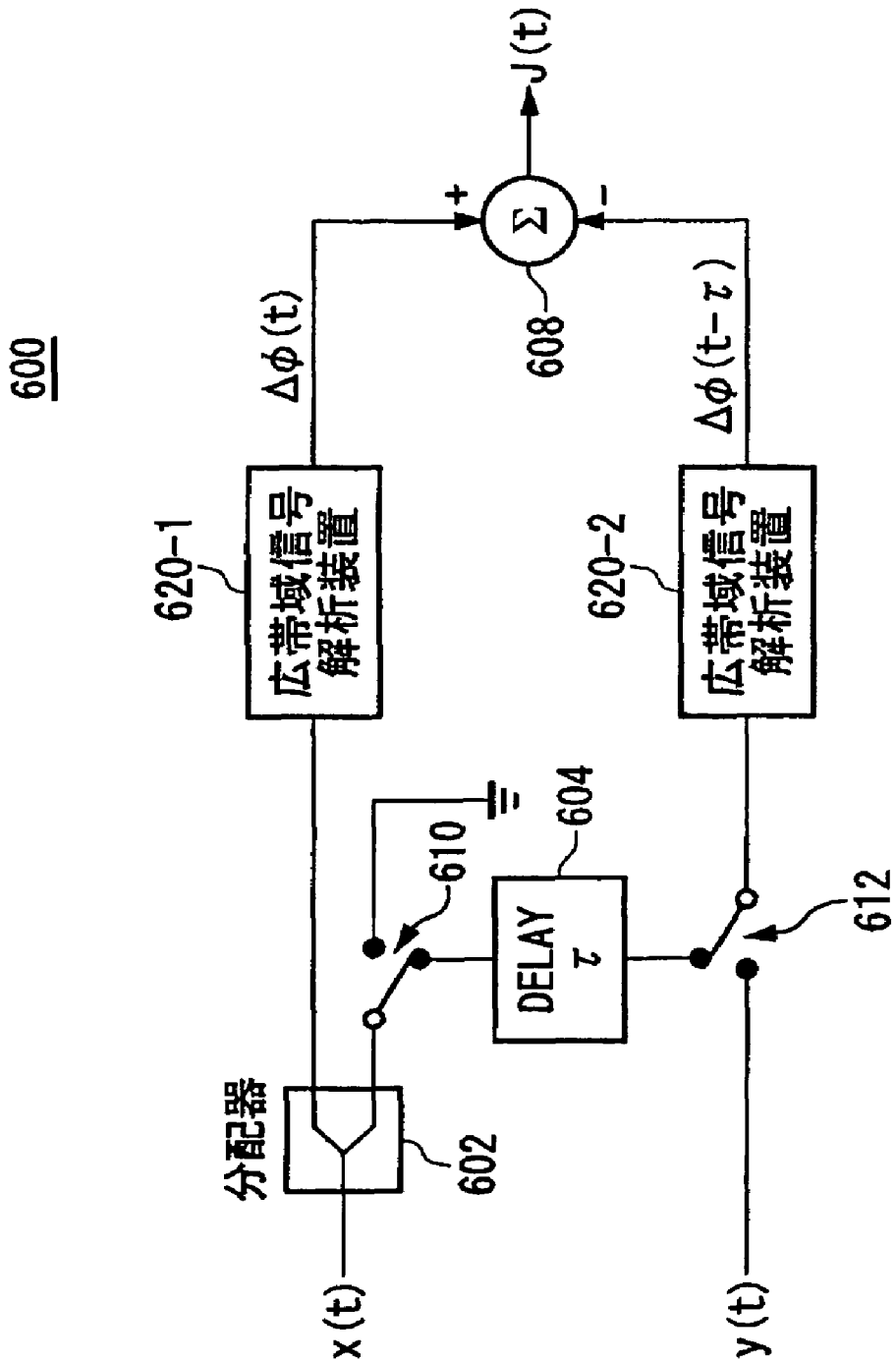
FIG. 28 shows an example of the configuration of a wideband signal analyzing apparatus 600 for measuring the period jitter of an input signal.

FIG. 28 shows an example of the configuration of a wideband signal analyzing apparatus 600 for measuring the period jitter of the input signal. The wideband signal analyzing apparatus 600 includes two wideband signal analyzing apparatuses (620-1, 620-2) described in connection with FIGS. 13 to 27 and differential calculating means 608 or adding means (not shown). Moreover, the wideband signal analyzing apparatus 600 may function as a wideband period jitter analyzing apparatus for measuring the wideband period jitter. In this case, the wideband signal analyzing apparatus 600 further includes a power splitter 602, delaying means 604, and switches 610 and 612, switching to determine whether to function as the wideband skew analyzing apparatus or the wideband period jitter analyzing apparatus by switching the switches 610 and 612.

First, the wideband signal analyzing apparatus 600 functioning as the wideband period jitter analyzing apparatus will be described. The power splitter 602 receives the input signal x(t) and inputs the input signal x(t) to the first wideband signal analyzing apparatus 620-1 and the delaying means 604. The switch 610 is provided between the power splitter 602 and the delaying means 604 and switches to determine whether to couple or not the power splitter 602 and the delaying means 604. In this embodiment, the switch 610 is coupling the power splitter 602 and the delaying means 604.

The delaying means 604 delays the input signal x(t) based on the period of the input signal x(t). The delaying means 604 of this embodiment delays the input signal x(t) by one period of the input signal x(t). Moreover, the switch 612 switches to determine whether to input the input signal x(t) delayed by the delaying means 604 or another input signal y(t) to the second wideband signal analyzing apparatus 620-2. In this embodiment, the switch 612 is inputting the input signal x(t) delayed by the delaying means 604 to the second wideband signal analyzing apparatus 620-2.

The first wideband signal analyzing apparatus 620-1 outputs the instantaneous phase noise of the input signal x(t), and the second wideband signal analyzing apparatus 620-2 outputs the instantaneous phase noise of the input signal x(t) delayed by the delaying means 604.

Moreover, the differential calculating means 608 functioning as the period jitter calculating means calculates the period jitter of the input signal based on the differential between the instantaneous phase noise output by the first wideband signal analyzing apparatus 620-1 and the instantaneous phase noise output by the second wideband signal analyzing apparatus 620-2.

According to the wideband signal analyzing apparatus 600 of this embodiment, it is possible to easily calculate the period jitter of the wideband input signal. Next, the wideband signal analyzing apparatus 600 functioning as the wideband skew analyzing apparatus will be described.

Figure 29:
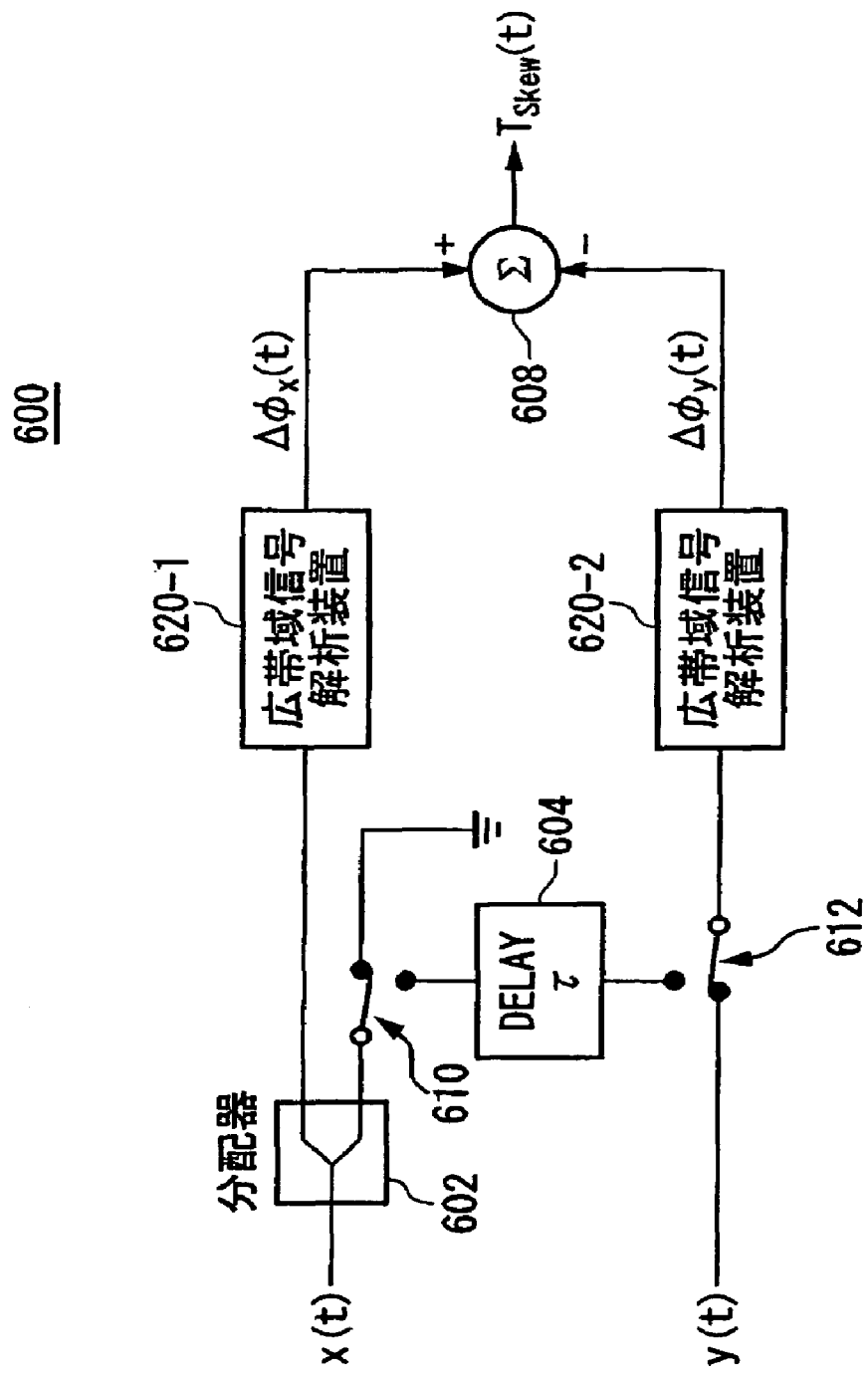
FIG. 29 shows the operation of a wideband signal analyzing apparatus 600 functioning as a wideband skew analyzing apparatus.

FIG. 29 shows the operation of the wideband signal analyzing apparatus 600 functioning as the wideband skew analyzing apparatus. If the wideband signal analyzing apparatus 600 functions as the wideband skew analyzing apparatus, the switch 610 disconnects the power splitter 602 from the delaying means 604, and the switch 612 inputs the second input signal y(t) to the second wideband signal analyzing apparatus 620-2.

The first wideband signal analyzing apparatus 620-1 receives the first input signal x(t) and outputs the instantaneous phase noise of the first input signal x(t). Moreover, the second wideband signal analyzing apparatus 620-2 outputs the instantaneous phase noise of the second input signal y(y). That is, the instantaneous phases $\Delta\phi_x(t)$ and $\Delta\phi_y(t)$ of the input signals x(t) and y(t) are output respectively.

The differential calculating means 608 functioning as the skew calculating means calculates the skew between the first and second input signals based on the differential between the instantaneous phase noise output by the first wideband signal analyzing apparatus 620-1 and the instantaneous phase noise output by the second wideband signal analyzing apparatus 620-2. That is, the differential calculating means 608 receives $\Delta\phi_x(t)$ and $\Delta\phi_y(t)$ and measures the skew or the alignment jitter corresponding to $$\Delta\phi_x(t)-\Delta\phi_y(t). \tag{45}$$

According to the wideband signal analyzing apparatus 600 of this embodiment, it is possible to easily calculate the skew of a plurality of wideband input signals. Moreover, in the wideband signal analyzing apparatus 600 of this embodiment, it should be noted that $\Delta\phi(t)$ is not necessarily resampled.

Figure 30:
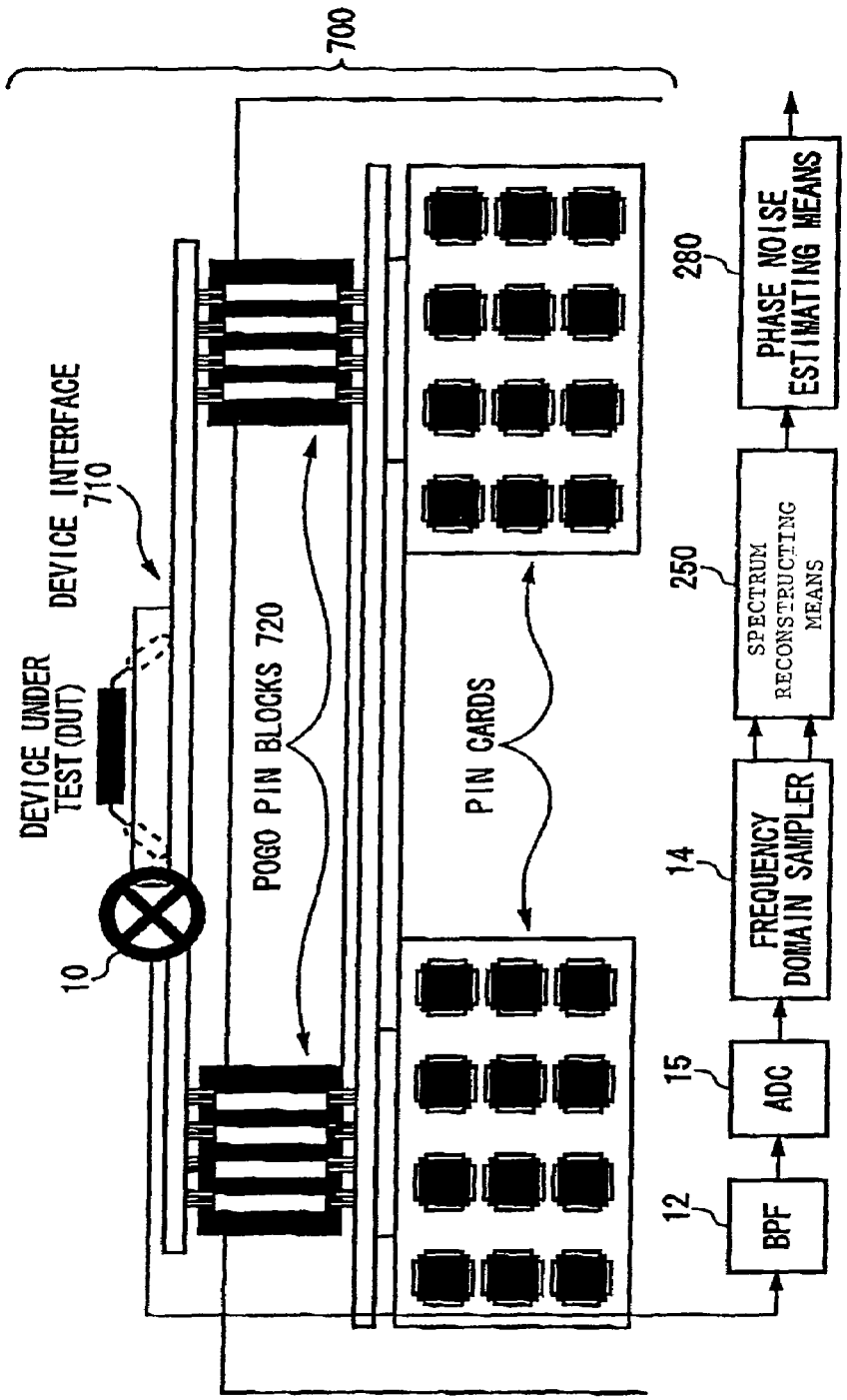
FIG. 30 shows a test apparatus system for testing a device under test.

Next, an SoC test system capable of measuring the wideband jitter will be described. The test apparatus system (an automatic test equipment system) shown in FIG. 30 may perform the test of the device under test using the wideband signal analyzing apparatus 200 or other wideband signal analyzing apparatus, wideband skew analyzing apparatus, or wideband period jitter analyzing apparatus.

The device under test is electrically coupled to the test apparatus body via a test head 700 of the test apparatus system, and a test pattern is input by a device interface, pogo pin blocks 720, pin cards, etc. Moreover, the test apparatus system performs frequency-shifting operation on the output signal from the device under test using the frequency mixing means 10 to test the signal being frequency translated to the lower frequency and measures the instantaneous phase noise $\Delta\phi(t)$ by transmitting the frequency-shifted signal along a signal path of the test apparatus system (from the device under test to a instantaneous phase noise analyzer). At this time, the bandpass filtering means 12 may be set up to be near the frequency mixing means 10. A wideband signal analyzing apparatus 200 (not shown) includes frequency mixing means 10, bandpass filtering means 12, an ADC 15 (or a multi-value comparator), a frequency domain sampler 14, spectrum reconstructing means 250, and phase noise estimating means 280, obtaining and outputting the instantaneous phase noise $\Delta\phi(t)$ of the signal x(t) supplied. The test apparatus system judges the quality of the device under test based on the instantaneous phase noise. As above, the wideband signal analyzing apparatus 200 can be effectively used in a test system for testing the device under test such as a semiconductor device, etc.

Figure 31:
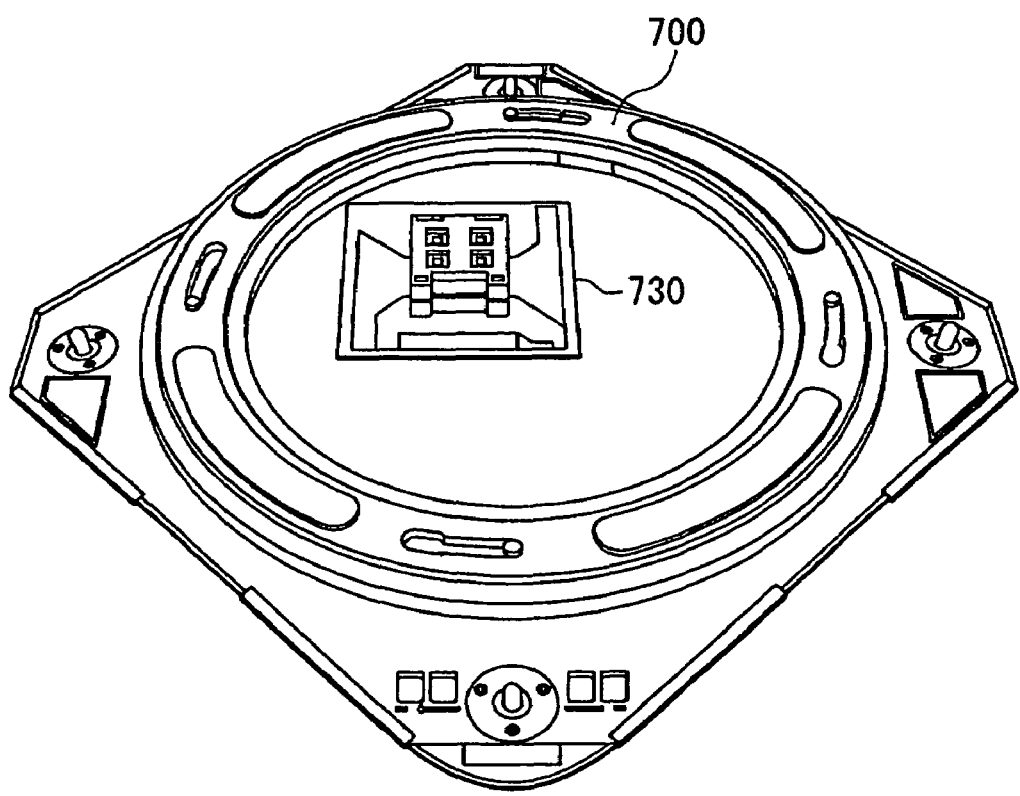
FIG. 31 shows a performance board 730 and a test head 700.

FIG. 31 shows a performance board 730 and a test head 700. The test apparatus system does not necessarily generate a trigger pulse from a signal under test or repeatedly undersample an output signal. That is, the test apparatus system does not suffers from the limitation corresponding to the trigger pulse, where only one sample can be sampled at a time, with accompanied by the time scale error $\Delta\phi_{RMS}$ (TimeScale). Further, since the band bw of the signal path between the device under test and the comparator or the analog-to-digital converter ADC can be a narrowband, the measurement may not be affected by the noise in proportion to the square root $\sqrt{bw_{DUT}}$ of the band-width of the device under test. That is, although the data rate becomes high, the noise of the test system can be ignored.

Next, the compatibility of the rms value of the phase noise will be shown by comparing the wideband jitter measuring method with the spectrum analyzer method. It will be experimentally proved in all of three proposed methods that the peak-to-peak value of the instantaneous phase noise can be measured within the relative maximum error of 4.3%.

Figure 32:
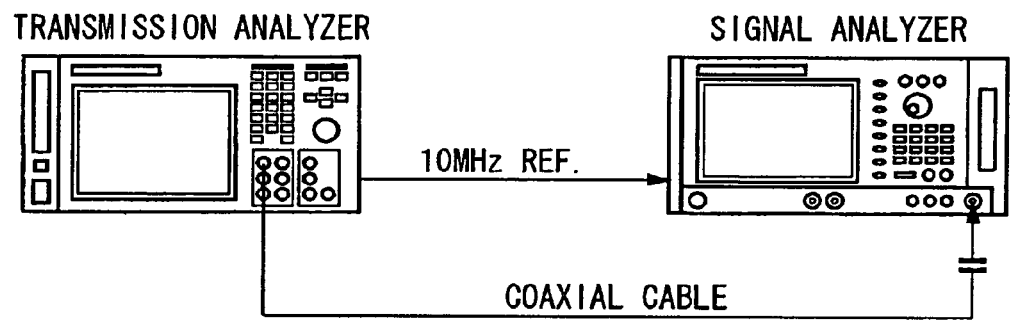
FIG. 32 shows a measuring system.

FIG. 32 shows a measuring system. A clock signal of 2.48832 GHz as a signal under test was generated from a transmission analyzer (ADVANTEST D3371) and input to a signal analyzer (ADVANTEST R3681) through a coaxial cable (JUNKOSHA DGM224).

Figure 33:
FIG. 33 shows a RF spectrum of a clock signal measured using a spectrum analyzer method.

FIG. 33 shows the RF spectrum of the clock signal measured using the spectrum analyzer method (the signal analyzer in the spectrum analyzer mode). The rms value of the phase noise was $$\sigma_{\Delta\phi}=0.01594 [rad]. \tag{46}$$

In the spectrum analyzer method, the peak jitter of the phase noise cannot be measured.

Figure 34:
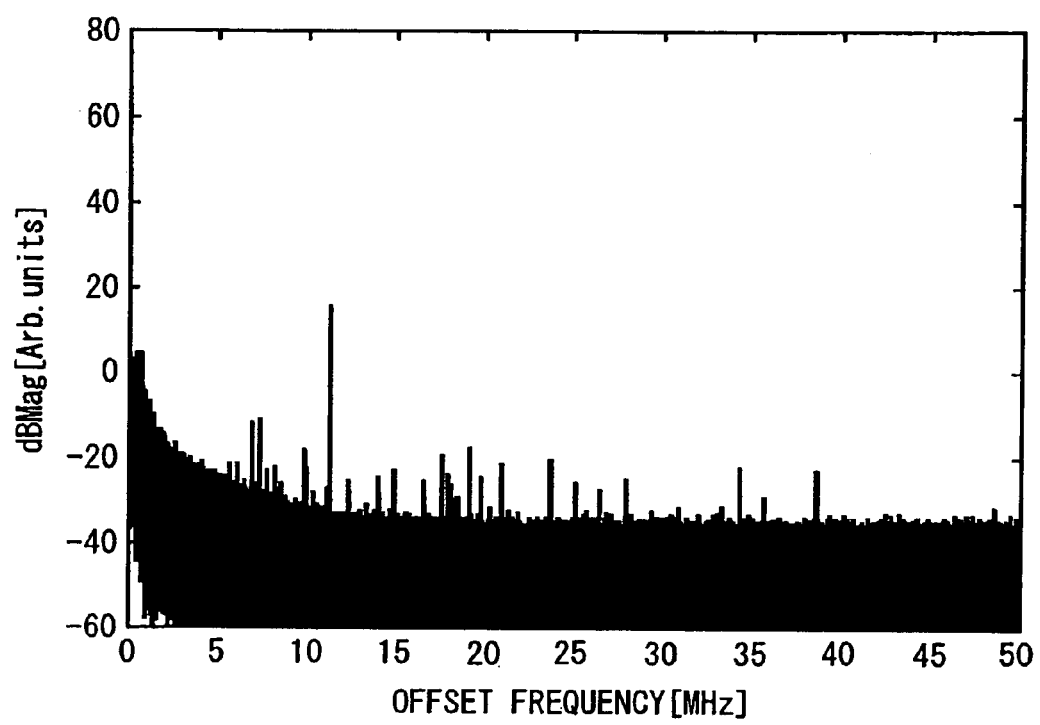
FIG. 34 shows the RF spectrum measured by the signal analyzer combined with a wideband jitter measuring system using a frequency-division demultiplexing sampler 110 described in connection with FIG. 16.

FIG. 34 shows the RF spectrum measured by the signal analyzer combined with the wideband jitter measuring system using the frequency-division demultiplexing sampler 110 described in connection with FIG. 16. The intermediate frequencies and the frequencies of the digital I-/Q-demodulating means were respectively $$f_{IF}=21.4 \text{ [MHz]}, f_{IQ}=21.4 \text{ [MHz]},$$

$$f_{IF}=11.4 \text{ [MHz]}, f_{IQ}=21.4 \text{ [MHz]},$$

$$f_{IF}=01.4 \text{ [MHz]}, f_{IQ}=21.4 \text{ [MHz]},$$

$$f_{IF}=-08.6 \text{[MHz]}, f_{IQ}=21.4 \text{ [MHz]},$$

$$f_{IF}=-18.6 \text{[MHz]}, f_{IQ}=21.4 \text{ [MHz]}, \tag{47}$$

and the offset frequencies of the phase noise spectrum reconstructed was respectively $$f_{Offset}=0-10 \text{ [MHz]},$$

$$f_{Offset}=10-20 \text{ [MHz]},$$

$$f_{Offset}=20-30 \text{ [MHz]},$$

$$f_{Offset}=30-40 \text{ [MHz]},$$

$$f_{Offset}=40-50 \text{ [MHz]}. \tag{48}$$

The rms value of the phase noise was $$\sigma_{\Delta\phi}=0.01639 \text{ [rad]}. \tag{49}$$

The rms value of the phase noise can be obtained by the following equation:

$$\sigma_{\Delta\phi} = \sqrt{\frac{1}{M}\sum_{t=0}^{M-1}\Delta\phi^2(t)},$$

where M is the number of sampling of the AD converter.

Figure 35:
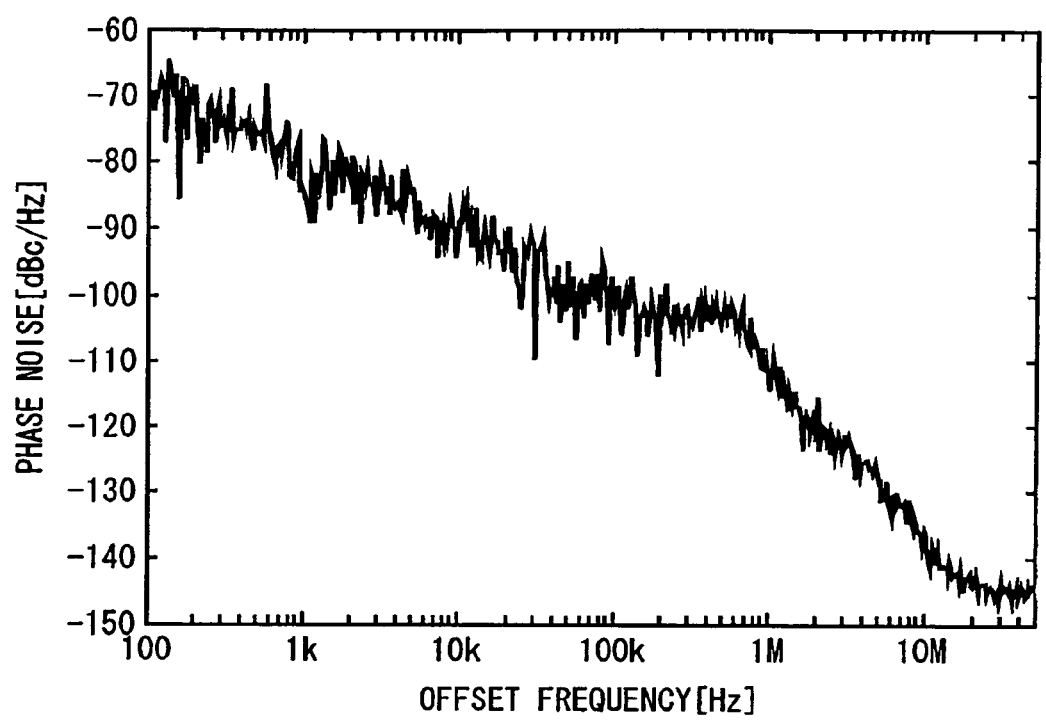
FIG. 35 shows a phase noise spectrum obtained using a spectrum analyzer method.
Figure 36:
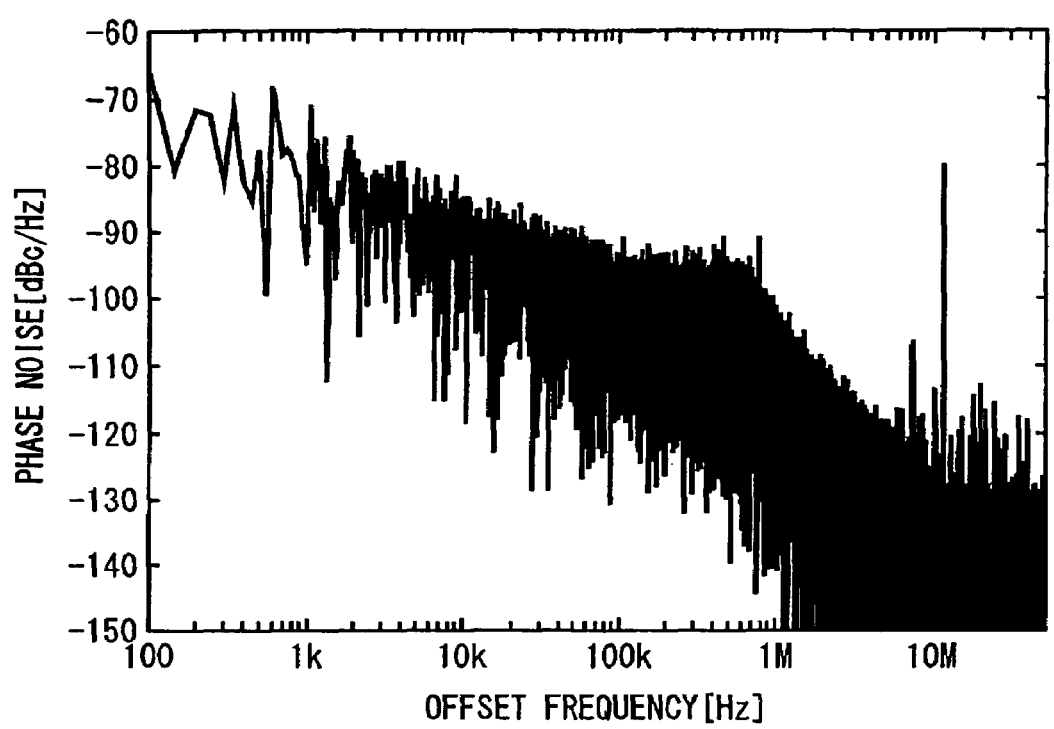
FIG. 36 shows a phase noise spectrum obtained using a frequency-division demultiplexing sampler method.

FIG. 35 shows the phase noise spectrum obtained using the spectrum analyzer method, and FIG. 36 shows the phase noise spectrum obtained using the frequency-division demultiplexing sampler method. In the proposed method, the phase noise spectrum is measured using FFT of 2M points. Accordingly, the phase noise spectrum can be observed with high frequency resolution. Except the frequency resolution, the measurement results of the proposed method and the spectrum analyzer method agree well with each other.

The dynamic range of the conventional narrowband $\Delta\phi$ method is about 40 dB at the most. The dynamic range of the phase noise spectrum plotted in FIGS. 35 and 36 is 70 dB with regard to the proposed method, which is approximately the same as the spectrum analyzer method. Therefore, it is proved that the phase noise with a wide dynamic range can be measured using the proposed method.

Figure 38:
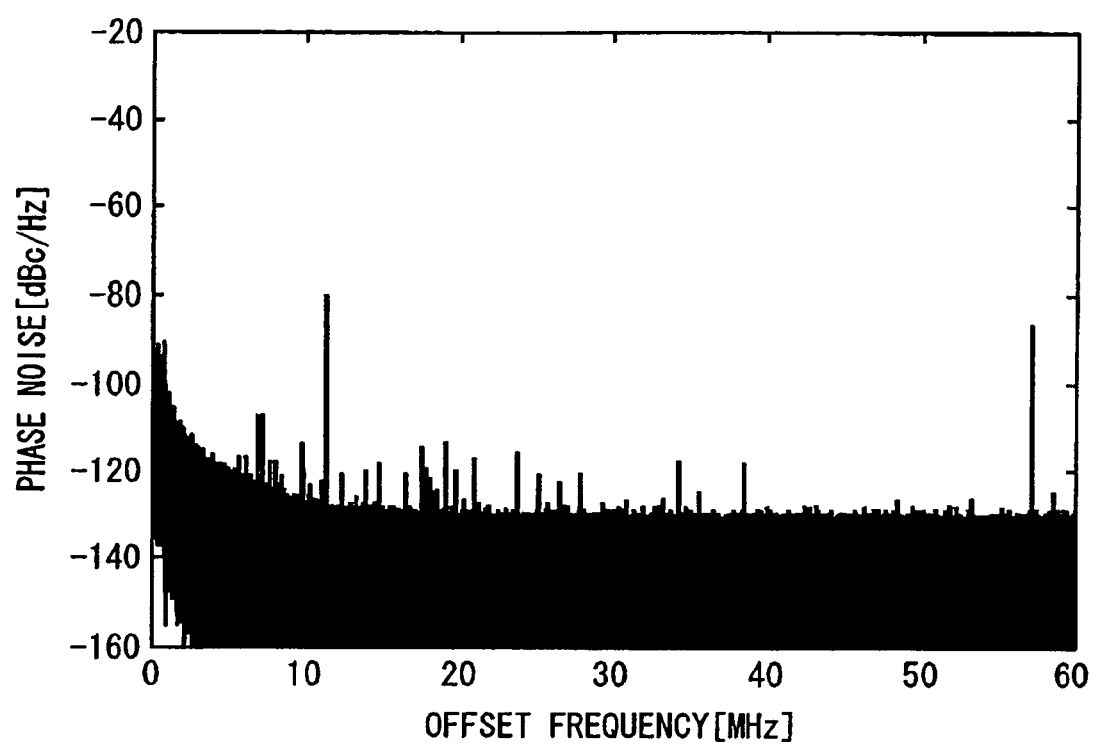
FIG. 38 shows a phase noise spectrum measured by a signal analyzer combined with a wideband jitter measuring system using the frequency-division demultiplexing sampler 310 and the spectrum reconstructing means 350 described in connection with FIG. 19.

FIG. 38 shows the phase noise spectrum measured by the signal analyzer combined with the wideband jitter measuring system using the frequency-division demultiplexing sampler 310 and the spectrum reconstructing means 350 described in connection with FIG. 19. The intermediate frequencies and the frequencies of the digital I-/Q-demodulating means or the offset frequencies of the phase noise spectrum reconstructed are equal to those in the equations (68) and (69) respectively. The rms value of the phase noise was $$\sigma_{\Delta\phi}=0.01624 \text{ [rad]}. \tag{50}$$

Figure 39:
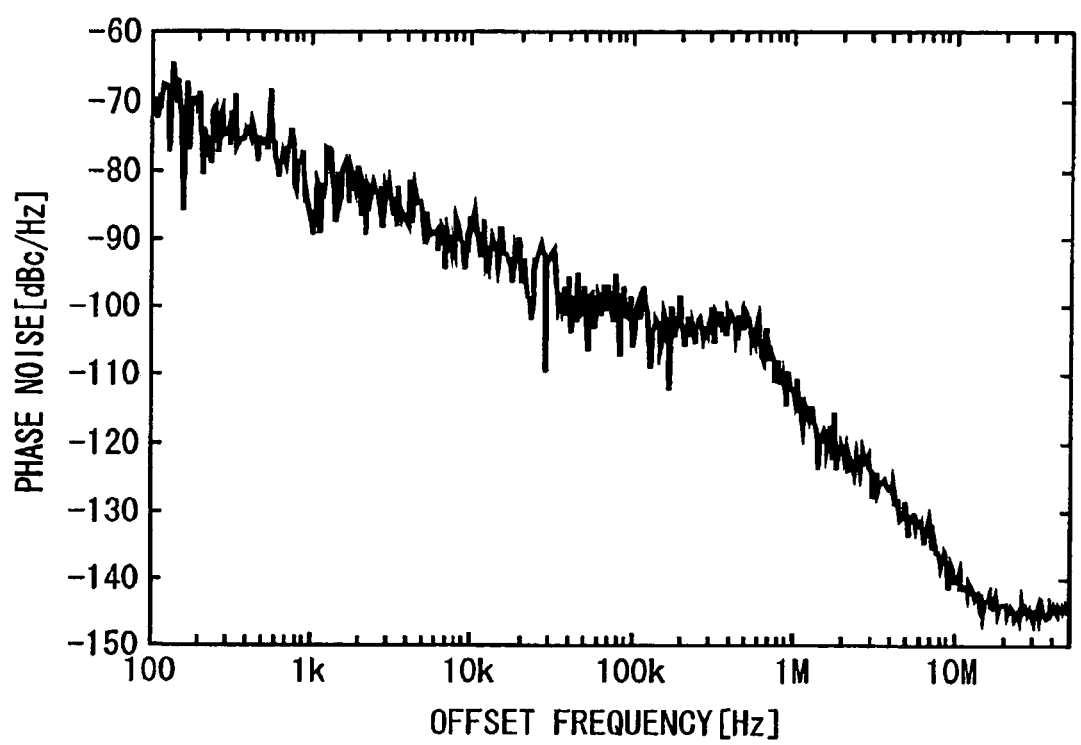
FIG. 39 shows a phase noise spectrum obtained using a spectrum analyzer method.
Figure 40:
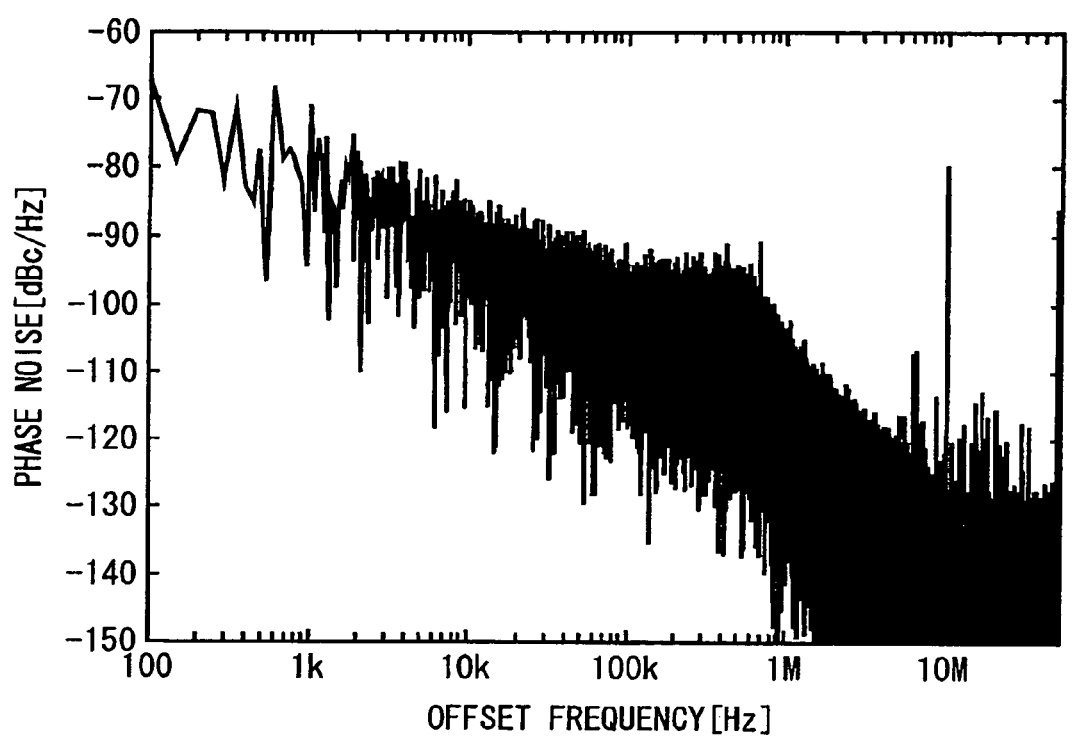
FIG. 40 shows a phase noise spectrum obtained using a frequency-division demultiplexing sampler 310 and a spectrum reconstructing means 350.

FIG. 39 shows the phase noise spectrum obtained using the spectrum analyzer method, and FIG. 40 shows the phase noise spectrum obtained using the frequency-division demultiplexing sampler 310 and the spectrum reconstructing means 350. Except the frequency resolution, the measurement results of the proposed method and the spectrum analyzer method match well with each other.

Figure 42:
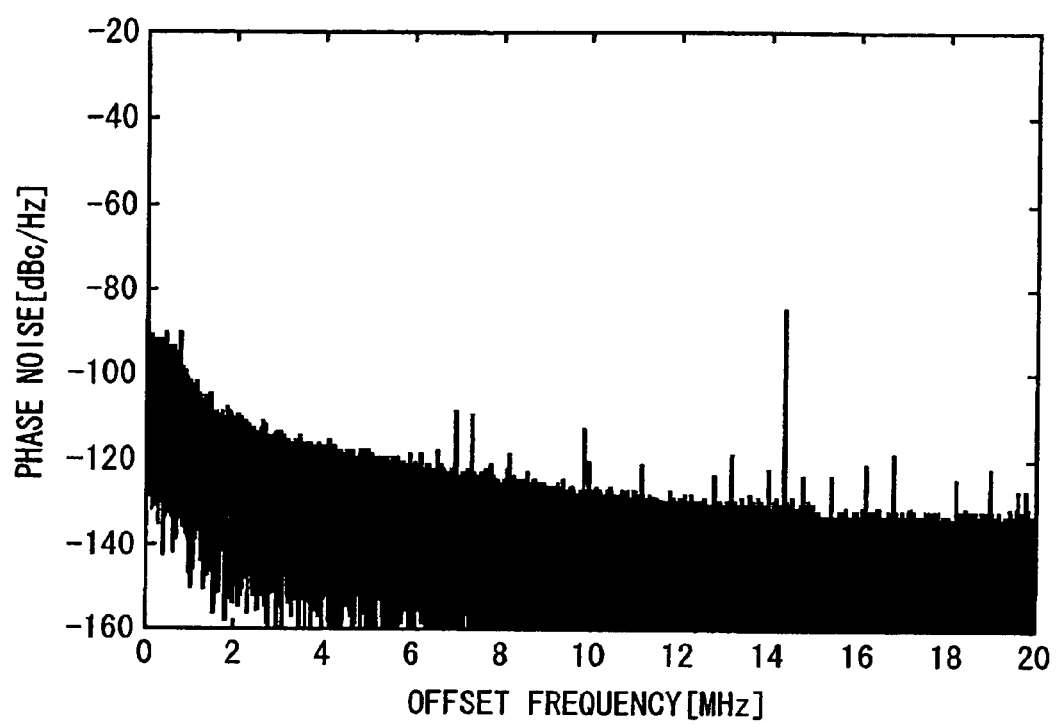
FIG. 42 shows a phase noise spectrum measured by a signal analyzer combined with a wideband jitter measuring system using the frequency-division demultiplexing phase noise sampler 410 described in connection with FIG. 23.

FIG. 42 shows the phase noise spectrum measured by the signal analyzer combined with the wideband jitter measuring system using the frequency-division demultiplexing phase noise sampler 410 described in connection with FIG. 23. The intermediate frequency and the frequencies of the digital I-/Q-demodulating means were respectively $$f_{IF}=21.4 \text{ [MHz]}, f_{IQ}=21.4 \text{ [MHz]},$$

$$f_{IF}=01.4 \text{ [MHz]}, f_{IQ}=21.4 \text{ [MHz]}, \tag{51}$$

and the offset frequencies of the phase noise spectrum reconstructed was respectively $$f_{Offset}=0\text{-}15 \text{ [MHz]},$$

$$f_{Offset}=15\text{-}20 \text{ [MHz]}. \tag{52}$$

The rms value of the phase noise was $$\sigma_{\Delta\phi}=0.01612 \text{ [rad]}. \tag{53}$$

Figure 43:
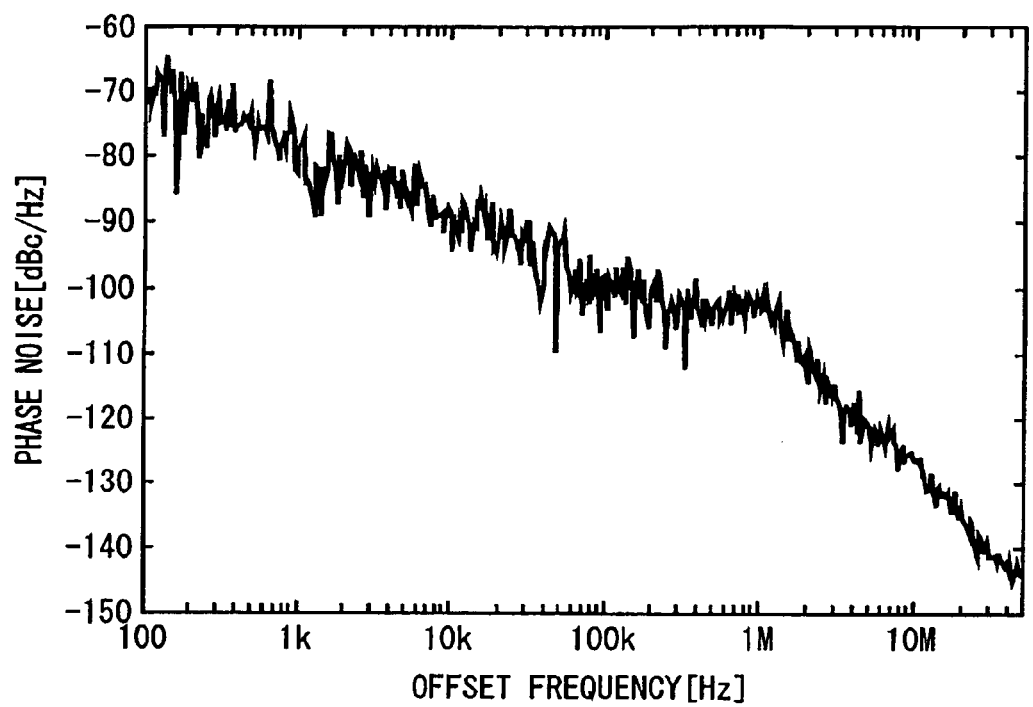
FIG. 43 shows a phase noise spectrum obtained using a spectrum analyzer method.
Figure 44:
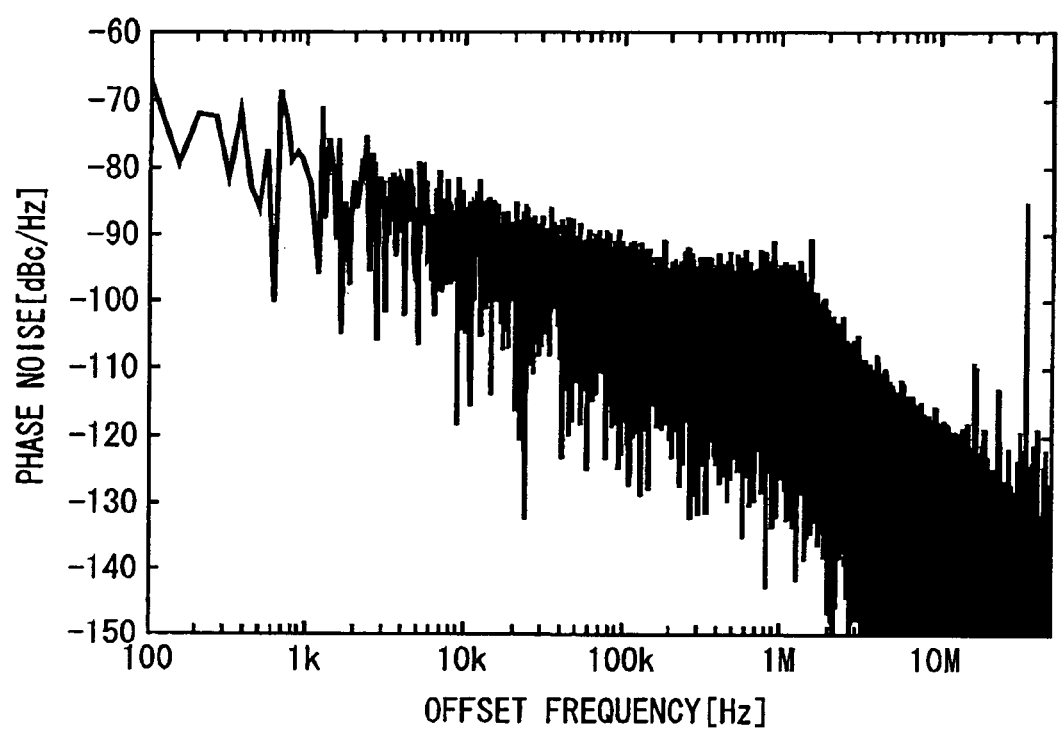
FIG. 44 shows a phase noise spectrum obtained using a frequency-division demultiplexing phase noise sampler method.

FIG. 43 shows the phase noise spectrum obtained using the spectrum analyzer method, and FIG. 44 shows the phase noise spectrum obtained using the frequency-division demultiplexing phase noise sampler method. Except the frequency resolution, the measurement results of the proposed method and the spectrum analyzer method agree well with each other.

In summary, it is experimentally proved in all of the proposed methods that the rms value of the phase noise can be measured within the maximum error of 2.8% to the spectrum analyzer method. Moreover, it is also proved that the phase noise with a wide dynamic range can be measured using the proposed method.

Moreover, the instantaneous phase noise series or the peak-to-peak value can be measured using the proposed wideband jitter measuring method in contrast to the spectrum analyzer method.

Figure 37:
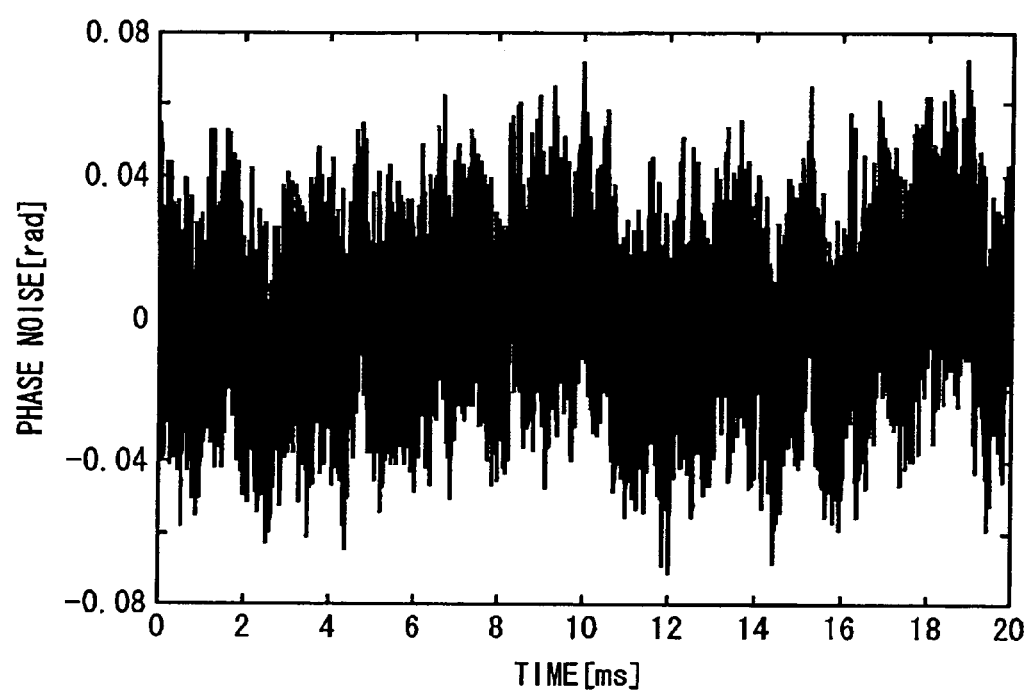
FIG. 37 shows an instantaneous phase noise measured by a signal analyzer combined with a wideband jitter measuring system using the frequency-division demultiplexing sampler 110 described in connection with FIG. 16.

FIG. 37 shows the instantaneous phase noise measured by the signal analyzer combined with the wideband jitter measuring system using the frequency-division demultiplexing sampler 110 described in connection with FIG. 16. The peak-to-peak value of the instantaneous phase noise was $$d(\{\Delta\phi\})=0.01440 \text{ [rad]}. \tag{54}$$

The peak-to-peak value of the instantaneous phase noise can be obtained by the following equation:

$$d(\{\Delta\phi\})=\max\{\Delta\phi(t)\}-\min\{\Delta\phi(t)\}.$$

Figure 41:
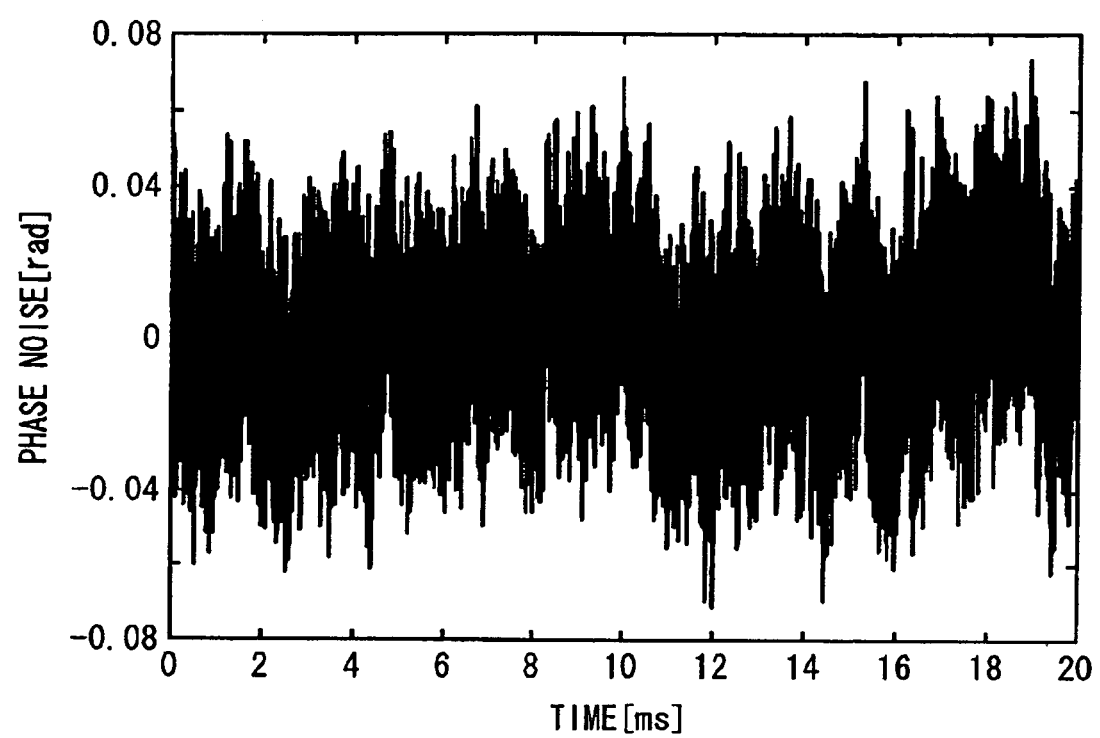
FIG. 41 shows an instantaneous phase noise measured by a signal analyzer combined with a wideband jitter measuring system using the frequency-division demultiplexing sampler 310 and the spectrum reconstructing means 350 described in connection with FIG. 19.

FIG. 41 shows the instantaneous phase noise measured by the signal analyzer combined with the wideband jitter measuring system using the frequency-division demultiplexing sampler 310 and the spectrum reconstructing means 350 described in connection with FIG. 19. The peak-to-peak value of the instantaneous phase noise was $$d(\{\Delta\phi\})=0.01445 \text{ [rad]}. \tag{55}$$

Figure 45:
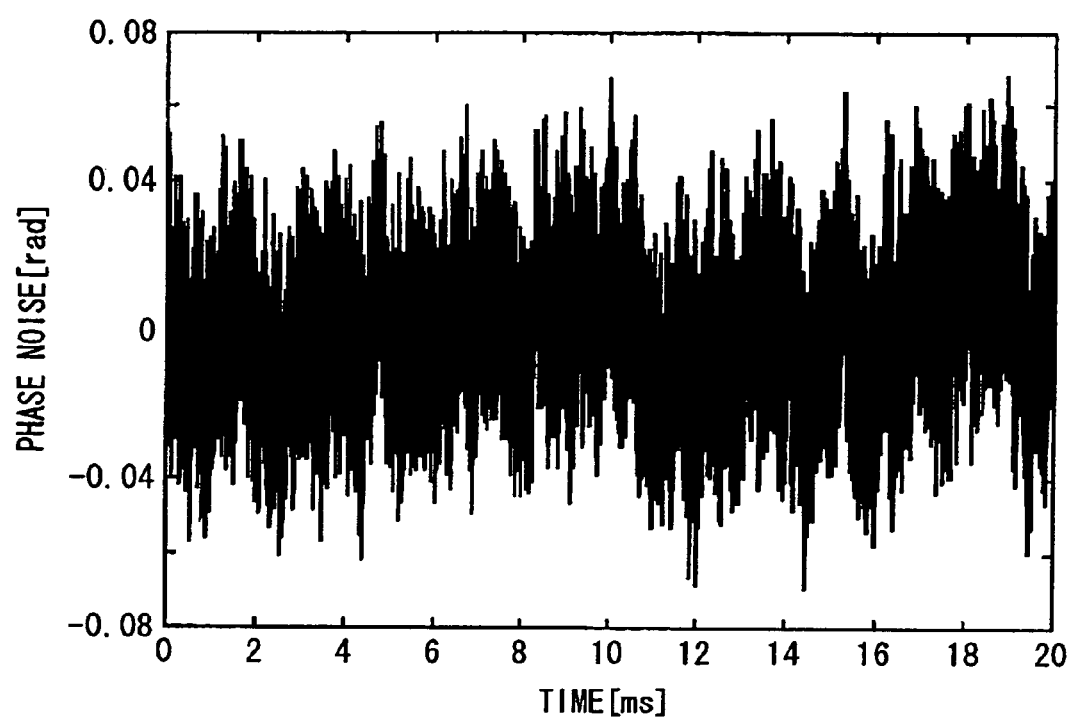
FIG. 45 shows an instantaneous phase noise measured by a signal analyzer combined with a wideband jitter measuring system using the frequency-division demultiplexing phase noise sampler 410 described in connection with FIG. 23.

FIG. 45 shows the instantaneous phase noise measured by the signal analyzer combined with the wideband jitter measuring system using the frequency-division demultiplexing phase noise sampler 410 described in connection with FIG. 23. The peak-to-peak value of the instantaneous phase noise was $$d(\{\Delta\phi\})=0.01383 \text{ [rad]}. \tag{56}$$

In summary, it is experimentally proved in all of the proposed methods that the peak-to-peak value of the instantaneous phase noise can be measured within the relative maximum error of 4.3%.

As above, the frequency domain sampling methods, which can be used in the wideband jitter measurement, according to exemplary embodiments of this invention have been proposed. Moreover, the jitter was redefined in the time and frequency domains and the bandpass sampling conditions for the jitter measurement have been proposed. The comparison of the wideband jitter measuring method with the conventional methods is shown in the tables 1 to 3.

Moreover, if each of the analyzing apparatuses described above is used in the spectrum analyzer, since frequency sweep operation of the filter is not required, the spectrum of the phase noise over a wideband can be measured at a high speed. Moreover, since the spectrum of the phase noise can be measured with high frequency resolution, the phase noise and the spurious spectrum (the line spectrum shown in FIG. 35) can be observed at the same time. In addition, the gain (the amplitude ratio) and the phase difference of the jitter transfer function can be measured. The gain and the phase difference can be measured at the same time.

Moreover, if each of the analyzing apparatuses described above is used in the oscilloscope, in contrast to the conventional real time oscilloscope, the measurement band is not limited due to the conversion speed of the analog-to-digital converter. Moreover, the jitter in the periodically stationary process of a wideband can also be measured accurately. Moreover, unlike the oscilloscope of the conventional equivalent sampling type, it is unnecessary to perform sampling one by one corresponding to the trigger signal, so the measurement time can be shortened. Moreover, even when the waveform of high frequency is observed, the bandwidth of the input system does not need to be widened. Accordingly, it is possible to minimize the effect of noise and accurately measure the small jitter. Moreover, the frequency domain measurement such as the phase noise spectrum is also possible.

Figure 46:
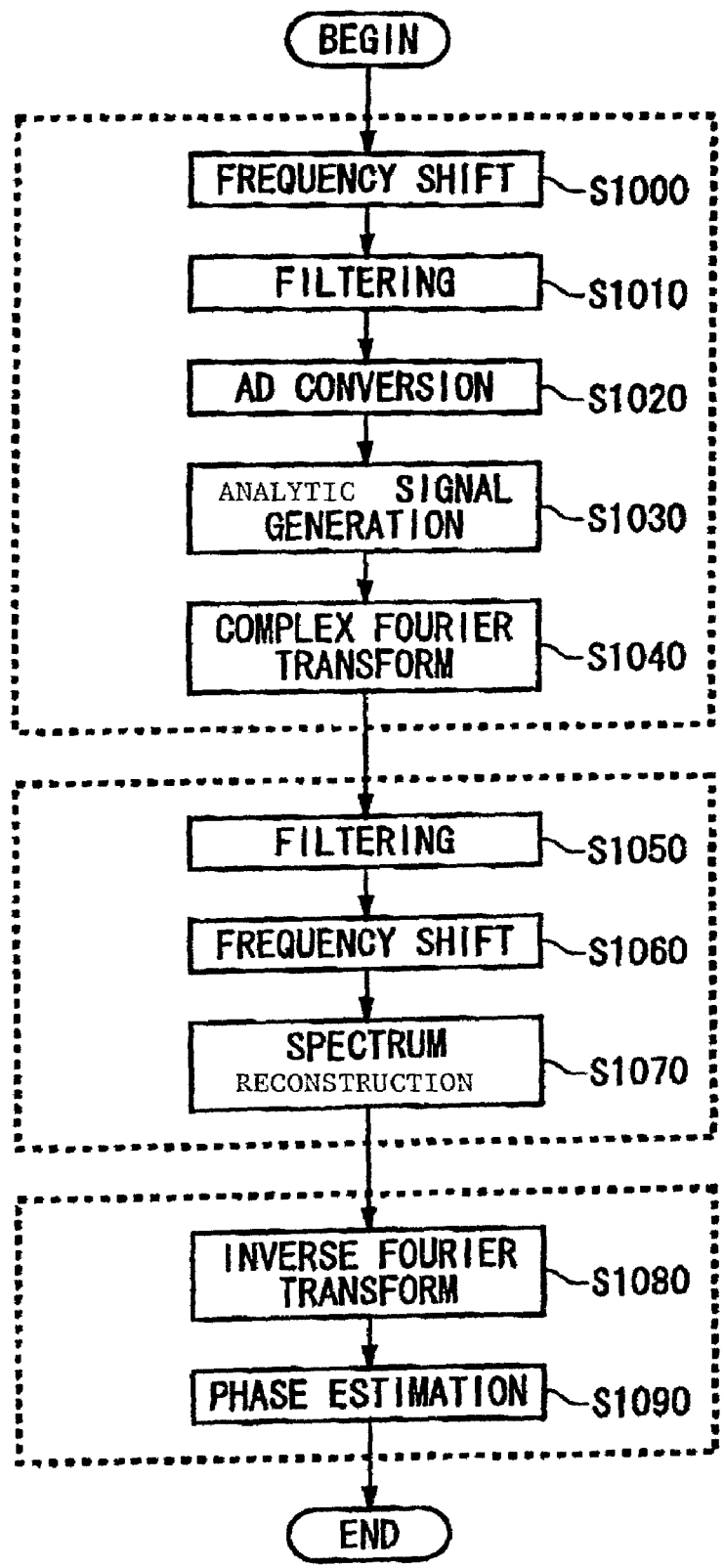
FIG. 46 a flowchart depicting an example of the operation of the wideband signal analyzing apparatus 200 described in connection with FIG. 17.

FIG. 46 a flowchart depicting an example of the operation of the wideband signal analyzing apparatus 200 described in connection with FIG. 17. Moreover, S1000 to S1070 in this embodiment shows an example of the operation of the wideband signal analyzing apparatus 100 described in connection with FIG. 16. First, in S1000, a plurality of intermediate frequency signals, which are the results of the frequency shifting of the input signal using the frequency-shifting means 11, are generated.

Then in S1010, the band of each of the intermediate frequency signals is limited using the bandpass filtering means 12. Then in S1020, digitizing is performed on each of the intermediate frequency signals using the frequency domain sampler 14. It is preferable that the frequency domain sampler 14 should include the analog-to-digital converting means for digitizing the signal output by the bandpass filtering means 12 and providing the discrete signal to other elements of the frequency domain sampler 14 functioning as the spectrum measuring means.

Then in S1030, each of the intermediate frequency signals is transformed into the analytic signal using the frequency domain sampler 14, and the complex spectrum of each of the analytic signals is generated in S1040.

Then in S1050, the band, in which each of the complex spectra to be merged by the spectrum reconstructing means 250, is obtained. Then, the frequency of component each of the complex spectra is returned to the original frequency in S1060, and then the complex spectra are merged in S1070.

Then in S1080, the analytic signal of the input signal is generated by performing inverse Fourier transform on the complex spectra reconstructed using the instantaneous phase noise estimating means 280, and the instantaneous phase noise of the input signal is estimated based on the analytic signal in S1090. By this operation, the instantaneous phase noise of the wideband input signal can be easily estimated.

Figure 47:
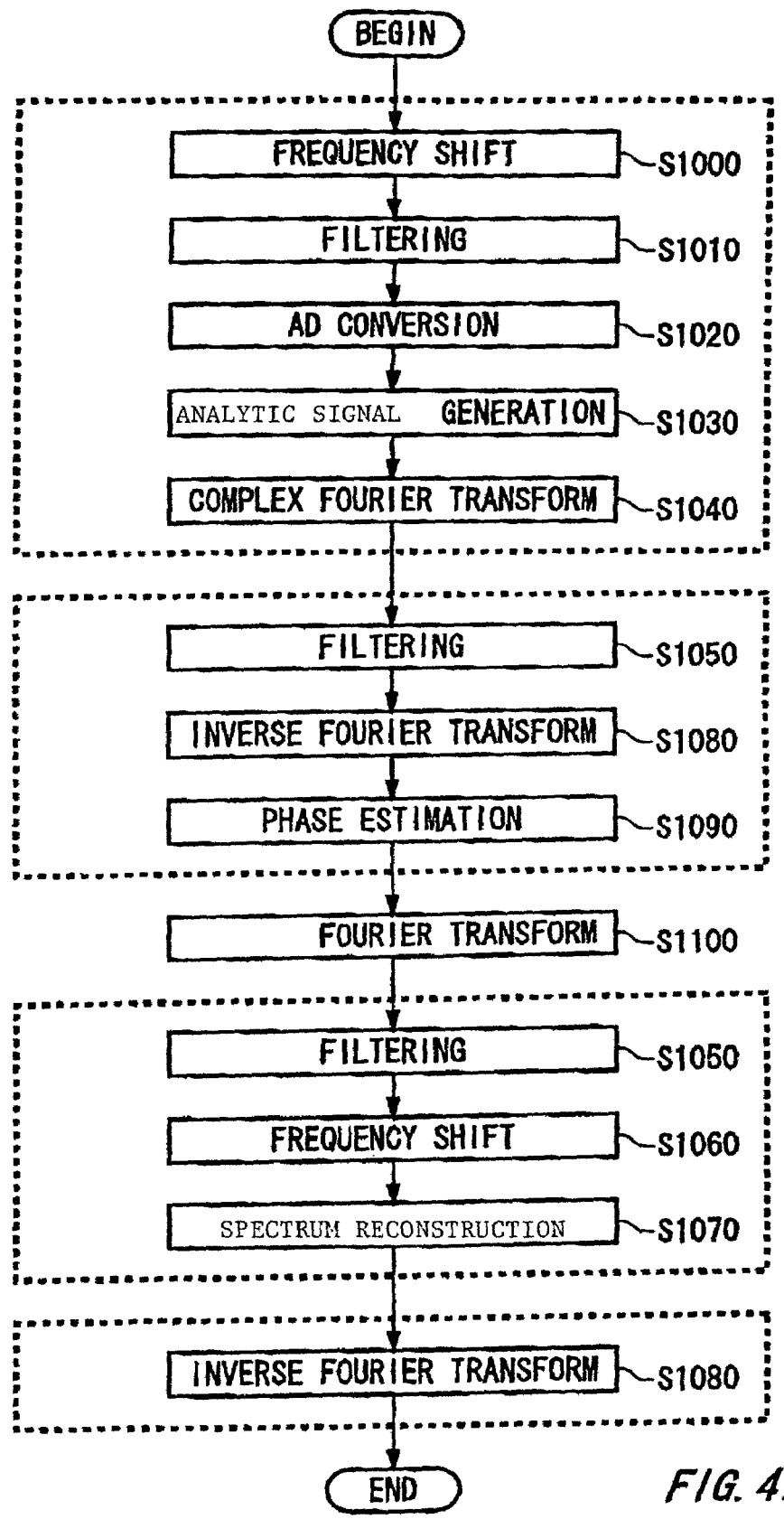
FIG. 47 a flowchart depicting an example of the operation of the wideband signal analyzing apparatus 300 described in connection with FIG. 19.

FIG. 47 shows a flowchart depicting an example of the wideband signal analyzing apparatus 300 described in connection with FIG. 19. The operations from S1000 to S1040 are the same as those from S1000 to S1040 described in connection with FIG. 46, so they will not be described.

In S1050, the band of each of the complex spectra is limited using the bandpass filtering means 382. Then in S1080, inverse Fourier transform is performed on each of the complex spectra using the phase noise estimating means 380, and the analytic signal of each of the intermediate frequency signals is generated. Then in S1090, the instantaneous phase noise of each of the analytic signals is estimated using the phase noise estimating means 380.

Then in S1100, Fourier transform is performed on each of the instantaneous phase noises, and the phase noise spectrum of each of the intermediate frequency signals is estimated. Then in the same way as S1050 to S1070 described in connection with FIG. 46, the phase noise spectrum of the input signal is calculated using the spectrum reconstructing means 350. Then in S1080, the instantaneous phase noise of the input signal may be calculated by performing inverse Fourier transform on the phase noise spectrum of the input signal. By this operation, the phase noise spectrum and the instantaneous phase noise of the wideband input signal can be easily measured.

Figure 48:
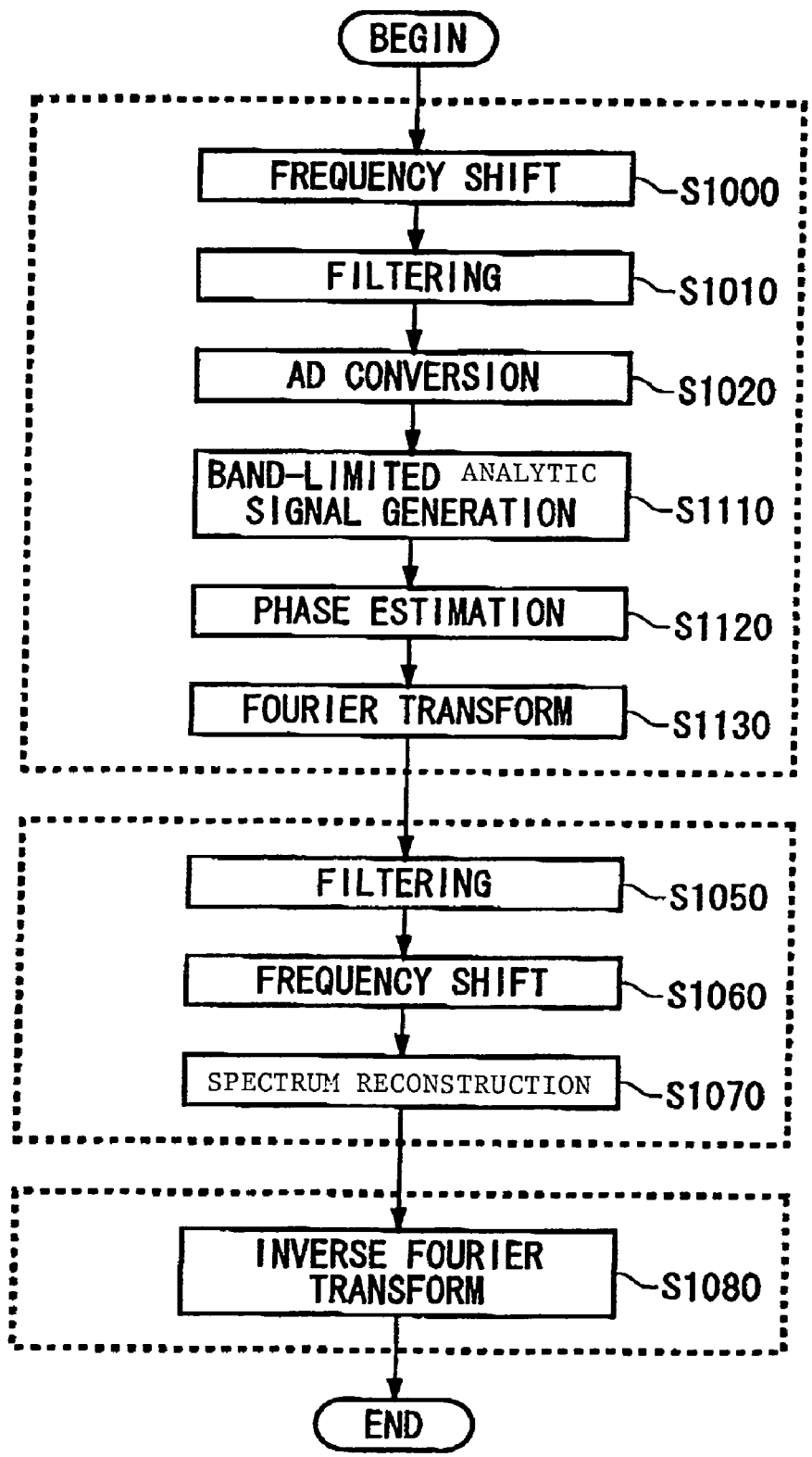
FIG. 48 a flowchart depicting an example of the operation of the wideband signal analyzing apparatus 600 described in connection with FIG. 24.
Figure 3:
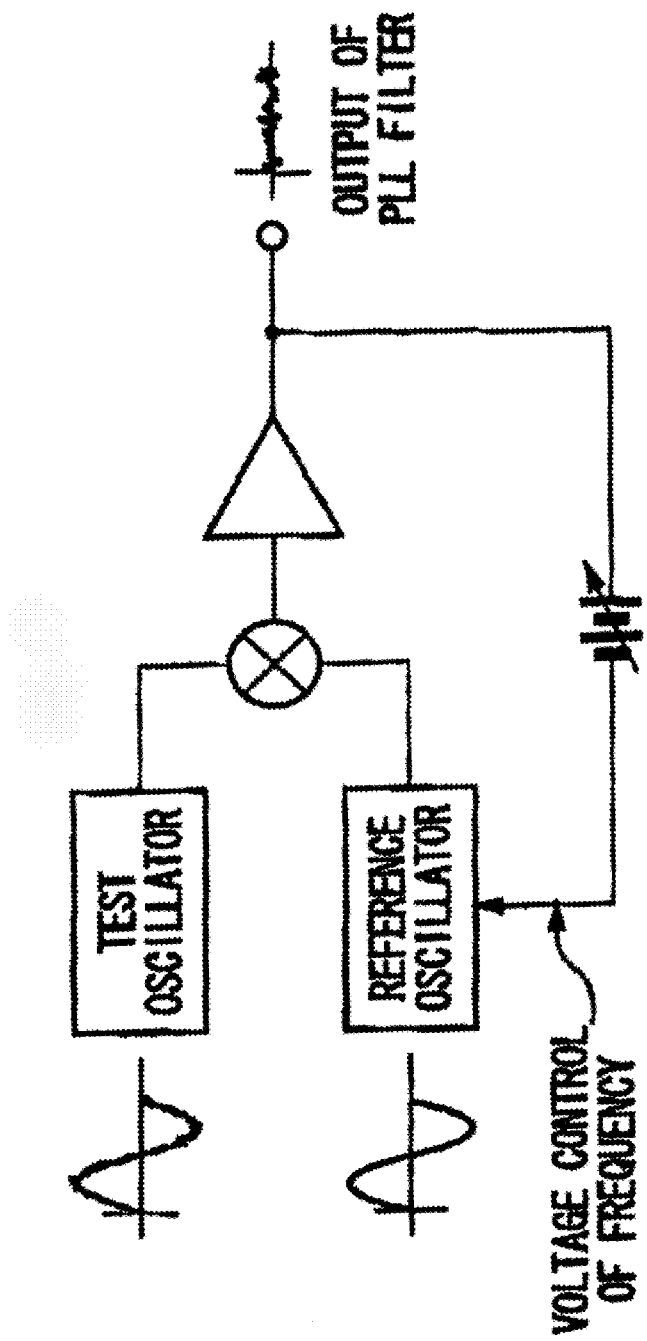
Figure 5:
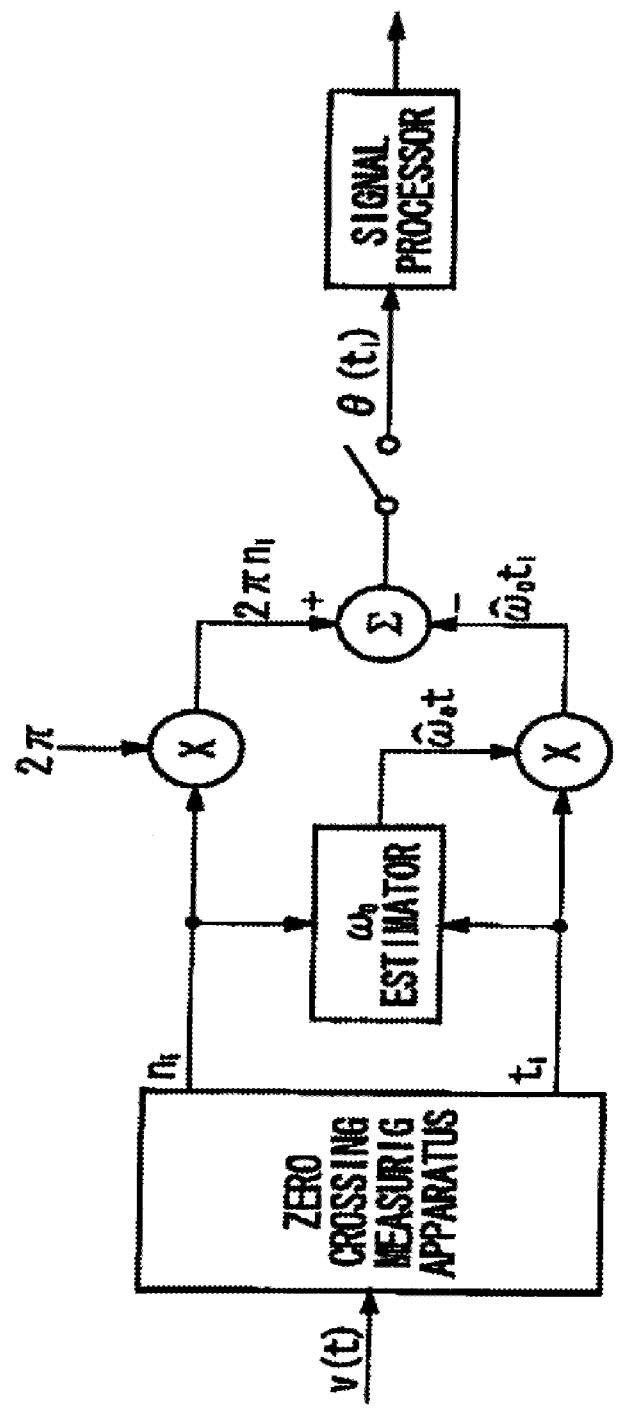
Figure 8:
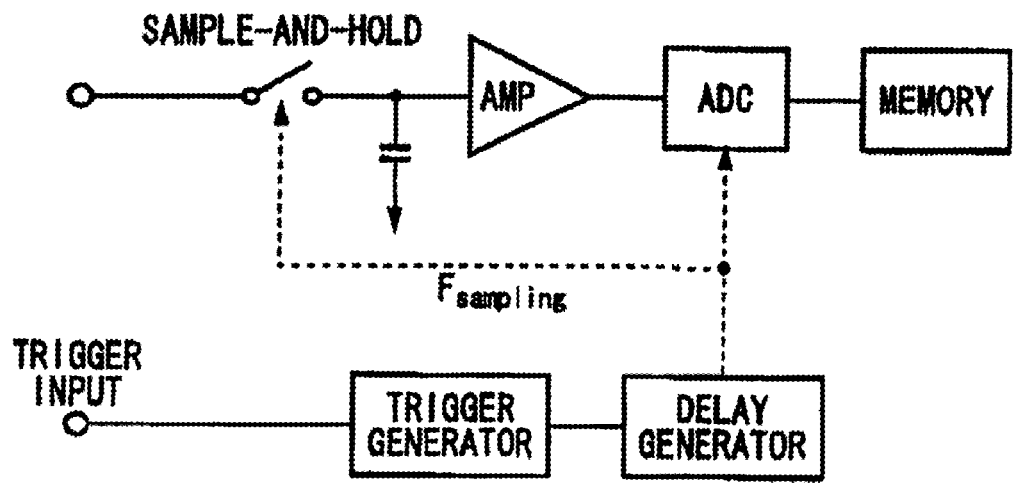
Figure 10:
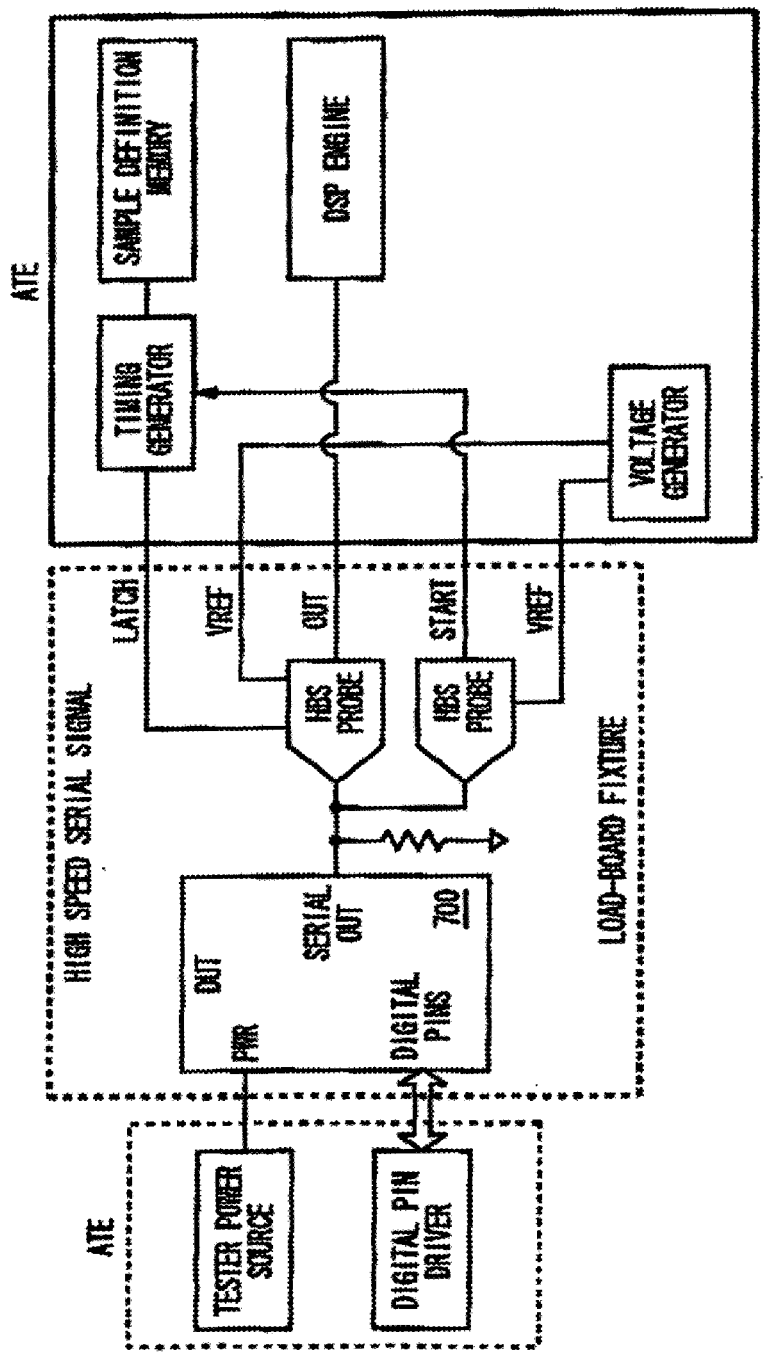
Figure 12:
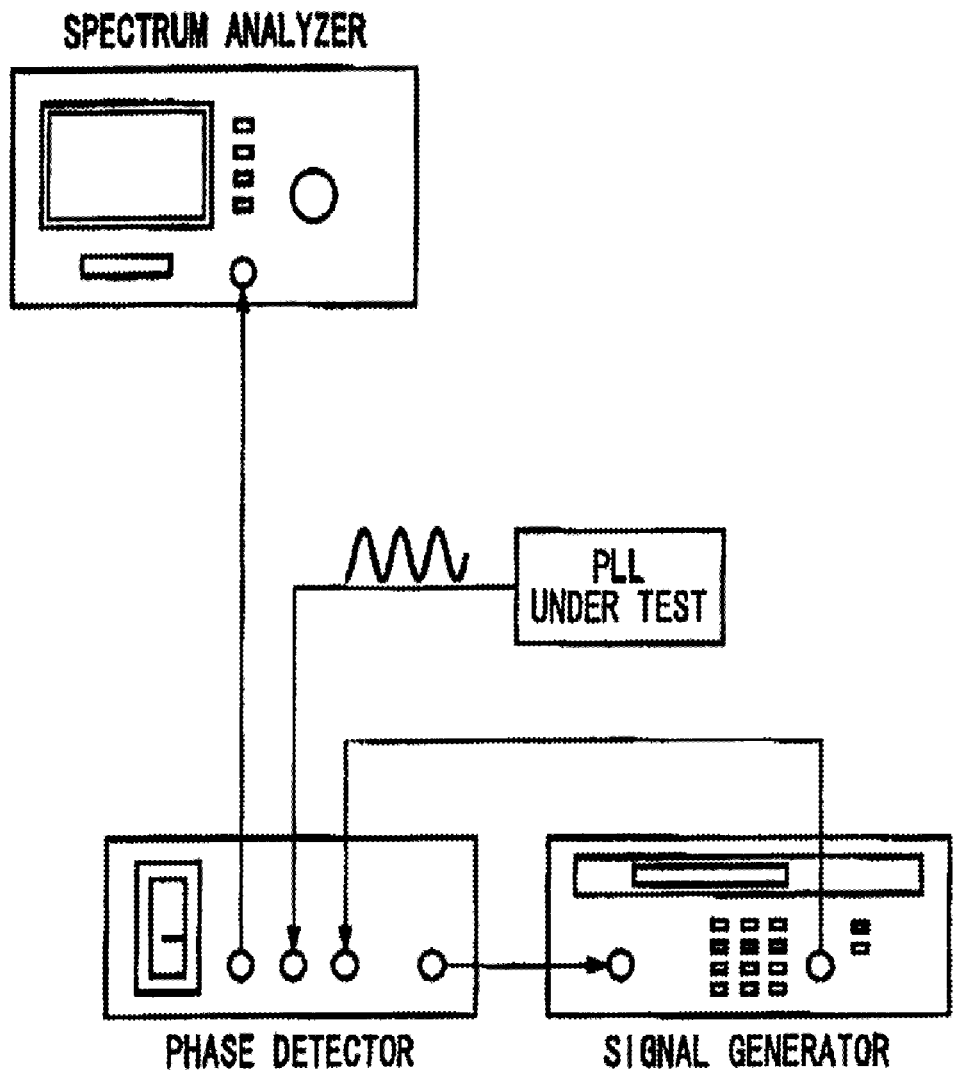
Figure 14:
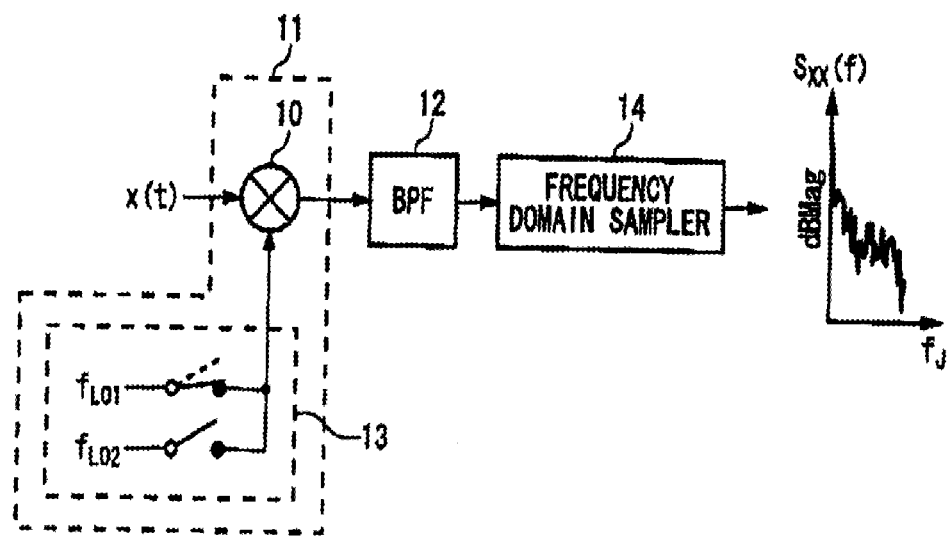
Figure 22:
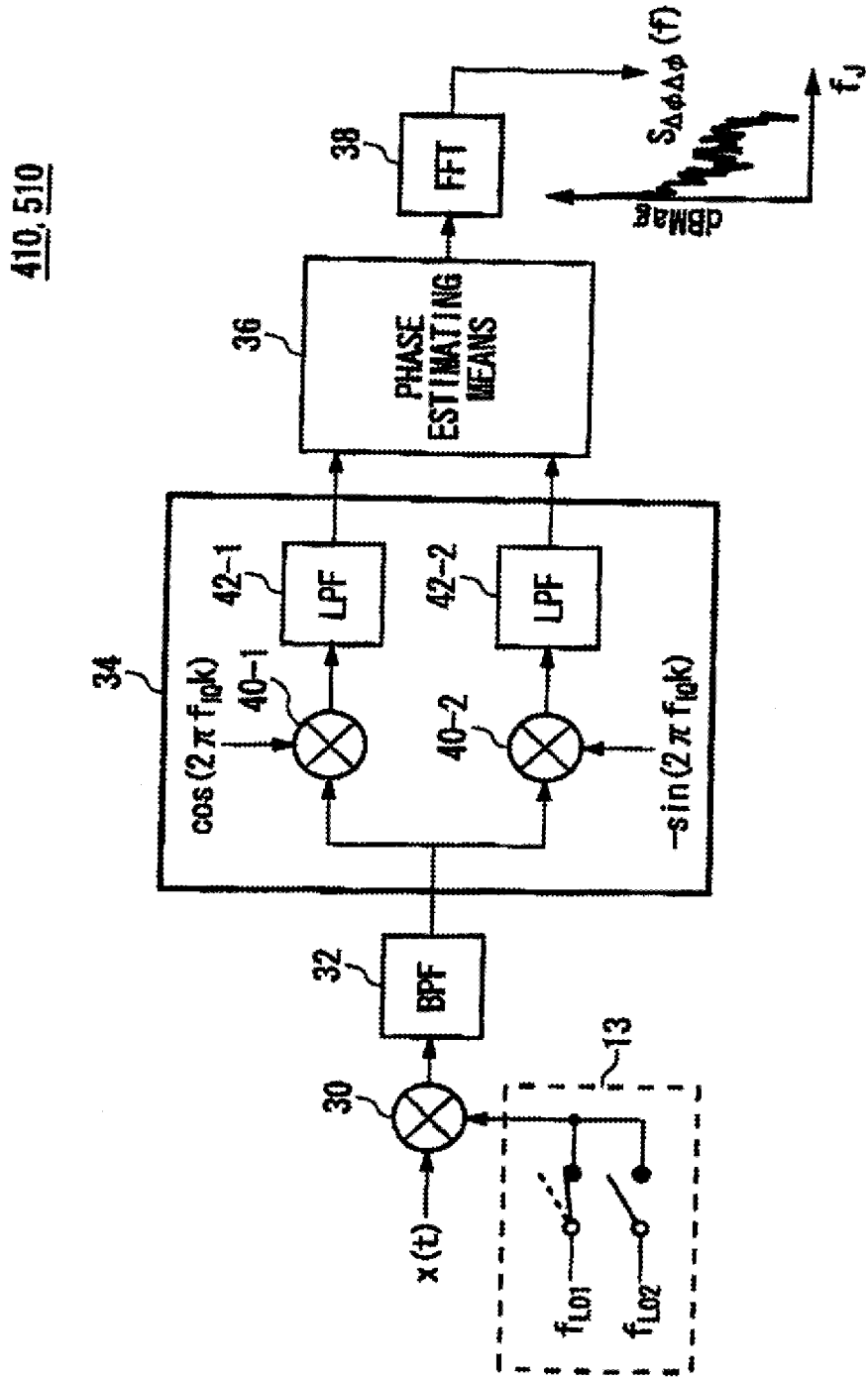
Figure 28:
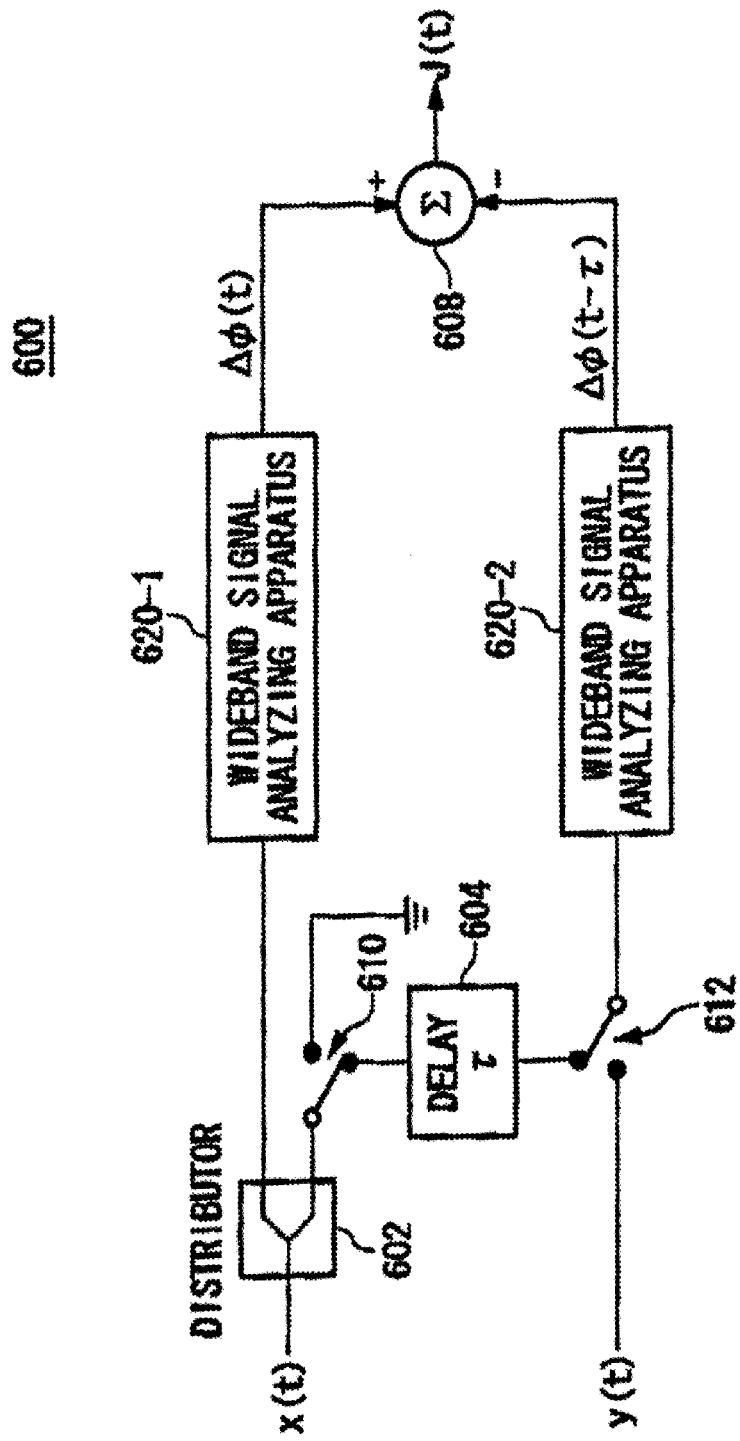
Figure 29:
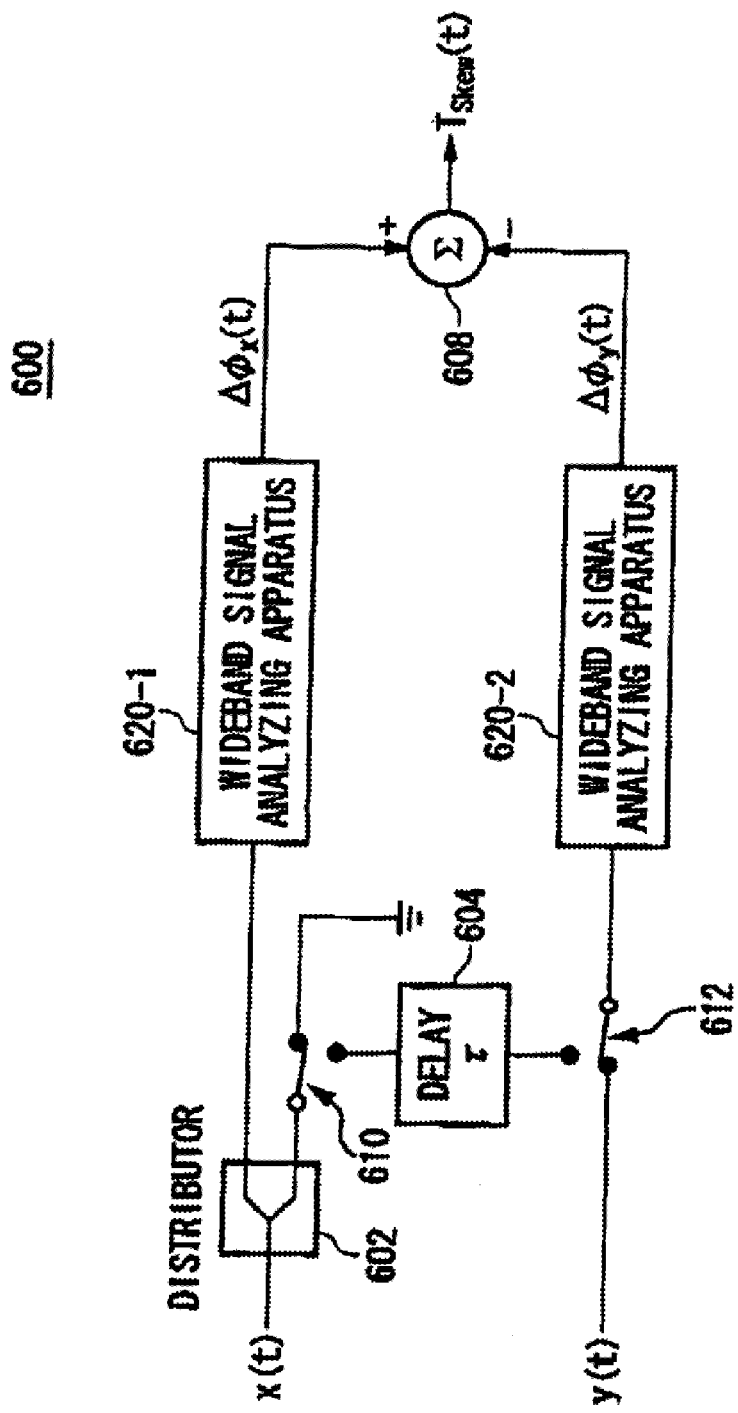

FIG. 48 shows a flowchart depicting an example of the wideband signal analyzing apparatus 600 described in connection with FIG. 24. The operations from S1000 to S1020 are the same as those from S1000 to S1020 described in connection with FIG. 46, so they will not be described.

In S1110, the analytic signal of each of the intermediate frequency signals is generated using the analytic signal transforming means 34. Then in S1120, the instantaneous phase noise of the intermediate frequency signal is estimated from the analytic signal using the phase estimating means 36. Then in S1130, the phase noise spectrum of each of the intermediate frequency signals is calculated using the Fourier transforming means 38.

Then, the operations from S1050 to S1080 are the same as those from S1050 to S1080 described in connection with FIG. 47, so they will not be described.

By this operation as well, the phase noise spectrum and the instantaneous phase noise of the wideband input signal can be easily measured.

As above, the measurement methods proposed in the exemplary embodiments of this invention are the only methods by which the wideband jitter or the wideband phase noise can be measured in the same way as the oscilloscope of the equivalent sampling type, and besides the phase noise can be measured with a wide dynamic range equal to that of the spectrum analyzer. This frequency domain sampling method is frequency-scalable and considerably simple and can be widely applied even to a measuring device or a tester.

As obvious from the description above, according to the present invention, it is possible to analyze the spectrum, the instantaneous phase noise, the phase noise spectrum, the period jitter, the skew, etc. of a wideband signal at a high speed with high precision.

Although the present invention has been described by way of exemplary embodiments, it should be understood that those skilled in the art might make many changes and substitutions without departing from the spirit and the scope of the present invention which is defined only by the appended claims.

Further, it is obvious that the means included in the wideband signal analyzing apparatus, the wideband period jitter analyzing apparatus, and the wideband skew analyzing apparatus described above may be realized in the form of hardware, software, or any combination thereof.

What is claimed is:

1. A wideband signal analyzing apparatus for analyzing an input signal including a plurality of frequency bands, comprising:
   frequency-shifting means configured to:
      separately shift a frequency component of each of said frequency bands of said input signal to a predetermined intermediate band, and
      generate each shifted frequency component as a respective intermediate frequency signal;
   spectrum measuring means for separately outputting a complex spectrum of each of said intermediate frequency signals; and
   spectrum reconstructing means for reconstructing said complex spectra.

2. A wideband signal analyzing apparatus as claimed in claim 1, further comprising instantaneous phase noise estimating means for estimating an instantaneous phase noise of said input signal based on said complex spectra reconstructed by said spectrum reconstructing means.

3. A wideband signal analyzing apparatus as claimed in claim 2, wherein said instantaneous phase noise estimating means comprises:
   inverse Fourier transforming means for transforming said complex spectrum reconstructed by said spectrum reconstructing means into a signal in a time domain and generating an analysis signal of said input signal; and
   phase estimating means for calculating a phase angle of said analytic signal.

4. A wideband skew analyzing apparatus for measuring skew of a plurality of input signals, comprising:
   two of said wideband signal analyzing apparatuses as claimed in claim 2, wherein said two of wideband signal analyzing apparatuses comprise:
      a first wideband signal analyzing apparatus for outputting an instantaneous phase noise of a first input signal; and
      a second wideband signal analyzing apparatus for outputting an instantaneous phase noise of a second input signal; and
   skew calculating means for calculating skew of said first and second input signals, based on a differential between said instantaneous phase noises output by said first and second wideband signal analyzing apparatuses.

5. A wideband period jitter analyzing apparatus for measuring period jitter of an input signal, comprising:
- delaying means for delaying said input signal based on a period of said input signal;
- two of said wideband signal analyzing apparatuses as claimed in claim 2, wherein said two of wideband signal analyzing apparatuses comprise:
  - a first wideband signal analyzing apparatus for outputting an instantaneous phase noise of said input signal; and
  - a second wideband signal analyzing apparatus for outputting an instantaneous phase noise of said input signal delayed by said delaying means; and
- period jitter calculating means for calculating period jitter of said input signal, based on a differential between said instantaneous phase noises output by said first and second wideband signal analyzing apparatuses.

6. A wideband signal analyzing apparatus as claimed in claim 1, further comprising:
- instantaneous phase noise estimating means for estimating an instantaneous phase noise of each of said intermediate frequency signals based on each of said complex spectra output by said spectrum measuring means; and
- Fourier transforming means for transforming said instantaneous phase noise of each of said intermediate frequency signals into a signal in a frequency domain and inputting said signal transformed to said spectrum reconstructing means as said complex spectrum,
- wherein said spectrum reconstructing means connects said complex spectra inputs and generates a phase noise spectrum of said input signal.

7. A wideband signal analyzing apparatus as claimed in claim 6, wherein said spectrum measuring means outputs a one-sided spectrum of said intermediate frequency signal as said complex spectrum, and said instantaneous phase noise estimating means comprises:
- band limiting means for limiting a band of each of said one-sided spectra output by said spectrum measuring means;
- inverse Fourier transforming means for transforming said one-sided spectrum, of which band has been limited by said band limiting means, into a signal in a time domain and generating an analytic signal of each of said intermediate frequency signals; and
- phase estimating means for calculating a phase angle of each of said analytic signals.

8. A wideband signal analyzing apparatus as claimed in claim 6, further comprising inverse Fourier transforming means for transforming said phase noise spectrum of said input signal generated by said spectrum reconstructing means into a signal in a time domain and calculating an instantaneous phase noise of said input signal.

9. A wideband signal analyzing apparatus as claimed in claim 1, wherein said spectrum measuring means outputs a one-sided spectrum of said intermediate frequency signal as said complex spectrum.

10. A wideband signal analyzing apparatus as claimed in claim 9, wherein said spectrum measuring means comprises:
- single sideband signal transforming means for transforming said intermediate frequency signal into a single sideband signal; and
- Fourier transforming means for transforming said single sideband signal into a signal in a frequency domain.

11. A wideband signal analyzing apparatus as claimed in claim 1, wherein said frequency-shifting means comprises:
- frequency generating means for generating a periodic signal of a frequency according to each of said frequency amounts; and
- frequency mixing means for mixing said input signal and said periodic signal.

12. A wideband signal analyzing apparatus as claimed in claim 11, wherein said frequency generating means sequentially generates periodic signals of different frequencies according to said different frequency-shifting amounts, and said frequency mixing means sequentially mixes each of said periodic signals and said input signal.

13. A wideband signal analyzing apparatus as claimed in claim 11, wherein said spectrum reconstructing means controls said frequency of said periodic signal generated by said frequency generating means and shifts said complex spectrum of each of said intermediate frequency signals according to each of said frequency of said corresponding periodic signal and merges complex spectra.

14. A wideband signal analyzing apparatus as claimed in claim 11, wherein said frequency-shifting means further comprises:
- band limiting means for limiting a band of a signal output by said frequency mixing means; and
- analog-to-digital converting means for digitizing a signal output by said band limiting means and providing said discrete signal to said spectrum measuring means.

15. A wideband signal analyzing apparatus as claimed in claim 1, wherein said input signal has a predetermined carrier component and a sideband, and said spectrum measuring means outputs said complex spectrum from which a carrier component has been removed.

16. A wideband signal analyzing apparatus as claimed in claim 1, further comprising instantaneous phase noise estimating means for estimating an instantaneous phase noise of said input signal based on a one-sided complex spectrum of said input signal reconstructed by said spectrum reconstructing means,
- wherein said input signal has a predetermined carrier component and a sideband, and said spectrum measuring means outputs said one-sided complex spectrum based on said carrier signal and a sideband noise of said input signal.

17. A wideband signal analyzing apparatus as claimed in claim 16, wherein said instantaneous phase noise estimating means comprises:
- inverse Fourier transforming means for transforming said one-sided complex spectrum reconstructed by said spectrum reconstructing means into a signal in a time domain and generating an analytic signal of said input signal; and
- phase estimating means for calculating a phase angle of said analytic signal.

18. The wideband signal analyzing apparatus of claim 1, wherein said frequency-shifting means shifts a frequency component included in each of said plurality of frequency bands one by one, and spectrum measuring means outputs a complex spectrum of each of said intermediate frequency signals one by one.

19. The wideband signal analyzing apparatus of claim 1, wherein said frequency-shifting means shifts a frequency component included in each of said plurality of frequency bands in parallel with each other, and spectrum measuring means outputs a complex spectrum of each of said intermediate frequency signals in parallel with each other.

20. The wideband signal analyzing apparatus of claim 1, wherein frequency bands of said intermediate frequency signals overlap with each other.

21. The wideband signal analyzing apparatus of claim 1, wherein said plurality of frequency bands included in the input signal cover the whole bandwidth of the input signal without omission.

22. A test apparatus for analyzing an input signal provided from a device under test, comprising:
   a wideband signal analyzing apparatus as claimed in claim 1.

23. A wideband signal analyzing apparatus for analyzing a phase noise spectrum of an input signal including a plurality of frequency bands, comprising:
   frequency-shifting means configured to:
      separately shift a frequency component of each of said frequency bands of said input signal to a predetermined intermediate band; and
      generate each shifted frequency component as a respective intermediate frequency signal;
   instantaneous phase noise estimating means for estimating an instantaneous phase noise of each of said intermediate frequency signals;
   spectrum measuring means for separately outputting a complex spectrum of said instantaneous phase noise of each of said intermediate frequency signals; and
   spectrum reconstructing means for reconstructing each of said complex spectra.

24. A wideband signal analyzing apparatus as claimed in claim 23, wherein said instantaneous phase noise estimating means comprises:
   analytic signal transforming means for transforming each of said intermediate frequency signals into an analytic signal; and
   phase estimating means for estimating a phase angle of each of said analytic signals.

25. A wideband signal analyzing apparatus as claimed in claim 24, wherein said instantaneous phase noise estimating means comprises linear phase eliminating means for removing a linear component of a phase angle of each of said analytic signals.

26. A wideband signal analyzing apparatus as claimed in claim 23, wherein said frequency-shifting means comprises:
   frequency generating means for generating a periodic signal of a frequency according to said frequency shifting amount of frequency; and
   frequency mixing means for mixing said input signal and said periodic signal.

27. A wideband signal analyzing apparatus as claimed in claim 26, wherein said frequency generating means sequentially generates periodic signals of different frequencies according to said different frequency-shifting amounts, and said frequency mixing means sequentially mixes each of said periodic signals and said input signal.

28. A wideband signal analyzing apparatus as claimed in claim 26, wherein said spectrum reconstructing means controls said frequency of said periodic signal generated by said frequency generating means and shifts and connects said complex spectrum of each of said intermediate frequency signals according to said frequency of said corresponding periodic signal and merges complex spectra.

29. A wideband signal analyzing apparatus as claimed in claim 26, wherein said frequency-shifting means further comprises;
   band limiting means for limiting a band of a signal output by said frequency mixing means; and
   analog-to-digital converting means for digitizing a signal output by said band limiting means and providing said discrete signal to said spectrum measuring means.

30. A wideband signal analyzing apparatus as claimed in claim 23, further comprising inverse Fourier transforming means for transforming said complex spectrum reconstructed by said spectrum reconstructing means into a signal in a time domain and calculating an instantaneous phase noise of said input signal.

31. The wideband signal analyzing apparatus of claim 23, wherein said frequency-shifting means shifts a frequency component included in each of said plurality of frequency bands one by one, and spectrum measuring means outputs a complex spectrum of each of said intermediate frequency signals one by one.

32. The wideband signal analyzing apparatus of claim 23, wherein said frequency-shifting means shifts a frequency component included in each of said plurality of frequency bands in parallel with each other, and spectrum measuring means outputs a complex spectrum of each of said intermediate frequency signals in parallel with each other.

33. The wideband signal analyzing apparatus of claim 23, wherein frequency bands of said intermediate frequency signals overlap with each other.

34. The wideband signal analyzing apparatus of claim 23, wherein said plurality of frequency bands included in the input signal cover the whole bandwidth of the input signal without omission.

35. A test apparatus for analyzing an input signal provided from a device under test, comprising:
   a wideband signal analyzing apparatus as claimed in claim 23.

36. A wideband signal analyzing method for analyzing an input signal including a plurality of frequency bands, comprising:
   frequency-shifting step comprising:
      separately shifting a frequency component of each of said frequency bands of said input signal to a predetermined intermediate band; and
      generating each shifted frequency component as a respective intermediate frequency signal;
   a spectrum measuring step of separately outputting a complex spectrum of each of said intermediate frequency signals; and
   a spectrum reconstructing step of reconstructing each of said complex spectra.

37. A wideband signal analyzing method as claimed in claim 36 further comprising an instantaneous phase noise estimating step of estimating an instantaneous phase noise of said input signal, based on said complex spectra connected in said spectrum reconstructing step.

38. A wideband signal analyzing method for analyzing a phase noise spectrum of an input signal including a plurality of frequency bands, comprising:
   frequency-shifting step comprising:
      separately shifting a frequency component of each of said frequency bands of said input signal to a predetermined intermediate band; and
      generating each shifted frequency component as a respective intermediate frequency signal;
   an instantaneous phase noise estimating step of estimating an instantaneous phase noise of each of said intermediate frequency signals;
   a spectrum measuring step of separately outputting a complex spectrum of said instantaneous phase noise of each of said intermediate frequency signals; and
   a spectrum reconstructing step of reconstructing each of said complex spectra.

39. A wideband signal analyzing method as claimed in claim 38, further comprising an inverse Fourier transforming step of transforming said complex spectrum reconstructed in said spectrum reconstructing step into a signal in a time domain and calculating an instantaneous phase noise of said input signal.

40. A wideband signal analyzing apparatus for analyzing an input signal including a plurality of frequency bands, comprising:

frequency-shifting means configured to:
shift a frequency component of each of said frequency bands of said input signal to a predetermined intermediate band, and
generate each shifted frequency component as a respective intermediate frequency signal;
spectrum measuring means for outputting a complex spectrum of each of said intermediate frequency signals; and
spectrum reconstructing means for reconstructing said complex spectra,
wherein frequency bands of said intermediate frequency signals overlap with each other.

41. A wideband signal analyzing apparatus for analyzing a phase noise spectrum of an input signal including a plurality of frequency bands, comprising:

frequency-shifting means configured to:
shift a frequency component of each of said frequency bands of said input signal to a predetermined intermediate band, and
generate each shifted frequency component as a respective intermediate frequency signal;
instantaneous phase noise estimating means for estimating an instantaneous phase noise of each of said intermediate frequency signals;
spectrum measuring means for outputting a complex spectrum of said instantaneous phase noise of each of said intermediate frequency signals; and
spectrum reconstructing means for reconstructing each of said complex spectra;
wherein frequency bands of said intermediate frequency signals overlap with each other.

42. A wideband signal analyzing method for analyzing an input signal including a plurality of frequency bands, comprising:

a frequency-shifting step comprising:
separately shifting a frequency component of each of said frequency bands of said input signal to a predetermined intermediate band; and
generating each shifted frequency component as a respective intermediate frequency signal;
a spectrum measuring step of outputting a complex spectrum of each of said intermediate frequency signals; and
a spectrum reconstructing step of reconstructing each of said complex spectra;
wherein frequency bands of said intermediate frequency signals overlap with each other.

43. A wideband signal analyzing method for analyzing a phase noise spectrum of an input signal including a plurality of frequency bands, comprising:

a frequency-shifting step comprising:
separately shifting a frequency component of each of said frequency bands of said input signal to a predetermined intermediate band; and
generating each shifted frequency component as a respective intermediate frequency signal;
an instantaneous phase noise estimating step of estimating an instantaneous phase noise of each of said intermediate frequency signals;
a spectrum measuring step of outputting a complex spectrum of said instantaneous phase noise of each of said intermediate frequency signals; and
a spectrum reconstructing step of reconstructing each of said complex spectra;
wherein frequency bands of said intermediate frequency signals overlap with each other.

* * * * *

UNITED STATES PATENT AND TRADEMARK OFFICE
CERTIFICATE OF CORRECTION

| | | |
|---|---|---|
| PATENT NO. | : 7,317,309 B2 | |
| APPLICATION NO. | : 10/862904 | |
| DATED | : January 8, 2008 | |
| INVENTOR(S) | : Takahiro Yamaguchi et al. | |

Figure 3:
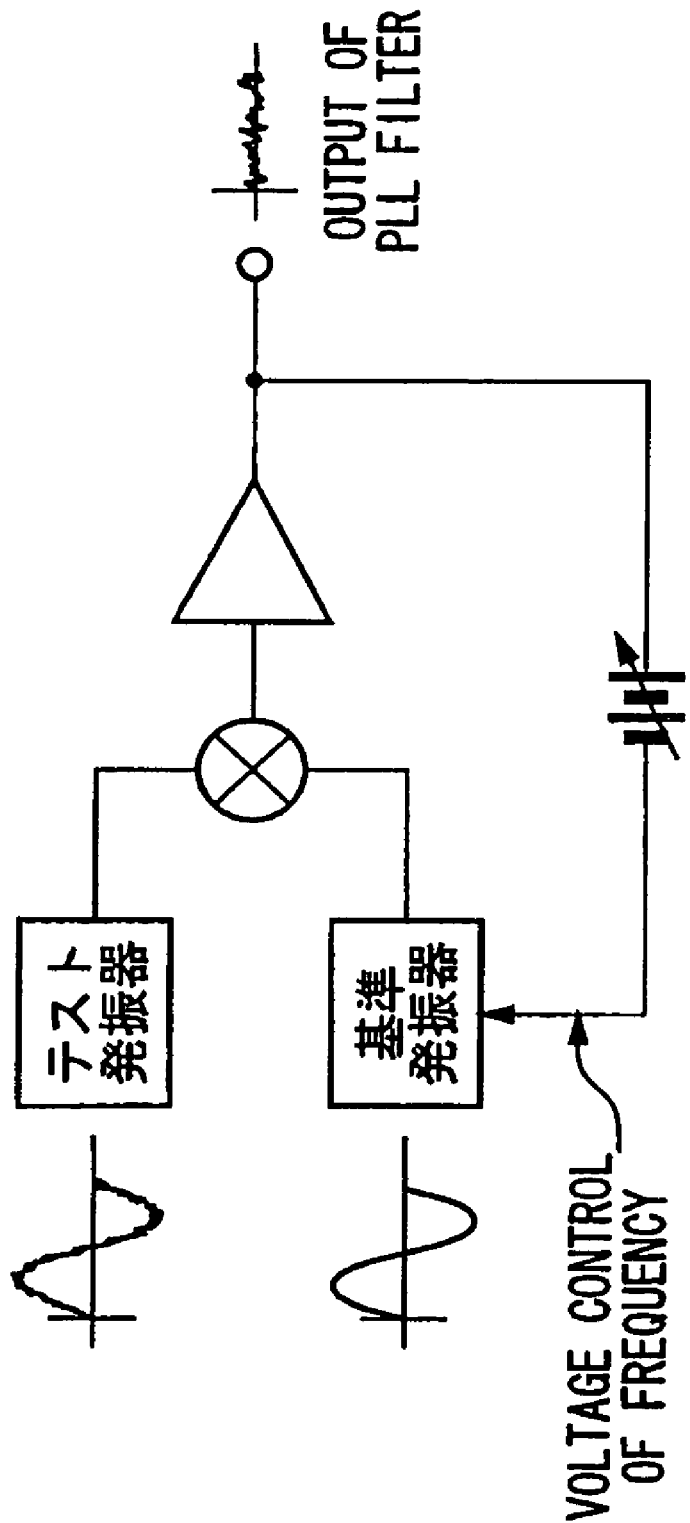
FIG. 3 shows a system for the measurement of the edge fluctuation of a test oscillator.
Figure 4:
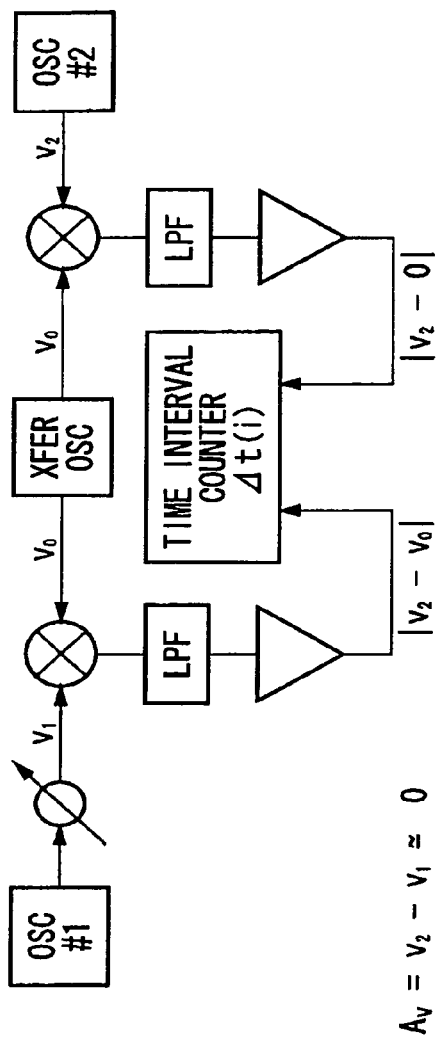
FIG. 4 shows a conventional system for the measurement of the edge fluctuation of a test oscillator.
Figure 4:
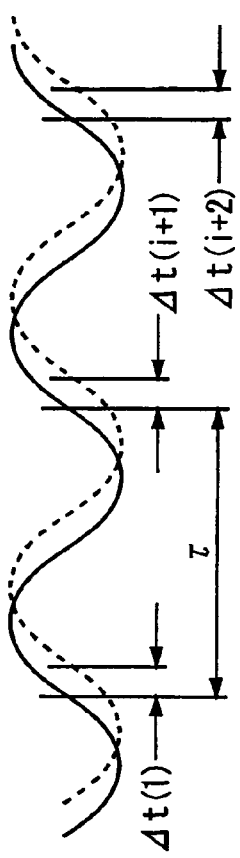

It is certified that error appears in the above-identified patent and that said Letters Patent is hereby corrected as shown below:

In the Drawings, sheet 3 of 47, figure 3, is incorrect. Please replace the drawing with drawing sheet 3.

Figure 5:
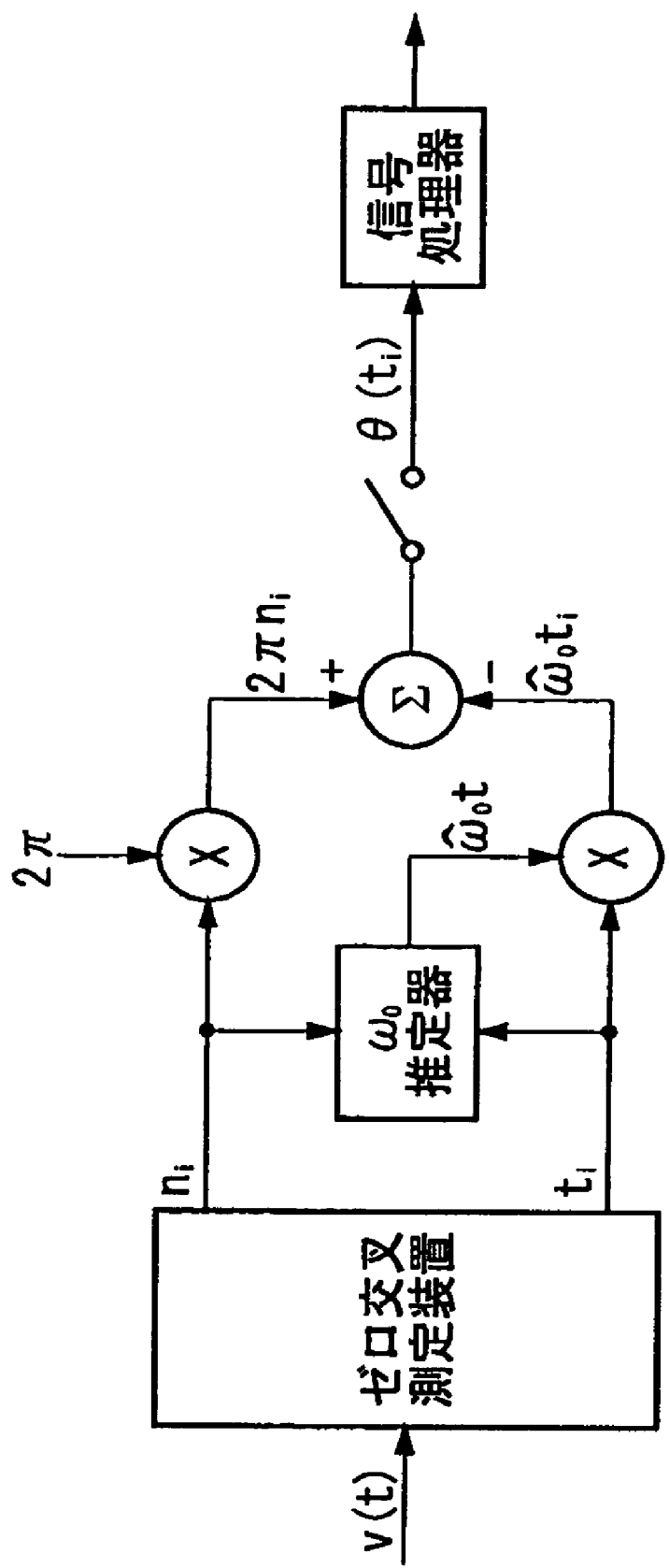
FIG. 5 shows a block diagram of a time interval analyzer of which dead time is zero.
Figure 6:
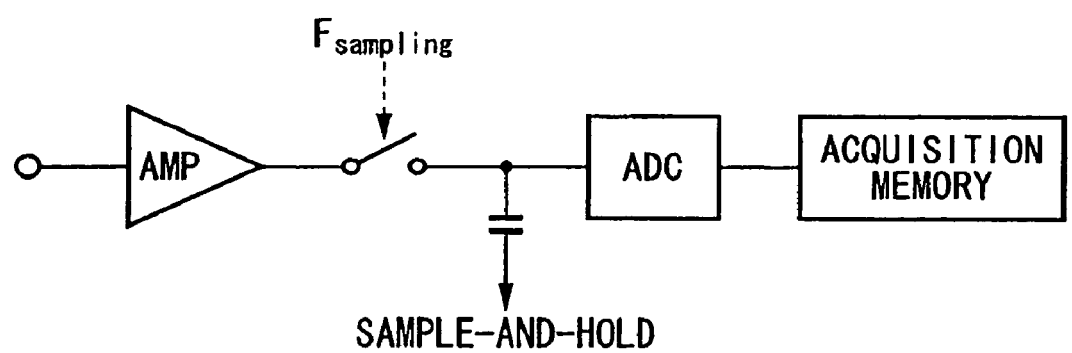
FIG. 6 shows a conventional real time oscilloscope.
Figure 7:
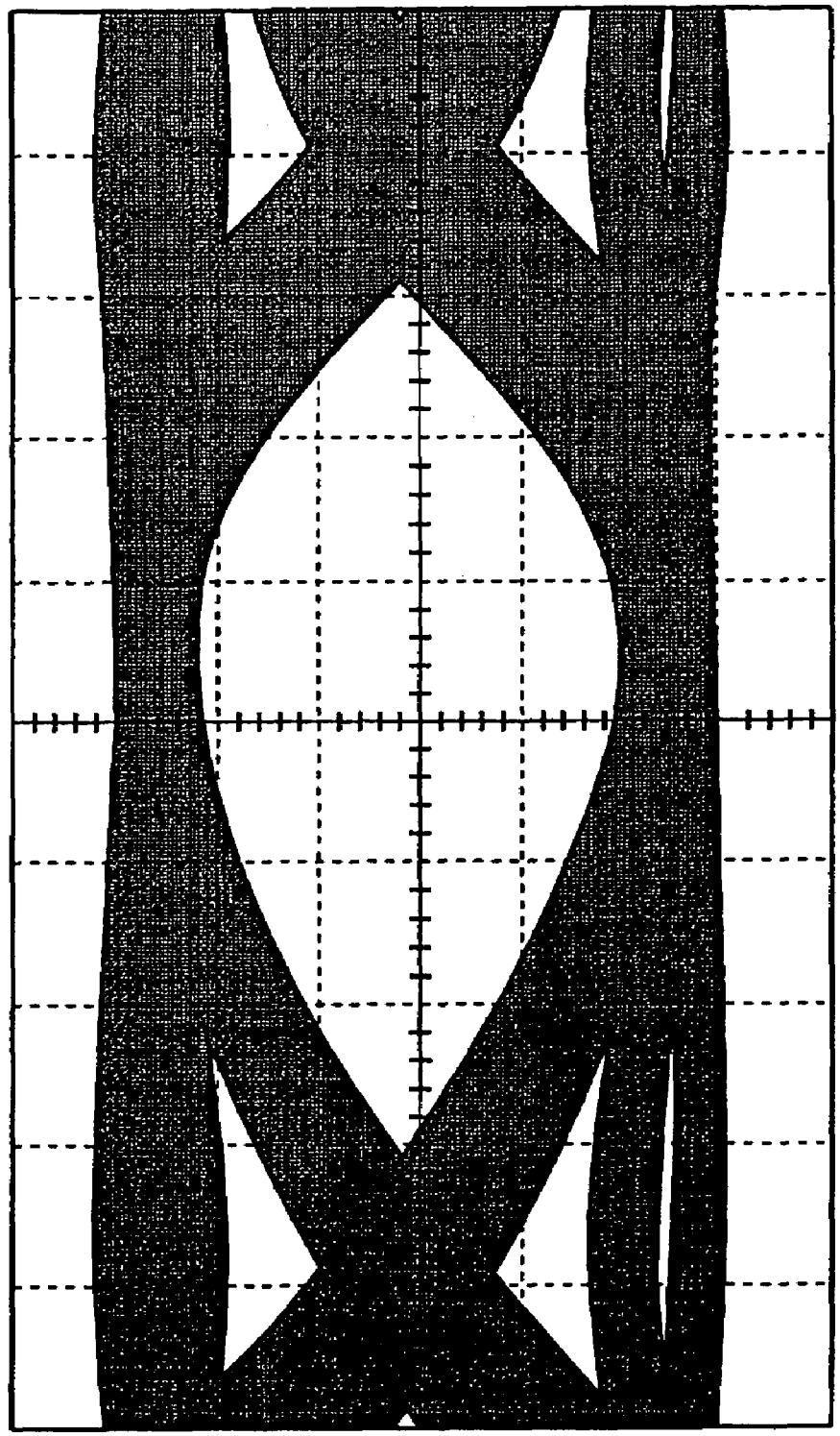
FIG. 7 shows the measurement result of a conventional real time oscilloscope.

In the Drawings, sheet 5 of 47, figure 5, is incorrect. Please replace the drawing with drawing sheet 5.

Figure 8:
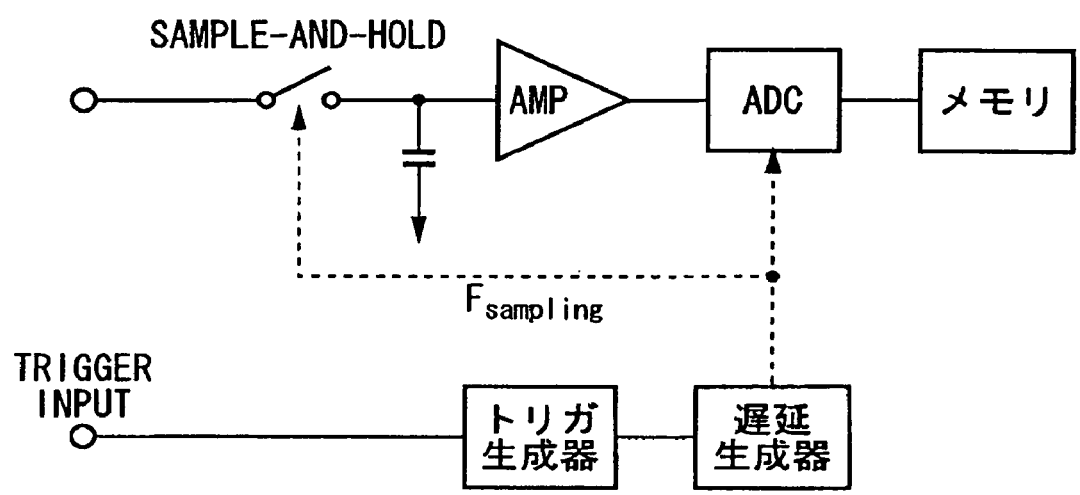
FIG. 8 shows an oscilloscope of a conventional equivalent sampling type.

In the Drawings, sheet 8 of 47, figure 8, is incorrect. Please replace the drawing with drawing sheet 8.

Figure 10:
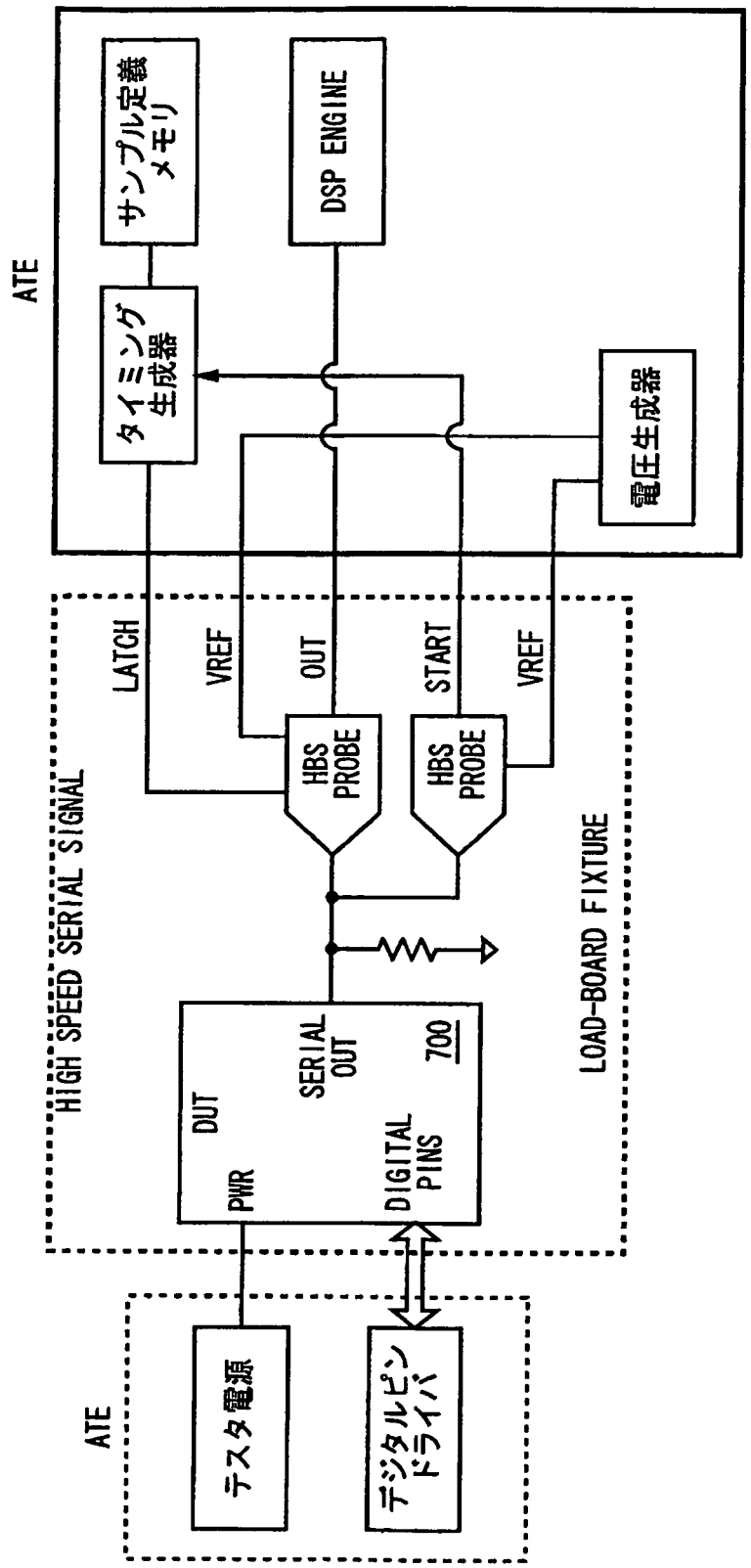
FIG. 10 shows a conventional test apparatus system using undersampling.
Figure 11:
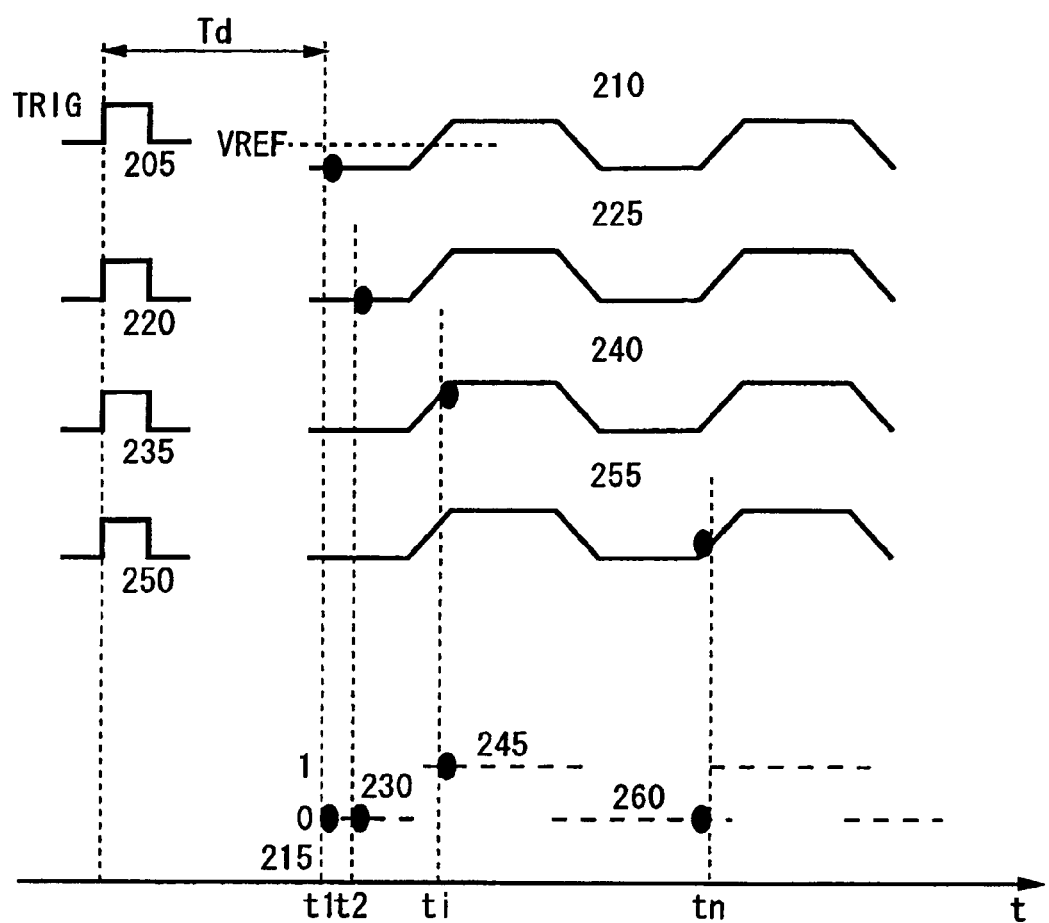
FIG. 11 shows the operation of a conventional test apparatus system using undersampling.

In the Drawings, sheet 10 of 47, figure 10, is incorrect. Please replace the drawing with drawing sheet 10.

Figure 12:
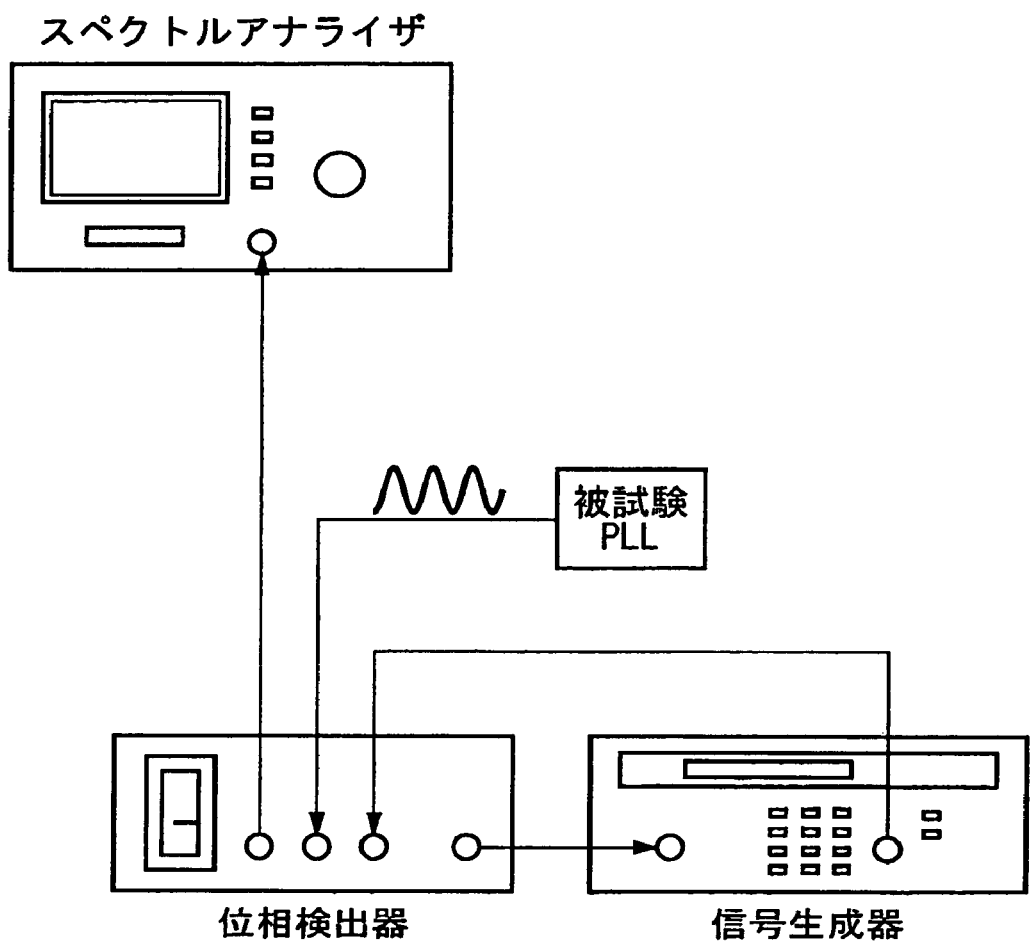
FIG. 12 shows a phase noise measurement system using a phase detector and a conventional spectrum analyzer.

In the Drawings, sheet 12 of 47, figure 12, is incorrect. Please replace the drawing with drawing sheet 12.

In the Drawings, sheet 14 of 47, figure 14, is incorrect. Please replace the drawing with drawing sheet 14.

In the Drawings, sheet 22 of 47, figure 22, is incorrect. Please replace the drawing with drawing sheet 22.

In the Drawings, sheet 28 of 47, figure 28, is incorrect. Please replace the drawing with drawing sheet 28.

In the Drawings, sheet 29 of 47, figure 29, is incorrect. Please replace the drawing with drawing sheet 29.

In the Claims:

In Claim 11, column 42, line 1, before the word "periodic" the "a" should be deleted.

UNITED STATES PATENT AND TRADEMARK OFFICE
CERTIFICATE OF CORRECTION

PATENT NO. : 7,317,309 B2
APPLICATION NO. : 10/862904
DATED : January 8, 2008
INVENTOR(S) : Takahiro Yamaguchi et al.

It is certified that error appears in the above-identified patent and that said Letters Patent is hereby corrected as shown below:

In Claim 11, column 42, line 2, the word "signal" should be --signal<u>s</u>--.

In Claim 11, column 42, line 2, before the word "frequency" the "a" should be deleted.

In Claim 11, column 42, line 2, before the word "according" the word "frequency" should be --frequenc<u>ies</u>--.

In Claim 26, column 43, line 43, the word "shifting" should be deleted.

In Claim 29, column 43, line 61, after the word "comprises" the ";" should be --:--.

In Claim 36, column 44, line 33, before the word "frequency-shifting", an --a-- should be inserted.

In Claim 38, column 44, line 52, before the words "frequency-shifting" an --a-- should be inserted.

Signed and Sealed this

Thirteenth Day of May, 2008

JON W. DUDAS
*Director of the United States Patent and Trademark Office*